US012225348B2

(12) United States Patent
Ye

(10) Patent No.: US 12,225,348 B2
(45) Date of Patent: Feb. 11, 2025

(54) SOUND APPARATUS

(71) Applicant: LG DISPLAY CO., LTD., Seoul (KR)

(72) Inventor: Jaehun Ye, Tokyo (JP)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/368,903

(22) Filed: Sep. 15, 2023

(65) Prior Publication Data

US 2024/0007798 A1 Jan. 4, 2024

Related U.S. Application Data

(62) Division of application No. 17/346,832, filed on Jun. 14, 2021, now Pat. No. 11,800,293.

(30) Foreign Application Priority Data

Jun. 15, 2020 (JP) ................................ 2020-102918
Jun. 7, 2021 (JP) ................................ 2021-095221

(51) Int. Cl.
*H04R 17/00* (2006.01)
*H10K 59/00* (2023.01)

(52) U.S. Cl.
CPC ............ *H04R 17/00* (2013.01); *H10K 59/00* (2023.02); *H04R 2499/15* (2013.01)

(58) Field of Classification Search
CPC ...... H04R 17/00; H04R 2499/15; H04R 7/04; H04R 7/16; H04R 2307/025; H04R 2307/027; H04R 2307/029; H04R 17/10; H04R 3/002; H04R 1/028; H10K 59/00; H10K 50/00; H10N 30/20; H10N 30/50; H10N 30/85; H10N 30/87; H10N 39/00; H03H 9/564; G06F 1/1605; H04N 25/48; H04N 5/66; B06B 1/0603
See application file for complete search history.

(56) References Cited

U.S. PATENT DOCUMENTS

| | | | | |
|---|---|---|---|---|
| 3,697,790 A | 10/1972 | Flint et al. | | |
| 4,649,313 A * | 3/1987 | Ogawa | H10N 30/50 | 310/366 |
| 4,751,419 A * | 6/1988 | Takahata | H04R 1/227 | 310/322 |
| 5,526,601 A * | 6/1996 | Onuma | A01K 97/125 | 43/17 |
| 6,657,671 B1 * | 12/2003 | Sasaki | H04N 25/48 | 348/297 |
| 8,049,581 B2 * | 11/2011 | Iwasaki | H03H 9/564 | 333/191 |
| 9,571,937 B2 * | 2/2017 | Ogata | H04R 17/00 | |

(Continued)

FOREIGN PATENT DOCUMENTS

| | | |
|---|---|---|
| CN | 105122839 A | 12/2015 |
| CN | 105375900 A | 3/2016 |

(Continued)

OTHER PUBLICATIONS

Japanese Office Action dated Jul. 25, 2022, issued in corresponding Patent Application No. 2021-095221 (5 pages).

(Continued)

*Primary Examiner* — Angelica M McKinney
(74) *Attorney, Agent, or Firm* — POLSINELLI PC

(57) ABSTRACT

A sound apparatus includes a piezoelectric device configured to vibrate based on a sound signal input thereto, a vibration member, and an elastic member configured to connect at least a portion of the piezoelectric device to the vibration member.

27 Claims, 36 Drawing Sheets

(56) References Cited

U.S. PATENT DOCUMENTS

| | | | | |
|---|---|---|---|---|
| 9,838,781 | B2 * | 12/2017 | Behles | H04R 3/002 |
| 2007/0177747 | A1 | 8/2007 | Onishi et al. | |
| 2010/0027818 | A1 * | 2/2010 | Lee | H04R 19/013 381/191 |
| 2010/0067726 | A1 * | 3/2010 | Suzuki | G06F 1/1605 381/333 |
| 2011/0002485 | A1 | 1/2011 | Onishi et al. | |
| 2012/0140969 | A1 * | 6/2012 | Fujise | H04R 17/00 381/190 |
| 2012/0153774 | A1 * | 6/2012 | Maruyama | H02N 2/163 310/323.02 |
| 2013/0049876 | A1 * | 2/2013 | Onishi | H04R 17/00 331/155 |
| 2014/0132115 | A1 | 5/2014 | Fujii et al. | |
| 2014/0184021 | A1 * | 7/2014 | Kim | H04R 17/10 310/322 |
| 2018/0269808 | A1 * | 9/2018 | Park | H04R 17/00 |
| 2019/0045286 | A1 * | 2/2019 | Kim | H04R 17/00 |
| 2020/0154185 | A1 * | 5/2020 | Kim | H10N 39/00 |
| 2020/0154214 | A1 * | 5/2020 | Jang | H04R 1/028 |
| 2021/0176566 | A1 | 6/2021 | Ye | |
| 2022/0217472 | A1 | 7/2022 | Ye et al. | |

FOREIGN PATENT DOCUMENTS

| | | | | |
|---|---|---|---|---|
| CN | 105874624 | A | 8/2016 | |
| CN | 110839197 | A | 2/2020 | |
| JP | 02-273898 | A | 11/1990 | |
| JP | 10-304491 | A | 11/1998 | |
| JP | 2003-520540 | A | 7/2003 | |
| JP | 2009225115 | A * | 10/2009 | H04N 5/66 |
| JP | 2012-100040 | A | 5/2012 | |
| JP | 2012-134956 | A | 7/2012 | |
| JP | 2015-033109 | A | 2/2015 | |
| JP | 2020-086072 | A | 6/2020 | |
| KR | 20130127342 | A | 11/2013 | |
| KR | 10-2018-0077582 | A | 7/2018 | |
| KR | 20200022164 | A * | 3/2020 | H04R 17/00 |
| KR | 20200067667 | A | 6/2020 | |
| KR | 2021-0155770 | A | 12/2021 | |
| WO | WO-2006059856 | A1 * | 6/2006 | B06B 1/0603 |
| WO | 2011/105046 | A1 | 9/2011 | |
| WO | WO 2013/051328 | | 4/2013 | |
| WO | WO 2013/121715 | | 8/2013 | |

OTHER PUBLICATIONS

Japanese Office Action dated Apr. 26, 2024 issued in Patent Application No. 2023-036138 (5 pages).

Chinese Office Action dated Mar. 20, 2024 issued in Patent Application No. 202110662229.1 (9 pages).

Office Action in Korean Appln. No. 20210077022, mailed on Jan. 2, 2025, 21 pages (with machine translation).

* cited by examiner

SOUND APPARATUS

CROSS-REFERENCE TO RELATED APPLICATION

This application is a divisional of U.S. patent application Ser. No. 17/346,832, filed on Jun. 14, 2021, which claims the benefit of the Japanese Patent Application Nos. 2020-102918 filed on Jun. 15, 2020 and 2021-095221 filed on Jun. 7, 2021, which are hereby incorporated by reference in their entirety.

BACKGROUND

Technical Field

The present disclosure relates to a sound apparatus.

Description of the Related Art

Korean Patent Publication No. 10-2018-0077582 discloses a display apparatus including a display panel and an actuator, and the display apparatus has a function of controlling the actuator to vibrate the display panel.

However, the sound quality of a sound apparatus based on the structure of Korean Patent Publication No. 10-2018-0077582 may be insufficient.

SUMMARY

Accordingly, the present disclosure is directed to providing a sound apparatus that substantially obviates one or more problems due to limitations and disadvantages of the related art.

More specifically, the present disclosure is to provide a sound apparatus with enhanced sound quality.

Additional advantages and features will be set forth in part in the description which follows and in part will become apparent to those having ordinary skill in the art upon examination of the following or may be learned from practice thereof. Other advantages of aspects may be realized and attained by the structure particularly pointed out in the written description and claims hereof as well as the appended drawings.

To achieve these and other advantages and in accordance with the purpose of the disclosure, as embodied and broadly described herein, there is provided a sound apparatus including a piezoelectric device configured to vibrate based on a sound signal input thereto, a vibration member, and an elastic member configured to connect at least a portion of the piezoelectric device to the vibration member.

In another aspect of the present disclosure, there is provided a sound apparatus including a piezoelectric device configured to vibrate based on a sound signal input thereto and including a first vibration portion and a second vibration portion extending in different directions in a plan view, a vibration member, and an elastic member configured to connect at least a portion of the piezoelectric device to the vibration member.

In another aspect of the present disclosure, there is provided a sound apparatus including a plurality of piezoelectric devices configured to vibrate in response to a sound signal input thereto and a vibration member, each of the plurality of piezoelectric devices is connected to the vibration member, and frequency characteristics of a first piezoelectric device and a second piezoelectric device among the plurality of piezoelectric devices are different from each other.

According to the aspects of the present disclosure, a sound apparatus with enhanced sound quality may be provided.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Figure 1:
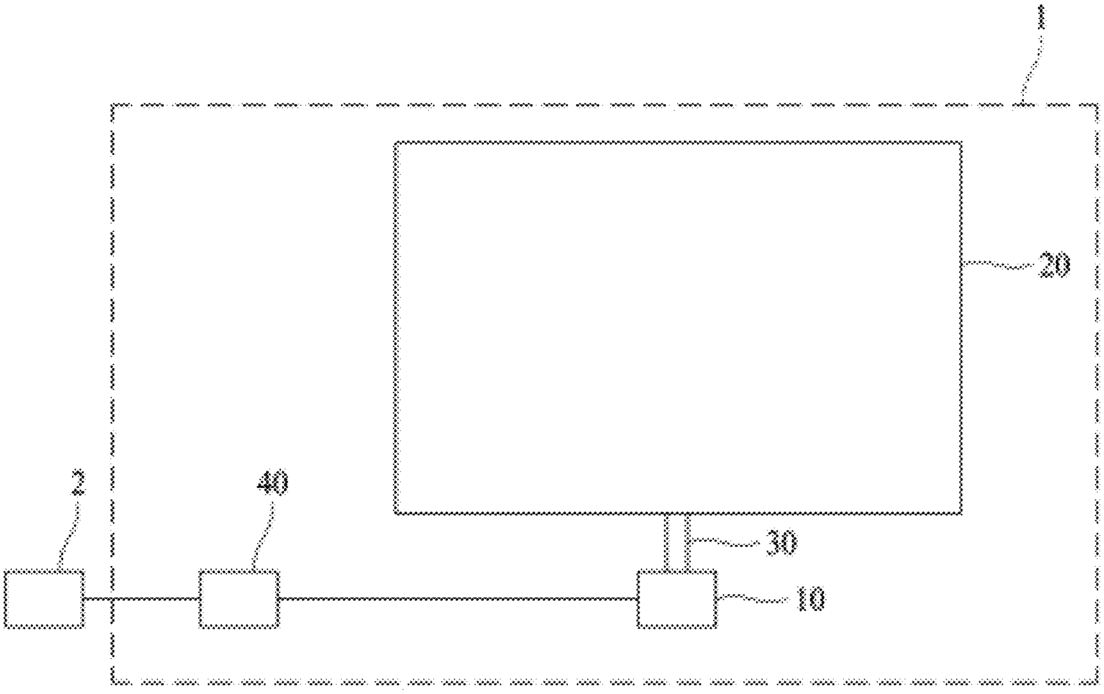
FIG. 1 is a block diagram of a sound apparatus according to a first aspect of the present disclosure.

Reference will now be made in detail to aspects of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing aspects of the present disclosure are merely an example, and thus, the aspects of present disclosure are not limited to the illustrated details. Like reference numerals refer to like elements throughout. In the following description, when the detailed description of the relevant known function or configuration is determined to unnecessarily obscure the important point of the present disclosure, the detailed description will be omitted. When “comprise,” “have,” and “include” described in the present specification are used, another part may be added unless “only” is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, “on,” “over,” “under,” and “next,” one or more other parts may be disposed between the two parts unless a more limiting term, such as “just” or “direct(ly)” is used.

In the description of aspects, when a structure is described as being positioned “on or above” or “under or below” another structure, this description should be construed as including a case in which the structures contact each other as well as a case in which a third structure is disposed therebetween.

In describing a time relationship, for example, when the temporal order is described as, for example, “after,” “subsequent,” “next,” and “before,” a case that is not continuous may be included unless a more limiting term, such as “just,” “immediate(ly),” or “direct(ly)” is used.

It will be understood that, although the terms “first,” “second,” etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms “first,” “second,” “A,” “B,” “(a),” “(b),” etc. may be used. These terms are intended to identify the corresponding elements from the other elements, and basis, order, or number of the corresponding elements should not be limited by these terms. The expression that an element is “connected,” “coupled,” or “adhered” to another element or layer, the element or layer can not only be directly connected or adhered to another element or layer, but also be indirectly connected or adhered to another element or layer with one or more intervening elements or layers “disposed,” or “interposed” between the elements or layers, unless otherwise specified.

The term “at least one” should be understood as including any and all combinations of one or more of the associated listed items. For example, the meaning of “at least one of a first item, a second item, and a third item” denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. Aspects of the present disclosure may be carried out independently from each other, or may be carried out together in co-dependent relationship.

Hereinafter, aspects of the present disclosure will be described in detail with reference to the accompanying drawings. For convenience of description, a scale of each of elements illustrated in the accompanying drawings differs from a real scale, and thus, is not limited to a scale illustrated in the drawings.

In the drawings, like reference numerals refer to like elements having a common function, and repeated descriptions are omitted or will be briefly given.

First Aspect of the Present Disclosure

FIG. 1 is a block diagram of a sound apparatus according to a first aspect of the present disclosure. The sound apparatus 1 according to an aspect of the present disclosure may be used alone as a speaker and may be embedded into advertisement signboards, posters, and noticeboards. However, the use of the sound apparatus 1 according to an aspect of the present disclosure is not limited thereto.

As illustrated in FIG. 1, the sound apparatus 1 may include a piezoelectric device 10, a first vibration member 20, an elastic member or resilient member 30, and a first controller 40. The sound apparatus 1 may be an apparatus which generates a sound based on a sound signal input thereto.

The piezoelectric device 10 may be an element where displacement occurs due to an inverse piezoelectric effect when a voltage is applied based on a sound signal input thereto. The piezoelectric device 10, for example, may be an element where bent displacement occurs due to a voltage such as bimorph or unimorph. Because an input sound signal is an alternating current (AC) voltage, the piezoelectric device 10 may act as a vibration device which vibrates in response to a sound signal input thereto.

The first vibration member 20 may be a member which vibrates to generate a sound based on a sound signal input to the piezoelectric device 10. A material of the first vibration member 20 is not limited to a specific material. For example, a material of the first vibration member 20 may include glass, hard paper, plastic, metal, leather, fiber, or cloth having a material characteristic suitable for transferring a vibration transferred from the piezoelectric device 10, but aspects of the present disclosure are not limited thereto.

The elastic member 30 may be a member including a material having elasticity. A material of the elastic member 30 may use a material such as rubber having an elastic modulus which is lower than that of the piezoelectric device 10 and the first vibration member 20. A portion of the piezoelectric device 10 may be coupled or connected to a portion of the first vibration member 20 by the elastic member 30. Therefore, a vibration of the piezoelectric device 10 may be transferred to the first vibration member 20, and the first vibration member 20 may generate a sound based on a sound signal input thereto.

A host system 2 may be a system including an apparatus or a plurality of apparatuses, which provide(s) a sound signal to control the sound apparatus 1. However, the host system 2 may further supply other signals such as an image signal (for example, RGB data) and a timing signal (for example, a vertical synchronization signal, a horizontal synchronization signal, and a data enable signal, etc.) based on the use purpose of the sound apparatus 1. The host system 2 may be, for example, a source sound reproduction apparatus, a local broadcast apparatus, a radio broadcast reproduction system, a television (TV) system, a set-top box, a navigation system, an optical disk player, a computer, a home theater system, and a video phone system, or the like. Also, the sound apparatus 1 and the host system 2 may be an integrated apparatus, or may be configured as separate apparatuses.

The first controller 40 may provide a voltage to the piezoelectric device 10 based on a sound signal input from the host system 2. The first controller 40 may be configured by a plurality of semiconductor integrated circuits (ICs).

Figure 2:
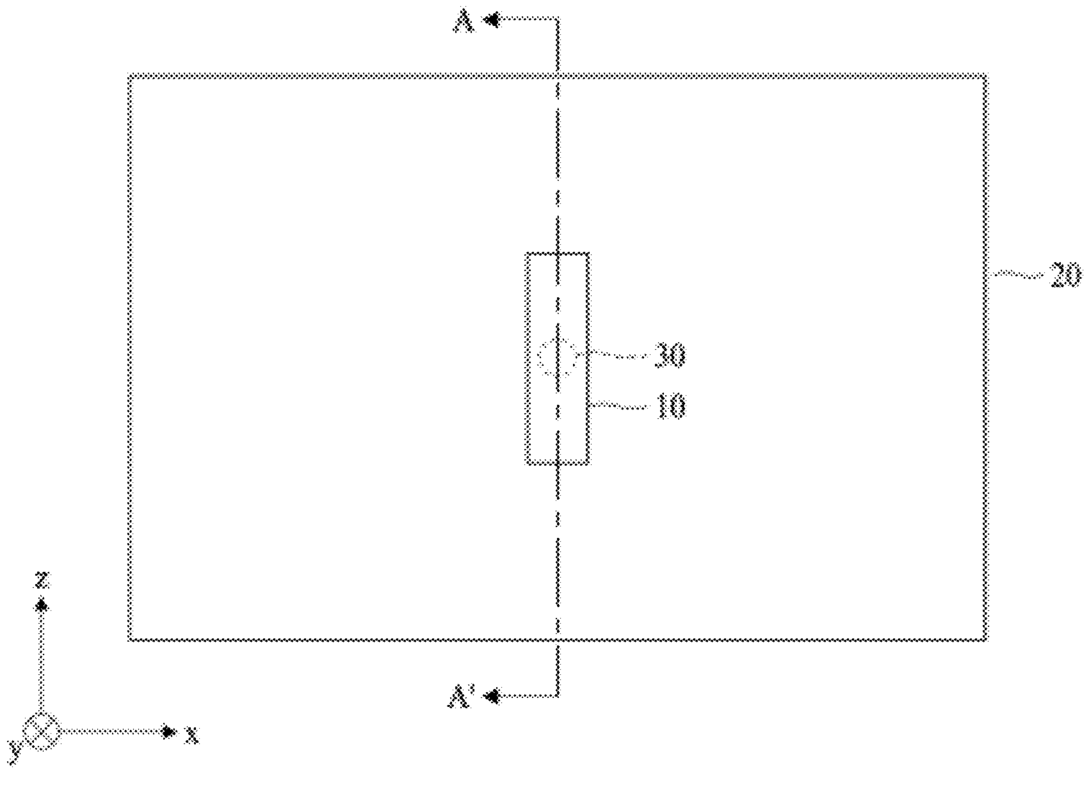
FIG. 2 is a plan view illustrating a configuration of a piezoelectric device according to a first aspect of the present disclosure.
Figure 3:
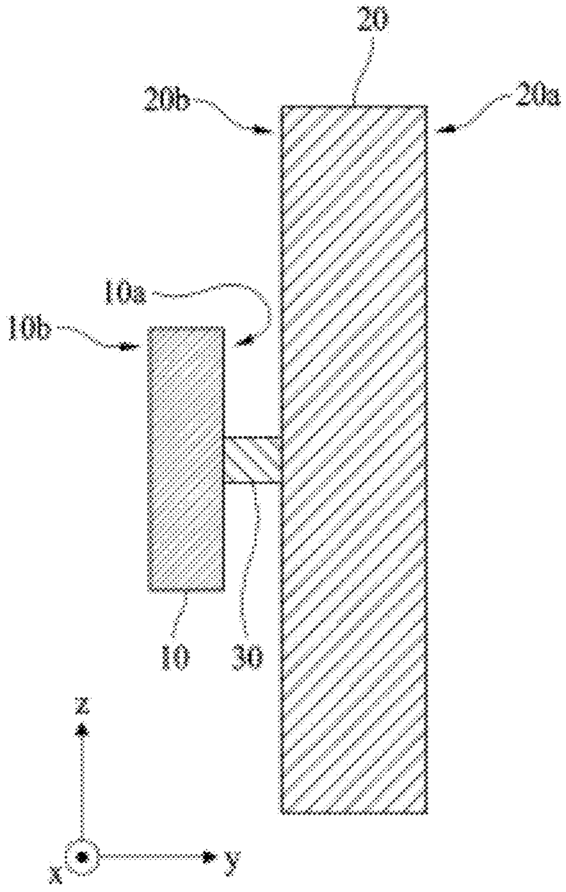
FIG. 3 is a cross-sectional view illustrating a configuration of a piezoelectric device according to a first aspect of the present disclosure.

FIG. 2 is a plan view illustrating a configuration of a piezoelectric device according to a first aspect of the present disclosure. FIG. 3 is a cross-sectional view illustrating a configuration of the piezoelectric device according to the first aspect of the present disclosure. The arrangement of the piezoelectric device 10 will be described below with reference to FIGS. 2 and 3. A tetragonal border of a first vibration member 20 illustrated in FIG. 2 schematically illustrates an external appearance or an external shape of the first vibration member 20.

As illustrated in FIG. 3, a surface corresponding to a surface sound source of the first vibration member 20 may be a sound source surface 20*a*, and a surface opposite to the sound source surface 20*a* may be a rear surface 20*b*. In this case, FIG. 2 illustrates a plan view when the first vibration member 20 is seen from the rear surface 20*b*. In FIG. 2, a coordinate axis is illustrated where the x axis represents a horizontal direction of the sound source surface 20*a*, the z axis represents a vertical or perpendicular direction of the sound source surface 20*a*, and the y axis represents a depth direction of the sound source surface 20*a*. Also, a direction from the rear surface to the sound source surface 20*a* may be referred to as a y-axis forward direction. FIG. 3 is a cross-sectional view taken along line A-A' of FIG. 2.

The piezoelectric device 10 may include a flat plate shape or a flat shape, but aspects of the present disclosure are not limited thereto and may include a curve shape or a curved shape. As illustrated in FIG. 2, the piezoelectric device 10 may have a rectangular shape having a long-side direction (a z direction of the drawing) and a short-side direction (an x direction of the drawing) in a plan view. Accordingly, deformation which is bent to a cross-sectional surface (line A-A') in the long-side direction may occur. A long-side direction of the piezoelectric device 10 may be disposed to be perpendicular to a portion or a lateral side of the first vibration member 20.

An elastic member 30 may be connected (or coupled) to a portion including a center of the piezoelectric device 10 in the long-side direction thereof. The center of the piezoelectric device in the long-side direction thereof may be a portion corresponding to a center of a vibration, and thus, a vibration may be efficiently transferred to the first vibration member 20.

The elastic member 30 may be coupled or connected to only a portion of a front surface 10*a* of the piezoelectric device 10. In a case where both end portions of the piezoelectric device 10 in the long-side direction thereof are lifted, it may be difficult to control a vibration of the piezoelectric device 10 at the both end portions, where a displacement of a bending vibration is large, of the piezoelectric device 10 in the long-side direction thereof. For example, the bending vibration may be flexural vibration or winding vibration, embodiments of the present disclosure are not limited thereto. For example, the front surface 10*a* of the piezoelectric device 10 may be a surface facing the first vibration member 20. For example, the front surface may be a first surface, a front surface, or an upper surface, embodiments of the present disclosure are not limited thereto. For example, the elastic member 30 may be coupled or connected to the piezoelectric device 10 and the first vibration member 20 by an adhesive member (or a connection member) such as an adhesive, a double-sided tape, or a double-sided adhesive pad. For example, the adhesive member including an adhesive may be a photocurable adhesive, but aspects of the present disclosure are not limited thereto. For example, the adhesive member including an adhesive may be an ultraviolet (UV) adhesive, but aspects of the present disclosure are not limited thereto.

Figure 4:
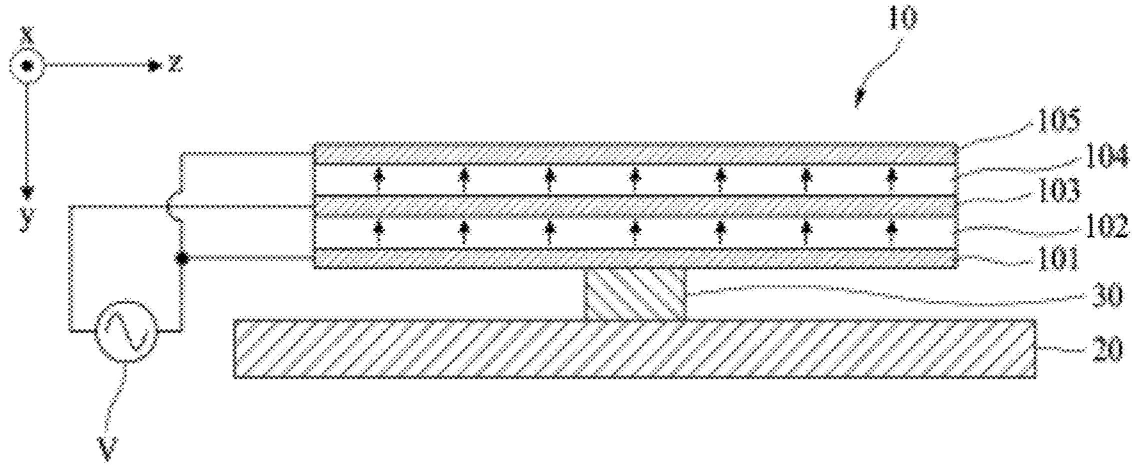
FIG. 4 is a cross-sectional view illustrating a structure of a piezoelectric device according to a first aspect of the present disclosure.

FIG. 4 is a cross-sectional view illustrating a structure of the piezoelectric device according to the first aspect of the present disclosure. FIG. 4 illustrates a cross-sectional view taken along line A-A' of FIG. 2 like FIG. 3 although a direction thereof differs from FIG. 3. Also, FIG. 4 schematically illustrates a connection relationship between electrodes of the piezoelectric device for describing a sound signal input method of the piezoelectric device 10.

The piezoelectric device 10 illustrated in FIG. 4 may have a structure referred to as bimorph where two piezoelectric layers are stacked. The piezoelectric device 10 may include a plurality of electrodes 101, 103, and 105 and a plurality of piezoelectric layers 102 and 104. The electrode 101 (or a first electrode) disposed at a portion close to the first vibration member 20 may be coupled or connected to the elastic member 30. The piezoelectric layer 102 (or a first piezoelectric layer) may be inserted or accommodated between the electrode 101 and the electrode 103 (or a second electrode) in a thickness direction thereof. For example, the piezoelectric layer 102 may be interposed between the electrode 101 and the electrode 103. The piezoelectric layer 104 (or a second piezoelectric layer) may be inserted or accommodated between the electrode 103 and the electrode 105 (or a third electrode) in a thickness direction thereof. For example, the piezoelectric layer 104 may be interposed between the electrode 103 and the electrode 105. Arrows illustrated in the piezoelectric layers 102 and 104 may represent polarization directions of the piezoelectric layers 102 and 104. For example, the polarization directions of the piezoelectric layers 102 and 104 may be the same. Also, lines for applying a voltage to the electrodes may be coupled or connected to the electrodes 101, 103, and 105 by a soldering, or the like.

A voltage applied to the piezoelectric device 10 may be based on a sound signal, and thus, may be referred to as an AC voltage which responds to a frequency of a sound which is to be generated. In FIG. 4, the AC voltage may be referred to by a circuit sign of an AC power source V. One terminal of the AC power source V may be coupled or connected to the electrodes 101 and 105, and the other terminal thereof may be coupled or connected to the electrode 103. In other words, voltages having the same phase may be applied to the electrode 101 and the electrode 105, voltages having opposite phases (or reverse phases) may be applied to the electrode 101 and the electrode 103, and voltages having opposite phases may be applied to the electrode 103 and the electrode 105. Accordingly, voltages having opposite directions (or reverse phase) may be applied to the piezoelectric layer 102 and the piezoelectric layer 104.

Materials of the piezoelectric layers 102 and 104 are not limited and may include a material, having good piezoelectric properties, such as lead zirconate tinanate (PZT) because the amount of displacement is capable of increasing. Also, in a configuration of FIG. 4, a periphery or an outer portion of the piezoelectric device 10 may be covered by an insulator such as resin so as to prevent short circuit between the piezoelectric device 10 and another member or component.

Figure 5:
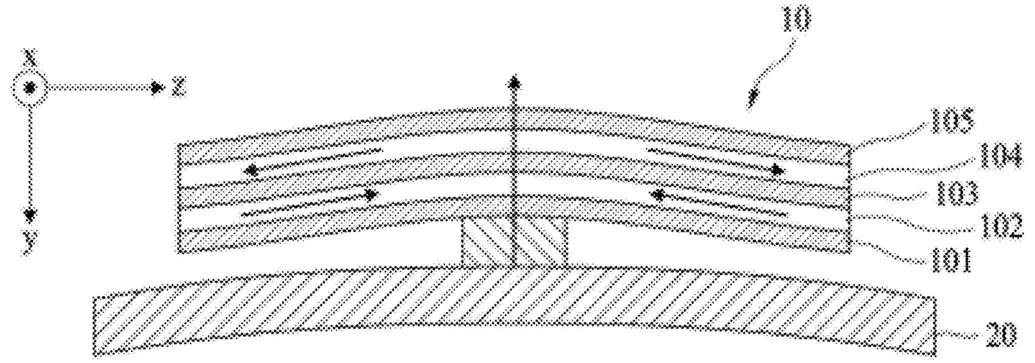
FIG. 5 is a schematic diagram illustrating a modification example when a voltage is applied to a piezoelectric device according to a first aspect of the present disclosure.
Figure 6:
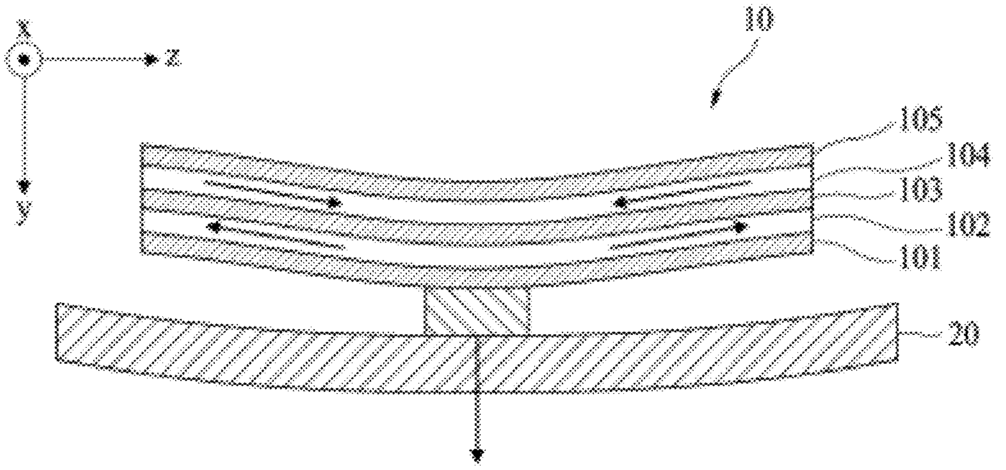
FIG. 6 is a schematic diagram illustrating a modification example when a voltage is applied to a piezoelectric device according to a first aspect of the present disclosure.

FIGS. 5 and 6 are schematic diagrams illustrating a modification example when a voltage is applied to the piezoelectric device according to the first aspect of the present disclosure. As illustrated in FIG. 4, polarization directions of the piezoelectric layers 102 and 104 may be the same direction, and voltages applied to the piezoelectric layers 102 and 104 may have opposite phases or direction. Accordingly, a stretching direction of the piezoelectric layer 102 and the piezoelectric layer 104 may be opposite to each other.

As illustrated in FIG. 5, the piezoelectric layer 104 may be deformed in a direction expanding in a horizontal direction at a timing at which the piezoelectric layer 102 is deformed to contract in the horizontal direction. Therefore, an end portion of the piezoelectric device 10 may be bent in a direction closer to the first vibration member 20. For example, the first vibration member 20 may be deformed based on a stress applied thereto toward the piezoelectric device 10.

As illustrated in FIG. 6, the piezoelectric layer 104 may be deformed in a direction contracting in a horizontal direction at a timing at which the piezoelectric layer 102 is deformed to expand in the horizontal direction. Therefore, the end portion of the piezoelectric device 10 may be bent in a direction distancing from the first vibration member 20. For example, the first vibration member 20 may be deformed based on a stress applied thereto in a direction distancing from the piezoelectric device 10.

When an AC voltage based on a sound signal is applied to the piezoelectric device 10, a form of FIG. 5 and a form of FIG. 6 may be alternately repeated in a frequency of a sound. Therefore, a vibration of the piezoelectric device 10 may be transferred to the first vibration member 20, and thus, the first vibration member 20 may vibrate. Accordingly, the first vibration member 20 may act as a speaker so that the first vibration member 20 generates a sound based on a sound signal.

Figure 7:
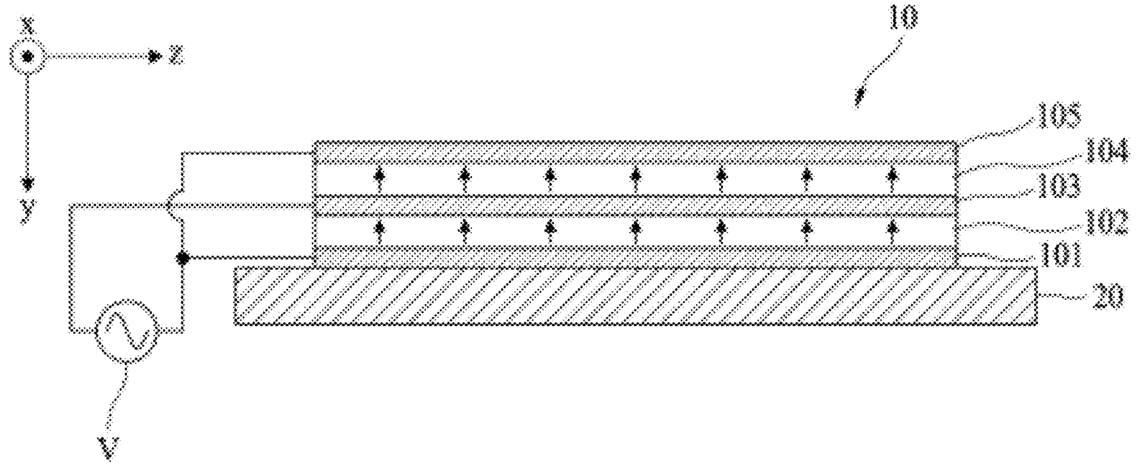
FIG. 7 is a cross-sectional view illustrating a structure of a piezoelectric device according to an experiment example.
Figure 8:
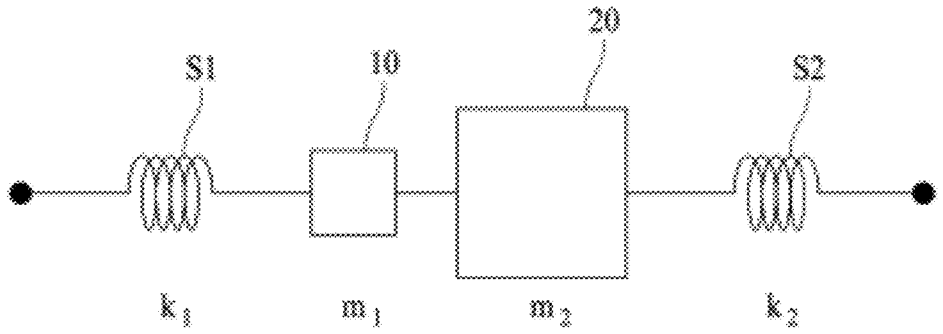
FIG. 8 is a schematic diagram illustrating a vibration model according to an experiment example.
Figure 9:
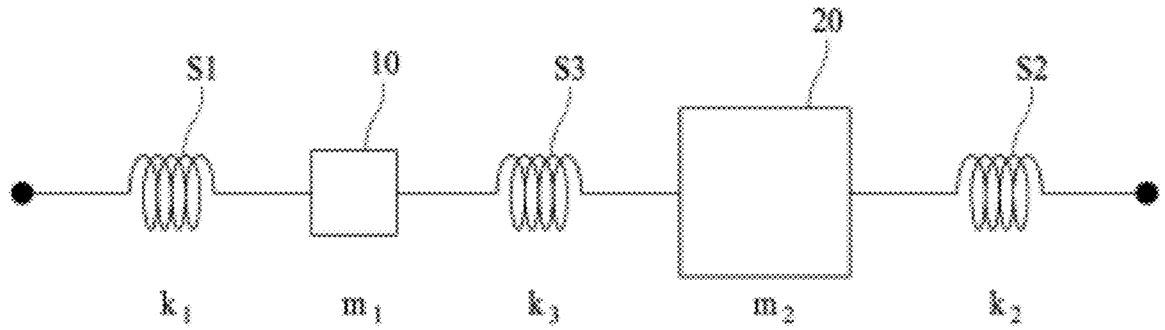
FIG. 9 is a schematic diagram illustrating a vibration model according to a first aspect of the present disclosure.

With reference to FIGS. 7 to 9, in an aspect of the present disclosure, an effect obtained when a portion of a piezoelectric device 10 is connected or coupled to a first vibration member 20 by an elastic member 30 will be described in more detail. FIG. 7 is a cross-sectional view illustrating a structure of a piezoelectric device according to an experiment example. FIG. 8 is a schematic diagram illustrating a vibration model according to the experiment example. FIG. 9 is a schematic diagram illustrating a vibration model according to the first aspect of the present disclosure.

In the experiment example illustrated in FIG. 7, a front surface of the piezoelectric device 10 may be directly coupled or connected to the first vibration member 20. Based on such a configuration, a displacement of the piezoelectric device 10 may be transferred to the first vibration member 20, and thus, the first vibration member 20 may act as a speaker.

The vibration model according to the experiment example, as illustrated in FIG. 8, a plurality of springs S1 and S2 may be connected to both ends of a mass point representing the piezoelectric device 10 and the first vibration member 20. The piezoelectric device 10 having a mass $m_1$ may be directly connected to the first vibration member 20 having a mass $m_2$.

The spring S1 having a spring constant $k_1$ may be coupled or connected to the piezoelectric device 10, and the spring S2 having a spring constant $k_2$ may be coupled or connected to the first vibration member 20. The spring S1 may be implemented by modeling the elasticity of the piezoelectric device 10. The spring S2 may be implemented by modeling the first vibration member 20 or a member, which binds the first vibration member 20 itself, such as a housing (or a case or a body). Furthermore, in the vibration model, both ends thereof may be a fixed end or a fixed member.

In the vibration model of the experiment example, the piezoelectric device 10 and the first vibration member 20 may be replaced with one mass point having a mass $m_1+m_2$. When a voltage is applied to the piezoelectric device 10, a force occurring in the piezoelectric device 10 may simultaneously vibrate all of the first vibration member 20 and the piezoelectric device 10 having the mass $m_1+m_2$. For example, the first vibration member 20 may be far greater in size than the piezoelectric device 10, and thus, the mass $m_1+m_2$ may be far greater than a mass $m_1$. The force occurring in the piezoelectric device 10 may affect an object having a very large mass, and thus, an acceleration applied to the piezoelectric device 10 and the first vibration member 20 by the force may be small. Accordingly, a displacement amount of the piezoelectric device 10 and the first vibration member 20 may not be large, and in a configuration of the experiment example, a sound pressure level of a sound generated by the first vibration member 20 may be insufficient.

On the other hand, as illustrated in FIG. 9, a vibration apparatus (or a vibration device) according to an aspect of the present disclosure may include a configuration where a spring S3 having a spring constant $k_3$ is coupled or connected between a mass point representing a first vibration member 20 and a piezoelectric device 10. The spring S3 may be implemented by modeling the elasticity of an elastic member 30. The piezoelectric device 10 having a mass $m_1$ and the first vibration member 20 having a mass $m_2$ may be coupled or connected to through the spring S3.

In the vibration model according to an aspect of the present disclosure, the piezoelectric device 10 and the first vibration member 20 may have independent displacements. A force, generated when a voltage is applied to the piezoelectric device 10, may vibrate the piezoelectric device 10 having the mass $m_1$. A mass of an object to which the force is applied may be less than the experiment example, and thus, an acceleration applied to the piezoelectric device 10 by the force may be greater than the experiment example. Therefore, the piezoelectric device 10 may be a resonance state with large displacement. A displacement of the piezoelectric device 10 may be gradually transferred to the first vibration member 20 through the spring S3, and thus, like the experiment example, suppression of displacement by a mass of the first vibration member 20 may be difficult to occur. Accordingly, in an aspect of the present disclosure, displacement may increase compared to the experiment example, and thus, a sound pressure level may be enhanced.

As described above, according to an aspect of the present disclosure, when the first vibration member 20 acts as a speaker, a sound pressure level of a sound generated by the first vibration member 20 may be enhanced, and thus, the sound apparatus 1 for enhancing sound quality may be provided.

Moreover, in an aspect of the present disclosure, a vibration source may be the piezoelectric device 10, but aspects of the present disclosure are not limited thereto and a sound generating source may be the first vibration member which is large in mass and is low in natural frequency. Therefore, in an aspect of the present disclosure, a sound pressure level of a low-pitched sound band may be more enhanced than that from a configuration, where the piezoelectric device 10 directly generates a sound, or a configuration where a sound is generated by a member which couples or connects the piezoelectric device 10 to a separate small vibration plate differing from the first vibration member 20 and has a high natural frequency.

As described above, the piezoelectric device 10 may have a relatively small mass, and thus, the natural frequency of the piezoelectric device 10 itself may be low. Therefore, a piezoelectric device 10 configured alone may have a non-uniform frequency characteristic. For example, within an audible frequency range, a sound pressure level of the low-pitched sound band is relatively low and a sound pressure level of a high-pitched sound band is relatively high. The first vibrating member 20, which has a relatively large mass compared to the piezoelectric device 10, is coupled or connected to the piezoelectric device 10, thereby reducing the natural frequency compared to the case in which the piezoelectric device 10 is provided alone. Therefore, a frequency characteristic within an audible frequency range may get close to flatness compared to the case in which the piezoelectric device 10 is configured alone, and thus, a sound pressure level of the low-pitched sound band may relatively increase. Accordingly, a configuration according to an aspect of the present disclosure may relatively and effectively enhance a sound pressure level of the low-pitched sound band mainly within the audible frequency range.

Second Aspect

In an aspect of the present disclosure, a more detailed configuration example of the sound apparatus 1 according to the first aspect of the present disclosure is described. The sound apparatus 1 according to an aspect of the present disclosure may be applied to, for example, a signage and the like such as an advertisement signboard, a poster, and a noticeboard. In the signage, content such as sentences, pictures, and signs may be arranged to be visible at the sound source surface 20*a* of the first vibration member 20. The content may be directly attached on the sound source surface 20*a*, and a medium such as paper with the content attached thereon based on printing may be attached on the sound source surface 20*a*. For example, the sound apparatus 1 according to an aspect of the present disclosure may be applied to a display configured to display an image or a signage which does not display an image or does not include the display. A structure of the piezoelectric device 10, the first vibration member 20, and the elastic member 30 may be the same as the first aspect of the present disclosure, and thus, its description is omitted.

Figure 10A:
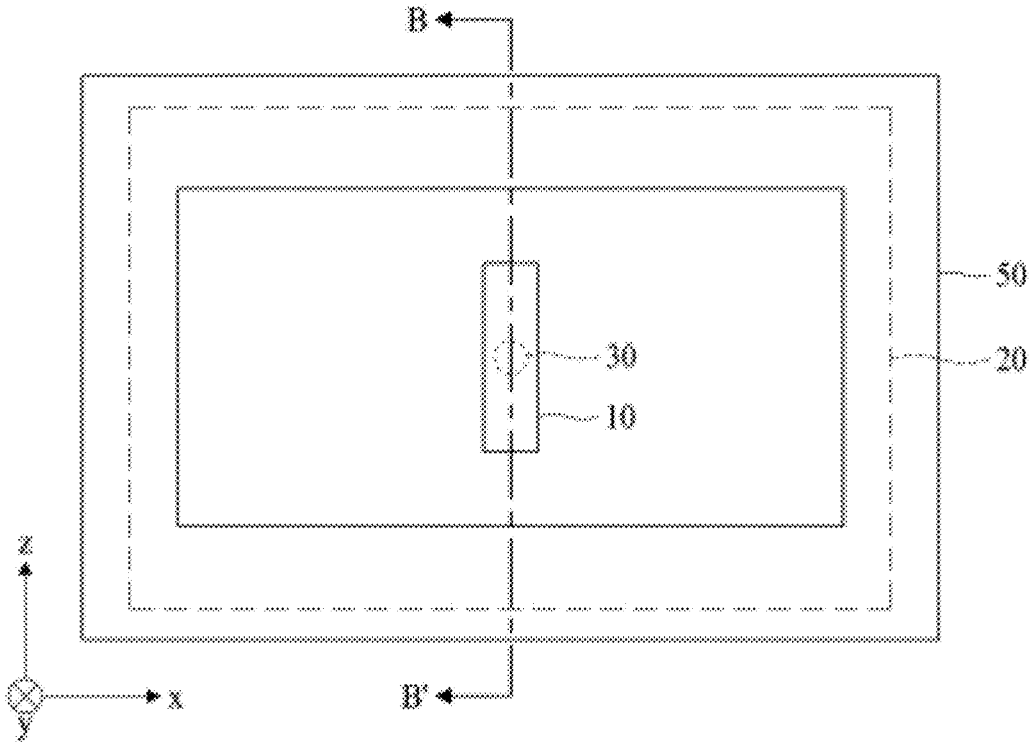
FIG. 10A is a plan view illustrating a configuration of a sound apparatus according to a second aspect of the present disclosure.
Figure 10B:
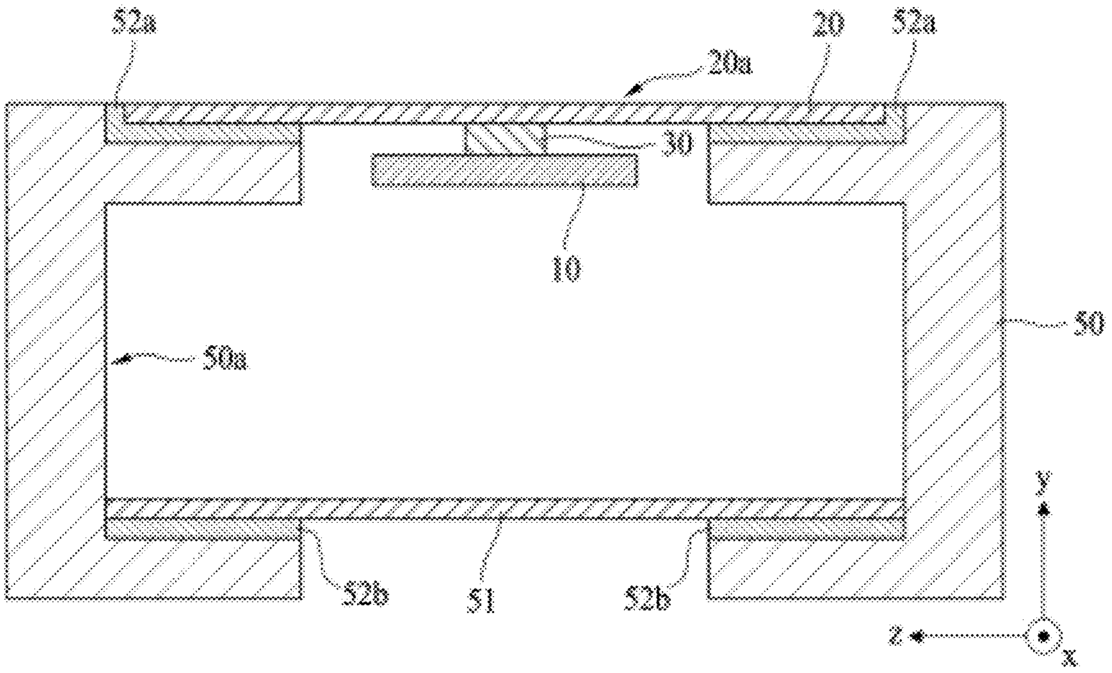
FIG. 10B is a cross-sectional view illustrating a configuration of a sound apparatus according to a second aspect of the present disclosure.
Figure 11:
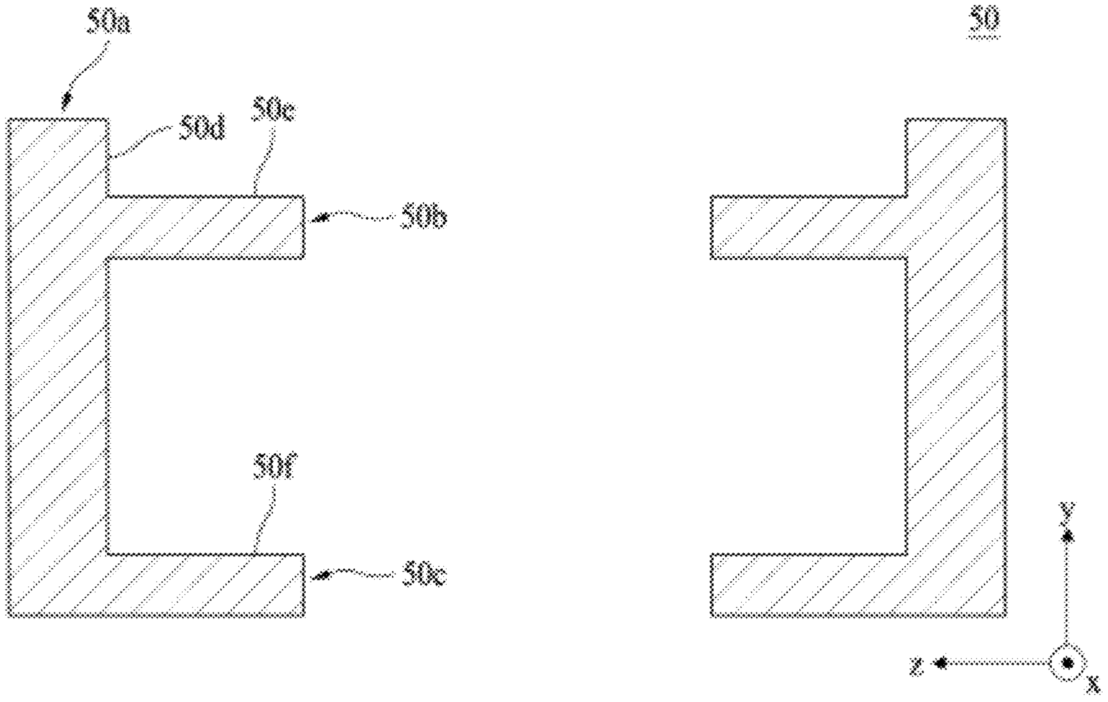
FIG. 11 is a cross-sectional view illustrating a frame structure according to a second aspect of the present disclosure.

FIG. 10A is a plan view illustrating a configuration of a sound apparatus according to a second aspect of the present disclosure. FIG. 10B is a cross-sectional view illustrating a configuration of the sound apparatus according to the second aspect of the present disclosure. Also, FIG. 11 is a cross-sectional view illustrating only a frame of the sound apparatus in FIG. 10. FIGS. 10B and 11 illustrate a cross-sectional view taken along line B-B' of FIG. 10A. A configuration of the sound apparatus according to the second aspect of the present disclosure will be described with reference to FIGS. 10A and 10B. In FIG. 10A, a first vibration member 20 illustrated by a dotted line represents an example where the first vibration member 20 is supported by the frame 50. The frame 50 may be disposed to surround the first vibration member 20 in a plan view.

As illustrated in FIG. 10B, the sound apparatus 1 may include a piezoelectric device 10, a first vibration member 20, an elastic member 30, a frame 50, a back cover 51, and a plurality of adhesive members 52*a* and 52*b*. The frame 50, the back cover 51, and the first vibration member 20 may configure a housing (or a case or a body) of the sound apparatus 1. For example, the back cover 51 may be a rear cover, a back cover panel, and a rear cover panel, but aspects of the present disclosure are not limited thereto. For example, the first vibration member 20 may be a vibration panel of an advertising object or a vibration panel of a signage. For example, the advertising object may be a picture frame, a poster, a standing signboard, and a content of a signage, but aspects of the present disclosure are not limited thereto. The frame 50 may support the first vibration member 20 and the back cover 51. The first vibration member 20 may be inserted or accommodated into the frame 50. The back cover 51 may shield an inner space of the housing so that a vibration of the piezoelectric device 10 is not leaked to the outside in a direction toward a rear surface of the housing. Also, the back cover 51 may have a protection function so that an external object does not contact the piezoelectric device 10. The adhesive members 52*a* and 52*b* may be a fixing member which attaches and fixes the first vibration member 20 and the back cover 51 on and to the frame 50. The frame 50 may include, for example, a material such as metal or resin. The back cover 51 may include, for example, a material such as metal, resin, glass, or hard paper. The adhesive members 52*a* and 52*b* may include, for example, a compression resin material, an adhesive, or an adhesive tape. However, materials of the frame 50, the back cover 51, and the adhesive members 52*a* and 52*b* are not limited to a specific material.

As illustrated in FIG. 11, in a cross-sectional view, the frame 50 may include a side portion (or an upper side portion) 50*a* extended in a y direction (or a first direction) and a plurality of protrusion portions 50*b* and 50*c* protruded in a z direction (or a third direction) perpendicular to the y direction in which the side portion 50*a* extends. The protrusion portions 50*b* and 50*c* may be disposed at positions spaced apart from each other in the y direction. The side portion 50*a* may include an adhesive surface 50*d*, the protrusion portion 50*b* may include an adhesive surface 50*e*, and the protrusion portion 50*c* may include an adhesive surface 50*f*. As illustrated in FIG. 10, the adhesive member 52*a* may attach the first vibration member 20 and the adhesive surfaces 50*d* and 50*e* of the frame 50 to each other. Likewise, the adhesive member 52*b* may attach the back cover 51 and the adhesive surface 50*f* of the frame 50 to each other. As described above, the protrusion portions 50*b* and 50*c* may determine a position at which the first vibration member 20 is spaced apart from the back cover 51 in the y direction. For example, the protrusion portion 50*b* may be a first protrusion portion or an upper protrusion portion, but aspects of the present disclosure are not limited thereto. For example, the protrusion portion 50*c* may be a second protrusion portion or a lower protrusion portion, but aspects of the present disclosure are not limited thereto. For example, the adhesive member 52*a* may be a first adhesive member, a first fixing member, a first connection member, or a first coupling member, but aspects of the present disclosure are not limited thereto. For example, the adhesive member 52*b* may be a second adhesive member, a second fixing member, a second connection member, or a second coupling member, but aspects of the present disclosure are not limited thereto.

As described above, the back cover 51 may be disposed at a position spaced apart from the first vibration member 20 so as not to interfere in the piezoelectric device 10, and thus, the sound apparatus 1 according to an aspect of the present disclosure may include a housing structure (or a body structure) including a space between the piezoelectric device 10 and the back cover 51. Therefore, the sound apparatus 1 according to an aspect of the present disclosure may be configured so that the piezoelectric device 10 does not contact a portion other than the first vibration member 1 of the housing (or a case or a body). Also, in the sound apparatus 1 according to an aspect of the present disclosure, the housing may be implemented in a flat plate shape, and thus, the sound apparatus 1 may be configured to be thin or slim. Accordingly, according to an aspect of the present disclosure, an effect described above in the first aspect may be obtained, and moreover, the sound apparatus 1 which includes the housing difficult to control a vibration of the piezoelectric device 10 and is thin or slim may be provided. Also, according to an aspect of the present disclosure, the first vibration member 20 and a front cover 54 (see FIG. 15) may be configured as one body or a single body, and thus, a thin or slim sound apparatus 1 may be provided.

Moreover, in an aspect of the present disclosure, the sound source surface 20*a* disposed at a side opposite to the piezoelectric device 10 of the first vibration member 20 may be an outer surface of the housing, and thus, may be visible from the outside. Accordingly, in an aspect of the present disclosure, content of a signage may be attached on the sound source surface 20*a*, and the sound apparatus 1 having an acoustic effect such as a sound being generated from the content may be provided.

Moreover, in an aspect of the present disclosure, the piezoelectric device 10 may be disposed in a space defined by the frame 50, the back cover 51, and the first vibration member 20, and thus, may appropriately adjust a size (or a dimension) and may enable the space to act as a resonance space, thereby enhancing sound quality. Also, a vibration generated by the piezoelectric device 10 and a vibration reflected from an end portion of the first vibration member 20 may be reinforced, and thus, may cause resonance. The resonance may be a cause of noise. When the adhesive members 52*a* and 52*b* is a member which has a low elastic modulus and absorbs a vibration like a compression resin material, an adhesive, and an adhesive tape, the adhesive members 52*a* and 52*b* may absorb the undesired resonance of the first vibration member 20 caused by the cause, thereby obtaining an effect of enhancing sound quality.

Third Aspect

In an aspect of the present disclosure, a modification example of a structure of the frame 50 according to the second aspect of the present disclosure will be described. A structure of a piezoelectric device 10, a first vibration member 20, an elastic member 30, a back cover 51, and a plurality of adhesive members 52*a* and 52*b* may be the same as the second aspect of the present disclosure, and thus, their repetitive descriptions may be omitted. For example, the back cover 51 may be a rear cover, a back cover panel, and a rear cover panel, but aspects of the present disclosure are not limited thereto. For example, the first vibration member 20 may be a vibration panel of an advertising object or a vibration panel of a signage. For example, the advertising object may be a picture frame, a poster, a standing signboard, and a content of a signage, but aspects of the present disclosure are not limited thereto.

Figure 12:
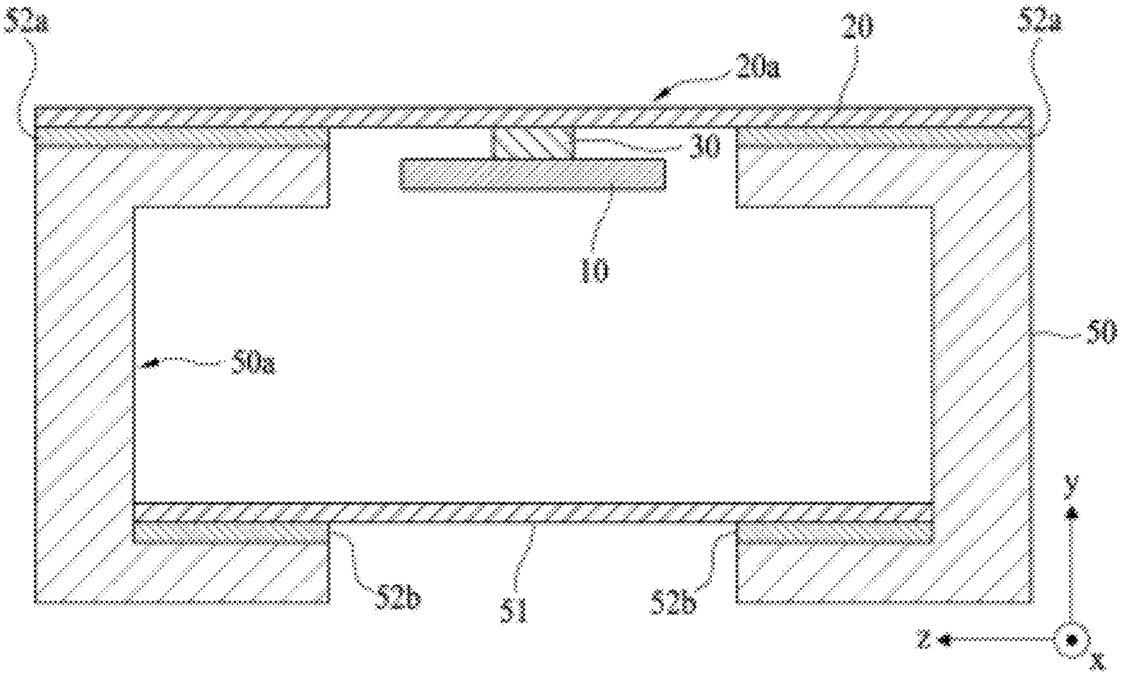
FIG. 12 is a cross-sectional view illustrating a configuration of a sound apparatus according to a third aspect of the present disclosure.
Figure 13:
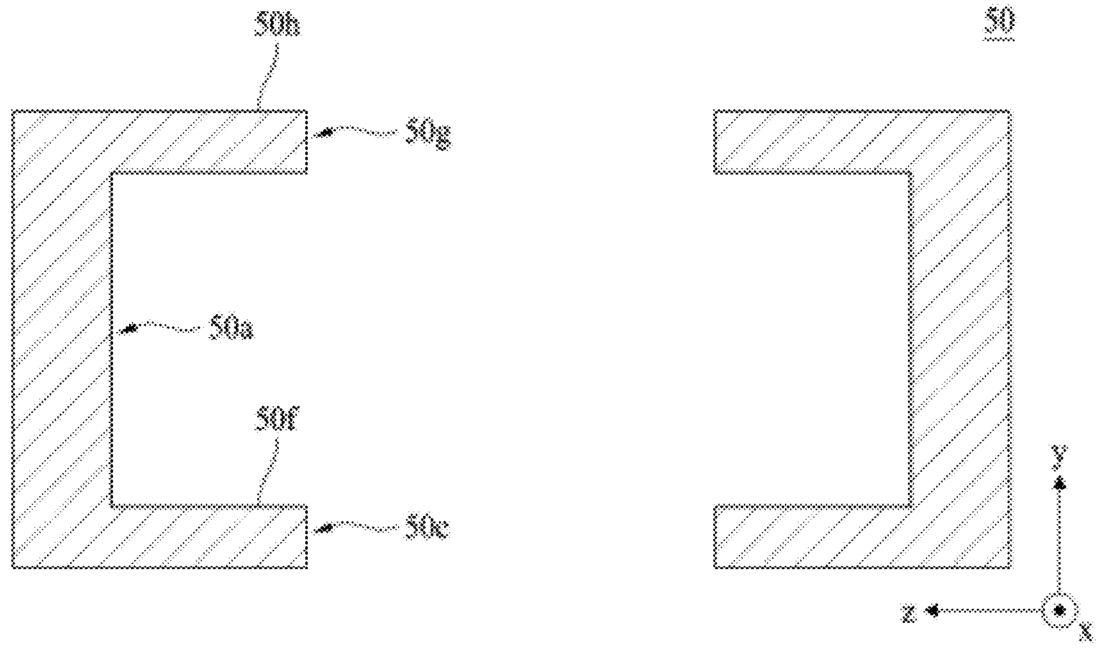
FIG. 13 is a cross-sectional view illustrating a frame structure according to a third aspect of the present disclosure.

FIG. 12 is a cross-sectional view illustrating a configuration of a sound apparatus according to a third aspect of the present disclosure. Also, FIG. 13 is a cross-sectional view illustrating only a frame 50 of the sound apparatus in FIG. 12. FIGS. 12 and 13 illustrate a cross-sectional view taken along line B-B' of FIG. 10A in the same direction as FIG. 10B.

As illustrated in FIG. 13, the frame 50 may include a protrusion portion 50*g* instead of the protrusion portion 50*b* according to the second aspect of the present disclosure. The protrusion portion 50*g* may protrude so that a top surface or an upper surface of the frame 50 protrudes in a z direction perpendicular to a y direction in which a side portion 50*a* extends, in a cross-sectional view. As illustrated in FIGS. 12 and 13, an adhesive member 52*a* may be an adhesive surface 50*h* which is a top surface of the first vibration member 20 and the frame 50. For example, the frame 50 may include a cross-sectional surface having a c-shape, but aspects of the present disclosure are not limited thereto.

In an aspect of the present disclosure, the sound apparatus 1 having the same effect as the second aspect of the present disclosure may be provided. Also, according to an aspect of the present disclosure, a structure of the frame 50 may be more simplified than a structure according to the second aspect of the present disclosure. For example, the first vibration member 20 may be adhered to or attached on an upper end or an upper portion of the frame 50. Also, the adhesive member 52*a* according to an aspect of the present disclosure may attach the top surface of the frame 50 on the first vibration member 20, and thus, an area thereof attached by the adhesive member 52*a* may be greater than an area of a configuration according to the second aspect of the present disclosure. Accordingly, in an aspect of the present disclosure, the undesired resonance of the first vibration member 20 may be relatively more absorbed by the adhesive member 52*a*, and thus, sound quality may be more enhanced than the configuration according to the second aspect of the present disclosure. Also, according to an aspect of the present disclosure, the first vibration member 20 and the front cover 54 (see FIG. 15) may be configured as one body or a single body, and thus, a thin or slim sound apparatus 1 may be provided.

Fourth Aspect

In an aspect of the present disclosure, a modification example of the structure of the housing of the sound apparatus 1 according to the second aspect and the third aspect of the present disclosure will be described. A structure of a piezoelectric device 10, a first vibration member 20, an elastic member 30, a frame 50, a back cover 51, and a plurality of adhesive members 52*a* and 52*b* may be the same as the second aspect and the third aspect of the present disclosure, and thus, their repetitive descriptions may be omitted. For example, the back cover 51 may be a rear cover, a back cover panel, and a rear cover panel, but the terms are not limited thereto. For example, the first vibration member 20 may be a vibration panel of an advertising object (or an advertising material) or a vibration panel of a signage. For example, the advertising object or the advertising material may be a picture frame, a poster, a standing signboard or a storefront sign, and a content of a signage, but aspects of the present disclosure are not limited thereto.

Figure 14:
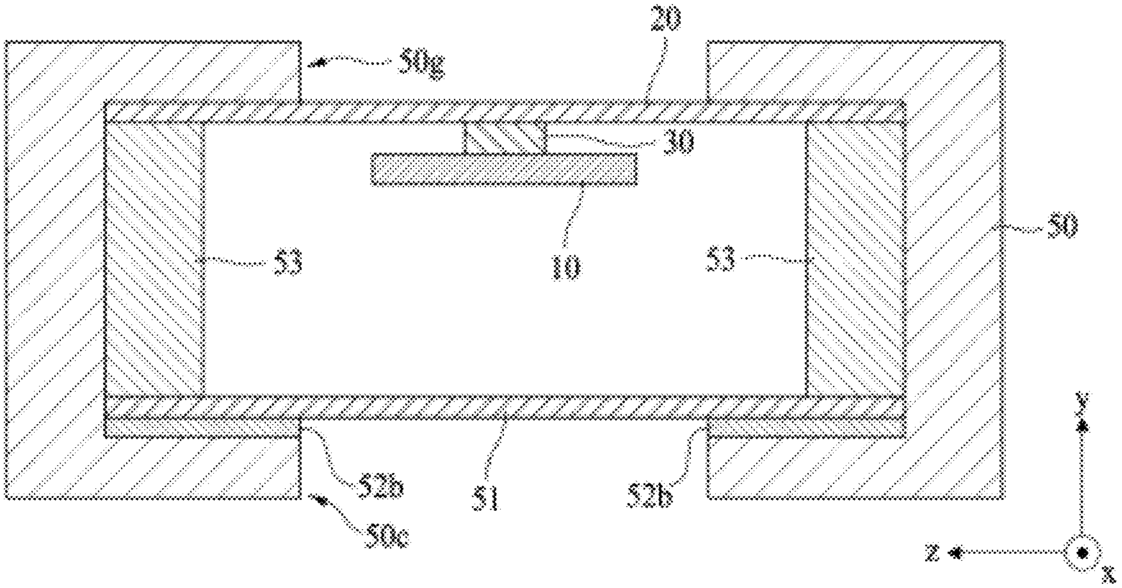
FIG. 14 is a cross-sectional view illustrating a configuration of a sound apparatus according to a fourth aspect of the present disclosure.

FIG. 14 is a cross-sectional view illustrating a configuration of a sound apparatus according to a fourth aspect of the present disclosure. Also, FIG. 14 is a cross-sectional view taken along line B-B' of FIG. 10A in the same direction as FIG. 10B.

As illustrated in FIG. 14, the sound apparatus 1 may include a piezoelectric device 10, a first vibration member 20, an elastic member 30, a frame 50, a back cover 51, an adhesive member 52*b*, and a compression member 53. The compression member 53 may compress the first vibration member 20 to an inner portion of a housing of the sound apparatus 1 to perform a function of a fixing member. The compression member 53 may include, for example, a material such as metal or resin. However, a material of the compression member 53 is not limited to a specific material. For example, the compression member 53 may be a panel compression supporter, a panel supporter, and a supporting member, but the aspects of the present disclosure are not limited thereto. Also, an adhesive member may be disposed between the compression member 53 and the first vibration member 20. An adhesive member may be disposed between the frame 50 and the first vibration member 20. For example, an adhesive member disposed between the compression member 53, the first vibration member 20, and the frame 50 may have a a-shape, but aspects of the present disclosure are not limited thereto. For example, the adhesive member may be disposed to surround an end portion of the first vibration member 20.

In an aspect of the present disclosure, a structure of the frame 50 may be the same as FIG. 13. As illustrated in FIG. 14, the compression member 53 may be compressed for filling a gap (or an interval or a spaced space) between the protrusion portion 50*g* and the protrusion portion 50*c* in a cross-sectional view. The compression member 53 may compress the first vibration member 20, a side portion 50*a*, and the back cover 51.

In an aspect of the present disclosure, the sound apparatus 1 having the same effect as the third aspect of the present disclosure may be provided. A method of fixing or attaching the first vibration member 20 to the frame 50 is not limited to an attachment process as in the second aspect and the third aspect of the present disclosure and various methods may be applied thereto. Also, according to an aspect of the present disclosure, the first vibration member 20 and the front cover 54 (see FIG. 15) may be configured as one body or a single body, and thus, a thin or slim sound apparatus 1 may be provided.

Fifth Aspect

In an aspect of the present disclosure, a modification example of the structure of the housing of the sound apparatus 1 according to the second to fourth aspects of the present disclosure will be described. A structure of a piezoelectric device 10, a first vibration member 20, an elastic member 30, a back cover 51, and an adhesive member 52*b* may be the same as any one among the second to fourth aspects of the present disclosure, and thus, their repetitive descriptions may be omitted.

Figure 15:
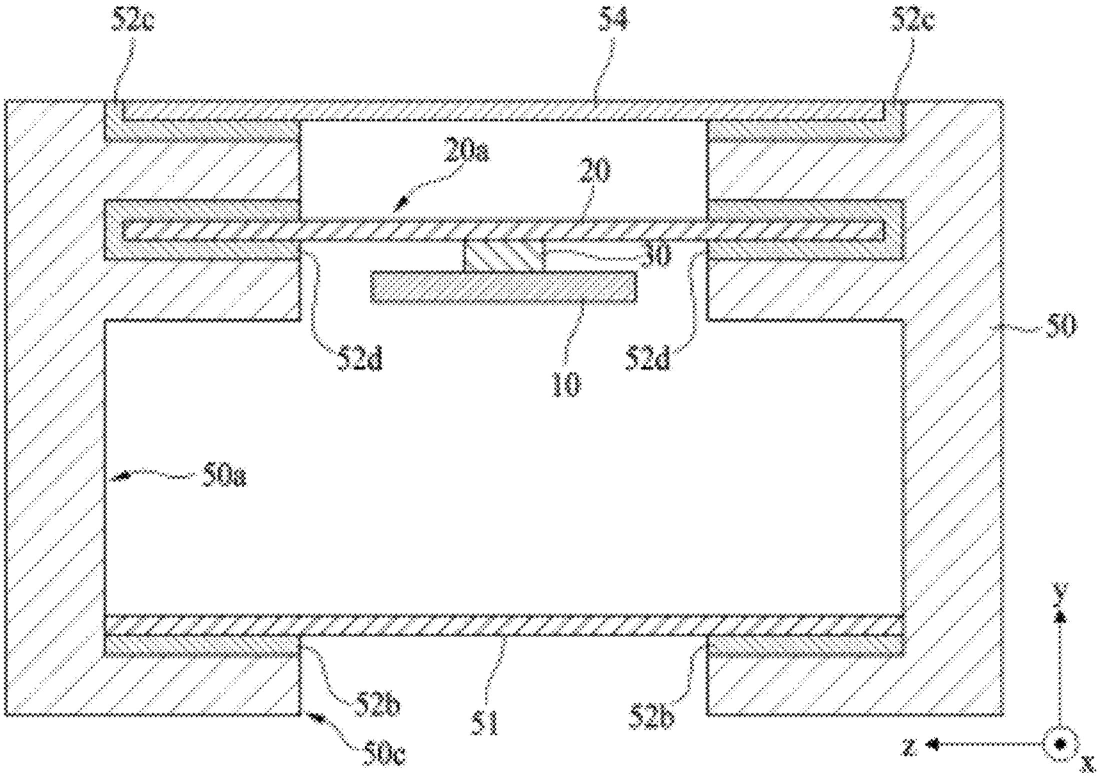
FIG. 15 is a cross-sectional view illustrating a configuration of a sound apparatus according to a fifth aspect of the present disclosure.
Figure 16:
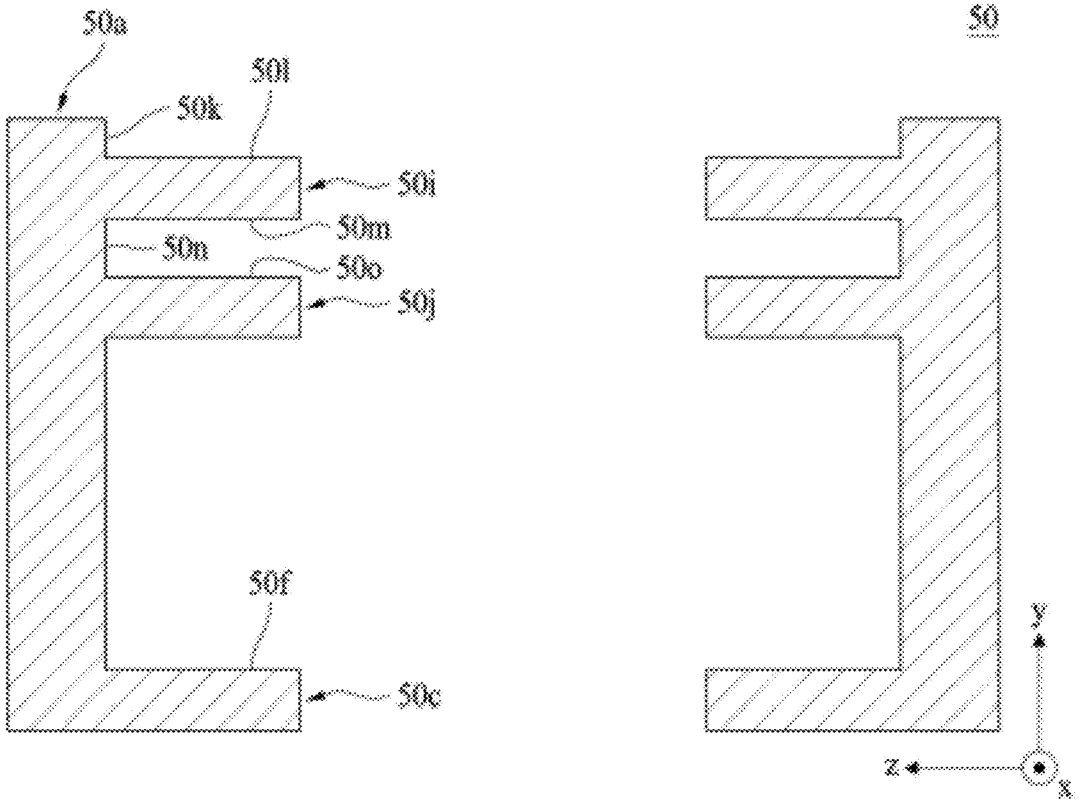
FIG. 16 is a cross-sectional view illustrating a frame structure according to a fifth aspect of the present disclosure.

FIG. 15 is a cross-sectional view illustrating a configuration of a sound apparatus according to a fifth aspect of the present disclosure. Also, FIG. 16 is a cross-sectional view illustrating only a frame 50 of the sound apparatus 1 in FIG. 15. FIGS. 15 and 16 illustrate a cross-sectional view taken along line B-B' of FIG. 10A in the same direction as FIG. 10B.

As illustrated in FIG. 15, the sound apparatus 1 may include a piezoelectric device 10, a first vibration member 20, an elastic member 30, a frame 50, a back cover 51, a plurality of adhesive members 52*b* to 52*d*, and a front cover 54. For example, the first vibration member 20 may be a vibration panel of an advertising object or a vibration panel of a signage. For example, the advertising object may be a picture frame, a poster, a standing signboard, and a content of a signage, but aspects of the present disclosure are not limited thereto. The first vibration member 20 may be inserted or accommodated into the frame 50. The adhesive members 52*c* and 52*d* may be a member which attaches and fixes the front cover 54 and the first vibration member 20 on and to the frame 50. An external object may not contact content of a signage which is attached on a sound source surface 20*a* of the first vibration member 20 by the front cover 54, and thus, the front cover 54 may act as a protection member. For example, the front cover 54 may be a front cover, a front cover panel, and a fore cover panel, but aspects of the present disclosure are not limited thereto. A material of the front cover 54 may include a transparent material so that content attached on the sound source surface 20*a* of the first vibration member 20 may be visible from the outside. For example, the front cover 54 may include a transparent material such as resin or glass. However, a material of the front cover 54 is not limited to a specific material. For example, a space may be provided between the front cover 54 and the first vibration member 20. A vibration panel of an advertising object or a vibration panel of a signage may be accommodated or inserted into the space. For example, the advertising object may be a picture frame, a poster, a standing signboard, and a content of a signage, but aspects of the present disclosure are not limited thereto.

As illustrated in FIG. 16, the frame 50 may include a plurality of protrusion portions 50*i* and 50*j* instead of the protrusion portion 50*g* according to the third aspect of the present disclosure. The protrusion portions 50*i* and 50*j* may protrude in a z direction perpendicular to a y direction in which a side portion 50*a* extends, in a cross-sectional view. The protrusion portions 50*i*, 50*j*, and may be disposed at positions spaced apart from one another in the y direction. The side portion may include a plurality of adhesive surfaces 50*k* and 50*n*, the protrusion portion 50*i* may include a plurality of adhesive surfaces 50*l* and 50*m*, and the protrusion portion 50*j* may include an adhesive surface 50*o*. As illustrated in FIG. 15, the adhesive member 52*c* may attach the front cover 54 and the adhesive surfaces 50*k* and 50*l* of the frame 50. Likewise, the adhesive member 52*d* may attach the first vibration member 20 and the adhesive surfaces 50*m*, 50*n* and 50*o* of the frame 50. As described above, the adhesive surfaces 50*m*, 50*n*, and 50*o* may determine a position at which the front cover 54, the first vibration member 20, and the back cover 51 are spaced apart from one another in the y direction. Therefore, like the protrusion portion 50*g* according to the third aspect of the present disclosure, the protrusion portion 50*i* may protrude so that a top surface of the frame 50 extends. Also, a method of fixing or attaching the first vibration member 20 to the frame 50 is not limited to an attachment process according to an aspect of the present disclosure, and various methods such as a compression process using the compression member 53 as in the fourth aspect of the present disclosure may be applied.

In an aspect of the present disclosure, the sound apparatus 1 having the same effect as the second aspect of the present disclosure may be provided. Also, according to an aspect of the present disclosure, the front cover 54 may be disposed, and thus, content of a signage attached on a sound source surface 20*a* of the first vibration member 20 may be protected from damage and pollution caused by contacting an object from the outside. Accordingly, in an aspect of the present disclosure, the sound apparatus 1 capable of being used in various installation environments may be provided.

Moreover, in an aspect of the present disclosure, the front cover 54 may be disposed at a position spaced apart from the first vibration member 20, and thus, the sound apparatus 1 according to an aspect of the present disclosure may include a housing structure (or a body structure) including a space between the first vibration member 20 and the front cover 54. Therefore, in an aspect of the present disclosure, a medium of content may be inserted or accommodated into the space between the first vibration member 20 and the front cover 54. Accordingly, it is not limited that content is directly printed or attached on the sound source surface 20*a* of the first vibration member 20. For example, content may be printed on a medium such as paper, and a print material inserted into a space of the sound apparatus 1 may be replaced, whereby the content may be easily replaced.

Sixth Aspect

In an aspect of the present disclosure, a modification example of a configuration of the housing (or a body) of the sound apparatus 1 according to the second to fifth aspects of the present disclosure will be described. A structure of a piezoelectric device 10, a first vibration member 20, an elastic member 30, a frame 50, a back cover 51, and a plurality of adhesive members 52*a* and 52*b* may be the same as any one among the second, third, and fifth aspects of the present disclosure, and thus, their repetitive descriptions may be omitted.

Figure 17:
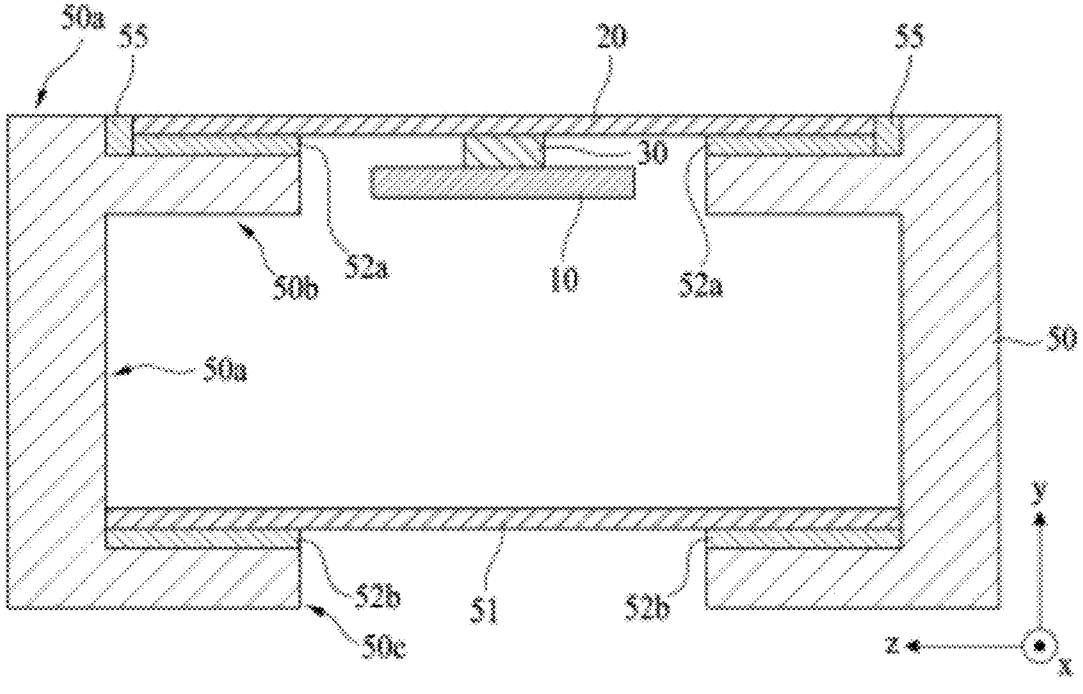
FIG. 17 is a cross-sectional view illustrating a configuration of a sound apparatus according to a sixth aspect of the present disclosure.

FIG. 17 is a cross-sectional view illustrating a configuration of a sound apparatus according to a sixth aspect of the present disclosure. Also, FIG. 17 is a cross-sectional view taken along line B-B' of FIG. 10A in the same direction as FIG. 10B.

As illustrated in FIG. 17, the sound apparatus 1 may include a piezoelectric device 10, a first vibration member 20, an elastic member 30, a frame 50, a back cover 51, a plurality of adhesive members 52*a* and 52*b*, and a vibration absorption member 55. The vibration absorption member 55 may be a member which absorbs a vibration transferred from the piezoelectric device 10. A material of the vibration absorption member 55 is not limited but may include a material, which is excellent in vibration absorbing properties, such as rubber or silicone.

As illustrated in FIG. 17, the vibration absorption member 55 may be disposed between a side portion 50*a* of the frame 50 and the first vibration member 20 in a cross-sectional view. In other words, the vibration absorption member 55 may be disposed near a side surface of the first vibration member 20. The vibration absorption member 55 may be used along with any one among adhesive members 52*a* to 52*d* according to the second to fifth aspects of the present disclosure and may connect the frame 50 to at least a portion of the first vibration member 20, the back cover 51, and the front cover 54.

In an aspect of the present disclosure, the sound apparatus 1 having the same effect as the second aspect of the present disclosure may be provided. Also, according to an aspect of the present disclosure, at least a portion of the first vibration member 20 may be attached on the frame 50 through the vibration absorption member 55, and thus, a vibration of the first vibration member 20 may be absorbed by the vibration absorption member 55 which is excellent in vibration absorbing properties, in addition to the adhesive member 52*a*. Accordingly, in an aspect of the present disclosure, the undesired resonance of the first vibration member 20 may be more absorbed, thereby have more enhancing sound quality than that from a configuration according to the second aspect of the present disclosure.

Seventh Aspect

Figure 18:
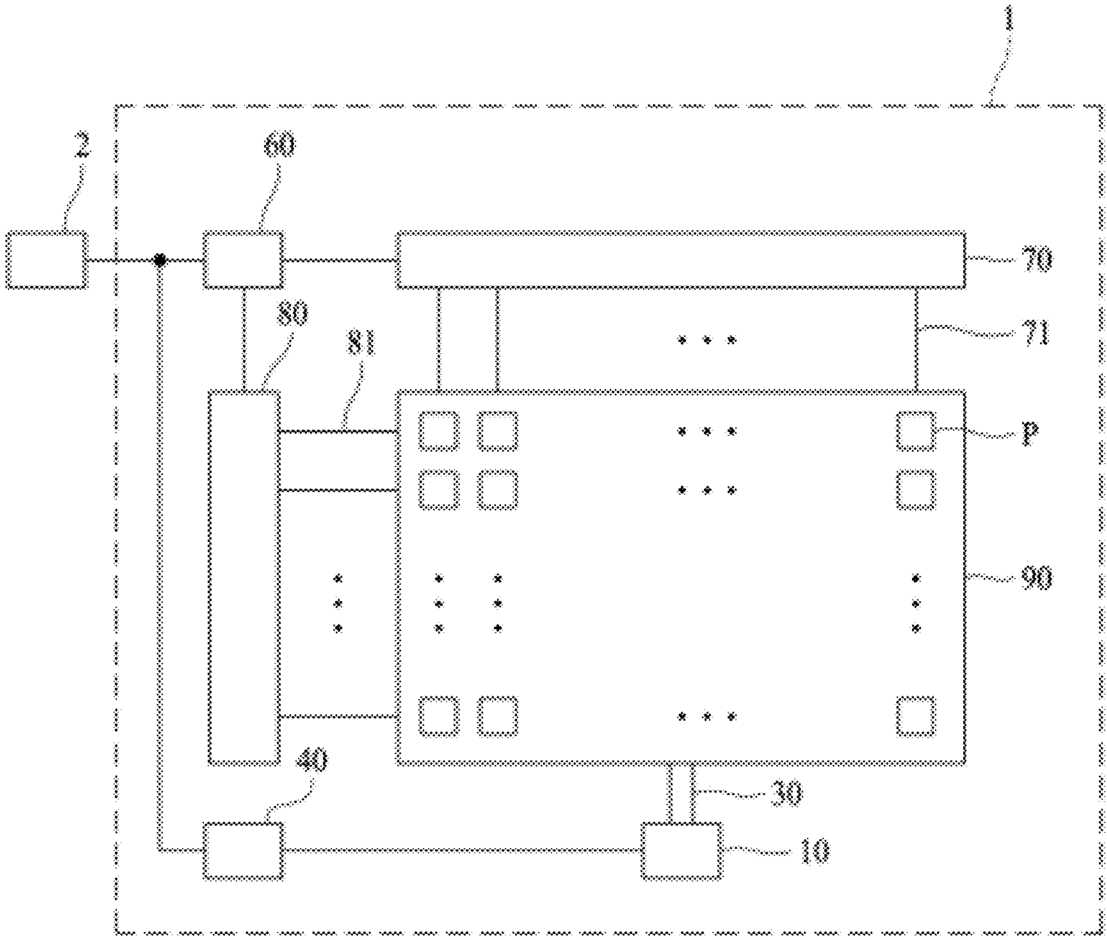
FIG. 18 is a block diagram of a sound apparatus according to a seventh aspect of the present disclosure.

In an aspect of the present disclosure, a more detailed configuration example of the sound apparatus 1 according to the first aspect of the present disclosure will be described. FIG. 18 is a block diagram of a sound apparatus according to a seventh aspect of the present disclosure. The sound apparatus 1 according to an aspect of the present disclosure may be applied to, for example, display apparatuses for electronic posters, digital bulletin boards, electronic advertisement signboards, computer displays, and televisions. A configuration of a host system 2, a piezoelectric device 10, an elastic member 30, and a first controller 40 may be the same as the second aspect of the present disclosure, and thus, their repetitive descriptions may be omitted.

As illustrated in FIG. 18, the sound apparatus 1 may include a piezoelectric device 10, an elastic member 30, a first controller 40, a second controller 60, a data driving circuit 70, a gate driving circuit 80, and a display panel 90. The sound apparatus 1 may be an apparatus which displays an image by using a display panel 90 based on RGB data input thereto and generates a voice or a sound based on a sound signal or the like input thereto.

The second controller 60 may control the data driving circuit 70 and the gate driving circuit 80 based on image data and a timing signal input from the host system 2. The data driving circuit 70 may supply data voltages or the like to a plurality of pixels P through a driving line 71 disposed in column of the plurality of pixels P. The gate driving circuit 80 may supply a control signal to the plurality of pixels P through a driving line 81 disposed in row of the plurality of pixels P. Also, each of the driving line 71 and the driving line 81 may be provided in a plurality lines.

The display panel 90 may include the plurality of pixels P arranged to configure a plurality of rows and a plurality of columns. The sound apparatus 1 may be, for example, an organic light emitting diode (OLED) display where an OLED is used as a light emitting device of pixel P. When the sound apparatus 1 is capable of displaying a color image, the pixel P may be a subpixel which displays one of a plurality of colors (for example, RGB) configuring a color image.

Each of the first controller 40, the second controller 60, the data driving circuit 70, and the gate driving circuit 80 may be configured by one semiconductor IC or a plurality of semiconductor ICs. Also, some or all of the first controller 40, the second controller 60, the data driving circuit 70, and the gate driving circuit 80 may be configured as one semiconductor IC or one body or a single body.

The sound apparatus 1 according to an aspect of the present disclosure may be a display apparatus which displays an image and simultaneously generates a sound, based on an image signal (for example, RGB data), a sound signal, and a timing signal (for example, a vertical synchronization signal, a horizontal synchronization signal, a data enable signal, etc.) supplied from the host system 2. The display panel 90 may include an image display surface for displaying an image and a rear surface which is opposite to the image display surface. The piezoelectric device 10 may be connected to a rear surface of the display panel 90 through the elastic member 30. Therefore, the display panel 90 may include an image display function and a function of the first vibration member. Accordingly, in an aspect of the present disclosure, the sound apparatus 1 having an acoustic effect where a sound is output from an image displayed by the display panel 90 may be provided.

Eighth Aspect

In an aspect of the present disclosure, a modification example of the arrangement of a piezoelectric device 10 according to a first aspect of the present disclosure will be described. A basic configuration of a sound apparatus 1 and a structure of a piezoelectric device 10 may be the same as the first aspect of the present disclosure, and thus, their repetitive descriptions may be omitted.

Figure 19:
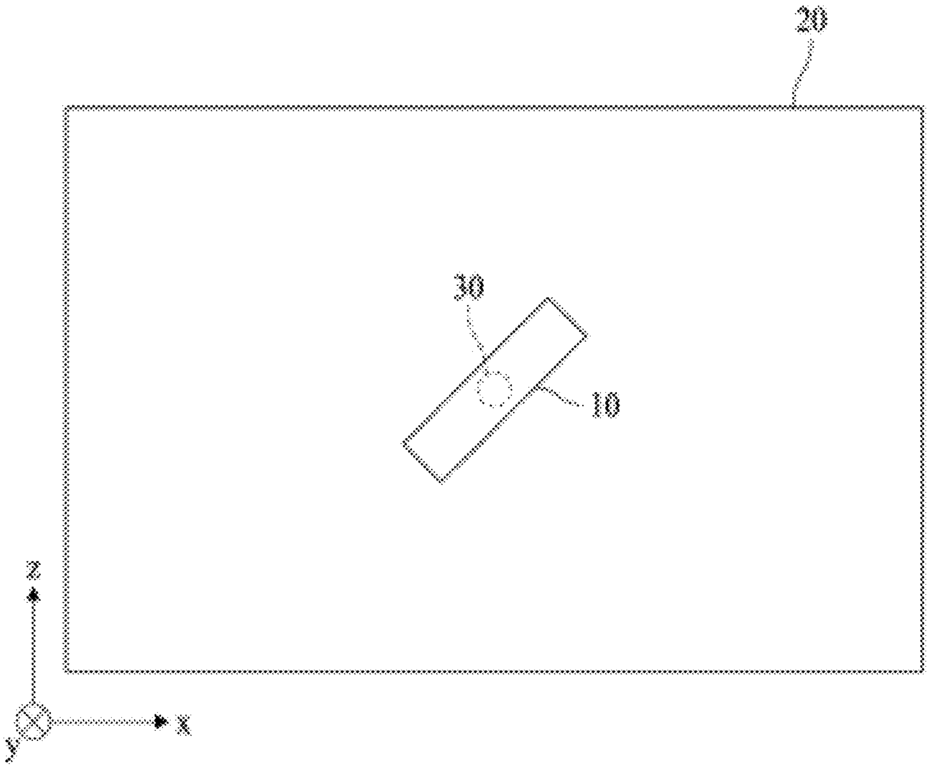
FIG. 19 is a plan view illustrating a configuration of a piezoelectric device according to an eighth aspect of the present disclosure.

FIG. 19 is a plan view illustrating a configuration of the piezoelectric device according to the first aspect of the present disclosure. As illustrated in FIG. 19, in an aspect of the present disclosure, the piezoelectric device 10 may be disposed so that a long-side direction of the piezoelectric device 10 is not perpendicular to any one lateral side of a first vibration member 20. For example, the long-side direction of the piezoelectric device 10 may be disposed in a diagonal direction between an x direction (or a second direction) and a z direction, but aspects of the present disclosure are not limited thereto.

When a shape of the piezoelectric device 10 is a rectangular shape, in a distribution of vibrations generated by the first vibration member 20, a vibration traveling in the long-side direction of the piezoelectric device 10 may be a main vibration. As in the first aspect of the present disclosure, when the long-side direction of the piezoelectric device 10 is perpendicular to a lateral side of the first vibration member 20, a vibration generated by the piezoelectric device 10 and a vibration reflected from the end portion of the first vibration member 20 may be reinforced, and thus, may cause resonance. On the other hand, in an aspect of the present disclosure, the long-side direction of the piezoelectric device 10 may not be perpendicular to the lateral side of the first vibration member 20, and thus, resonance caused by the factor may be difficult to occur, thereby decreasing noise.

Moreover, in a configuration according to the first aspect of the present disclosure, a vibration may be reinforced, and thus, based thereon, a sound pressure level may be enhanced and a frequency characteristic may be adjusted. Accordingly, as in the first aspect of the present disclosure, the long-side direction of the piezoelectric device 10 may be perpendicular to the lateral side of the first vibration member 20 based on a design condition such as a desired characteristic and a design limitation.

Ninth Aspect

In an aspect of the present disclosure, a modification example of a cross-sectional structure of the piezoelectric device 10 according to the first aspect of the present disclosure will be described. A basic configuration of a sound apparatus 1 and a structure of a piezoelectric device 10 may be the same as the first aspect of the present disclosure, and thus, their repetitive descriptions may be omitted.

Figure 20:
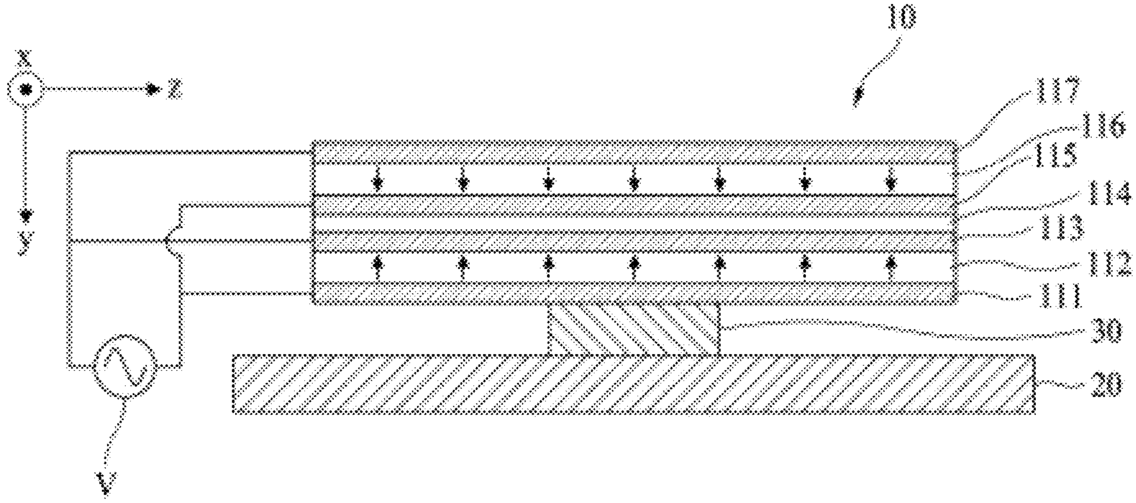
FIG. 20 is a cross-sectional view illustrating a structure of a piezoelectric device according to a ninth aspect of the present disclosure.

FIG. 20 is a cross-sectional view illustrating a structure of a piezoelectric device according to a ninth aspect of the present disclosure. A position of a cross-sectional surface may be the same as FIGS. 3 and 4.

The piezoelectric device 10 may include a plurality of electrodes 111, 113, 115, and 117, a plurality of piezoelectric layers 112 and 116, and an insulation layer 114. The electrode 111 (or a first electrode) disposed at a portion close to a first vibration member 20 may be coupled or connected to an elastic member 30. The electrode 111 and the electrode 113 (or a second electrode) may be disposed to insert a piezoelectric layer 112 (or a first piezoelectric layer) in a thickness direction thereof (or a y direction). For example, the piezoelectric layer 112 may be interposed between the electrode 111 and the electrode 113. The electrode 115 (or a third electrode) and the electrode 117 (or a fourth electrode) may be disposed to insert a piezoelectric layer 116 (or a second piezoelectric layer) in the thickness direction. For example, the piezoelectric layer 116 may be interposed between the electrode 115 and the electrode 117. The insulation layer 114 may be disposed between the electrode 113 and the electrode 115. The insulation layer 114 may be a layer which secures electrical insulating properties between the electrode 113 and the electrode 115. Arrows illustrated in the piezoelectric layers 112 and 116 may represent polarization directions of the piezoelectric layers 112 and 116. For example, the polarization directions of the piezoelectric layers 112 and 116 may be opposite direction.

One terminal of an AC power source V representing a voltage based on a sound signal may be coupled or connected to the electrodes 111 and 115, and the other terminal thereof may be coupled or connected to the electrodes 113 and 117. In other words, voltages having the same phase may be applied to the electrode 111 and the electrode 115. A voltage having a phase (or a reverse phase) opposite to a phase of a voltage applied to the electrode 111 and the electrode 115 may be applied to the electrode 113 and the electrode 117. Accordingly, voltages having the same direction (or same phase) may be applied to the piezoelectric layer 112 and the piezoelectric layer 116.

In an aspect of the present disclosure, when one side of two piezoelectric layers contracts in a horizontal direction, other side of two piezoelectric layers expands in a horizontal direction, and thus, a bending vibration having the same form as the first aspect may be generated. A bending vibration may be a flexural vibration or winding vibration, embodiments of the present disclosure are not limited thereto. Therefore, in an aspect of the present disclosure, the same effect as the first aspect of the present disclosure may be obtained. As described above, a structure of the piezoelectric layers and the electrodes among the piezoelectric device 10 is not limited to the first aspect of the present disclosure and may be variously applied.

For example, the piezoelectric device 10 may be a structure referred to as unimorph where a piezoelectric layer provided as one layer, a pair of electrodes with the piezoelectric layer therebetween, and a vibration plate are stacked. However, as illustrated in FIG. 4 or 20, a bimorph structure may be applied for enhancing the conversion efficiency of displacement and a voltage.

Tenth Aspect

In an aspect of the present disclosure, a modification example of a structure of the piezoelectric device 10 according to the first aspect of the present disclosure will be described. A basic configuration of a sound apparatus 1 may be the same as the first aspect of the present disclosure, and thus, its description is omitted.

Figure 21:
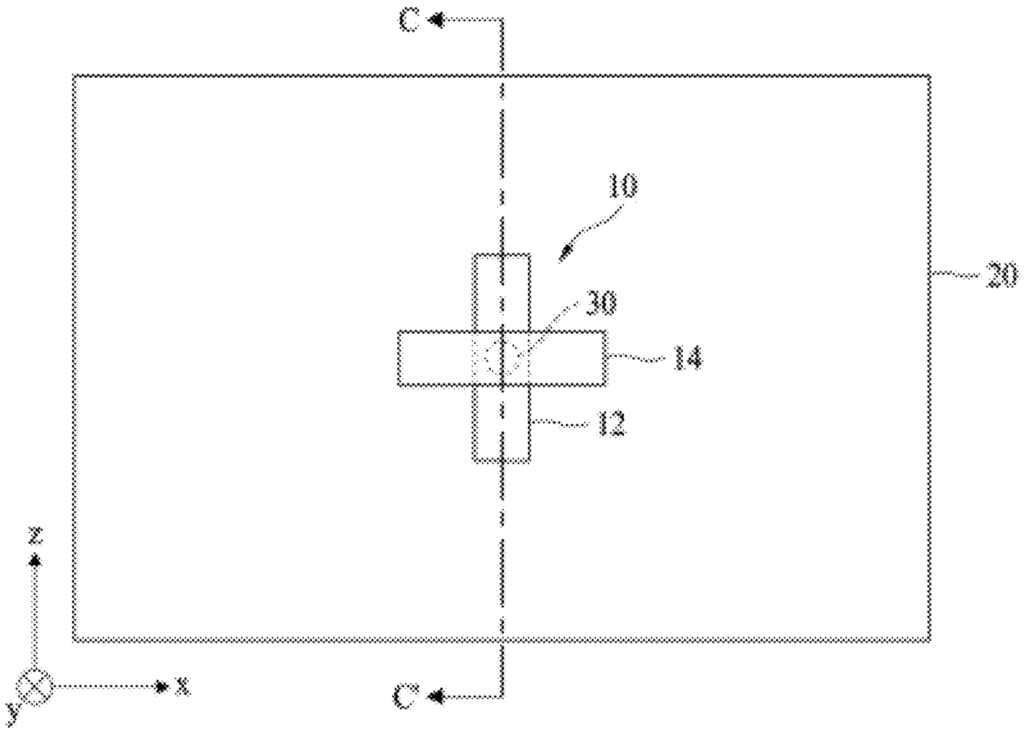
FIG. 21 is a plan view illustrating a configuration of a piezoelectric device according to a tenth aspect of the present disclosure.
Figure 22:
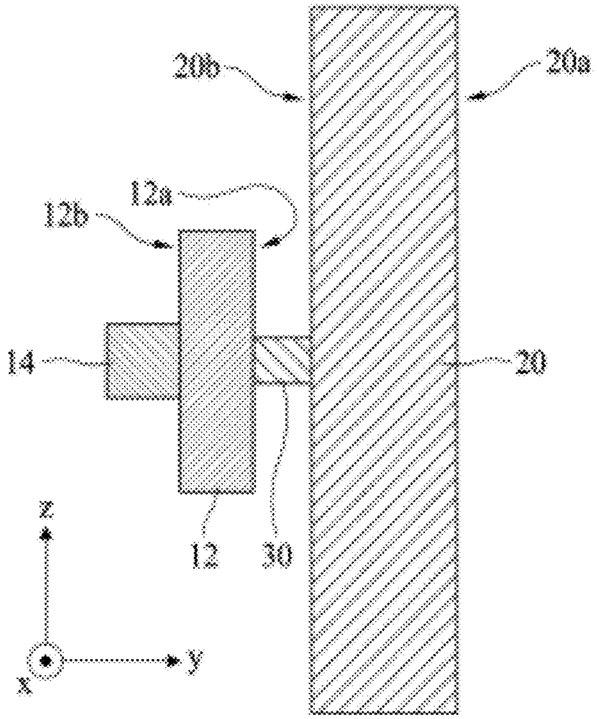
FIG. 22 is a cross-sectional view illustrating a configuration of a piezoelectric device according to a tenth aspect of the present disclosure.

FIG. 21 is a plan view illustrating a configuration of a piezoelectric device according to a tenth aspect of the present disclosure. FIG. 22 is a cross-sectional view illustrating a configuration of the piezoelectric device according to the tenth aspect of the present disclosure. FIG. 22 illustrates a cross-sectional surface taken along line C-C' of FIG. 21. The arrangement of the piezoelectric device 10 will be described below with reference to FIGS. 21 and 22.

As illustrated in FIG. 21, the piezoelectric device 10 according to an aspect of the present disclosure may include a first vibration portion 12 and a second vibration portion 14, which extend in different directions in a plan view. A configuration of the first vibration portion 12 may be the same as that of the piezoelectric device 10 according to the first aspect of the present disclosure. For example, the first vibration portion 12 may have a rectangular shape which has a long-side direction (a z direction in the drawing) and a short-side direction (an x direction in the drawing) in a plan view. The second vibration portion 14 may extend in a direction which differs from the first vibration portion 12. For example, the second vibration portion 14 may have a rectangular shape which has a long-side direction (the x direction in the drawing) and a short-side direction (the z direction in the drawing) in a plan view. The long-side direction of the first vibration portion 12 may be perpendicular to the long-side direction of the second vibration portion 14. Also, all of the long-side direction of the first vibration portion 12 and the long-side direction of the second vibration portion 14 may be disposed to be perpendicular to a lateral side of a first vibration member 20. For example, the first vibration portion 12 and the second vibration portion 14 may be disposed in a +-shape in a plan view, but aspects of the present disclosure are not limited thereto.

As illustrated in FIG. 22, the first vibration portion 12 may include a first front surface 12*a* and a second front surface 12*b*. An elastic member 30 may connect the first front surface 12*a* of the first vibration portion 12 to a rear surface 20*b* of a first vibration member 20. The elastic member 30 may be coupled or connected to only a portion of the first front surface 12*a* of the first vibration portion 12. For example, the first front surface 12*a* of the first vibration portion 12 may be a surface facing the rear surface 20*b* of the first vibration member 20 and may be a first surface, an upper surface, or a top surface. For example, the second front surface 12*b* of the first vibration portion 12 may be a surface opposite to the first front surface 12*a* of the first vibration member 20 and may be a second surface, a rear surface, or a bottom surface. As described above, the piezoelectric device 10 and the elastic member 30 may be disposed on the rear surface 20*b* of the first vibration member 20 so that obstruction does not occur while a user is watching content attached on a sound source surface 20*a*.

The second vibration portion 14 may be coupled or connected to only a portion of the second front surface 12*b* of the first vibration portion 12. Therefore, both end portions of the first vibration portion 12 in a long-side direction thereof may be lifted, and both end portions of the second vibration portion 14 in a long-side direction thereof may be lifted. When both end portions of the piezoelectric device 10 in a long-side direction thereof are lifted, it may be difficult to suppress the vibration of the piezoelectric device 10 at the both end portions, where a displacement of a bending vibration is large, of the piezoelectric device 10 in the long-side direction thereof. A bending vibration may be a flexural vibration or winding vibration, embodiments of the present disclosure are not limited thereto.

Figure 23:
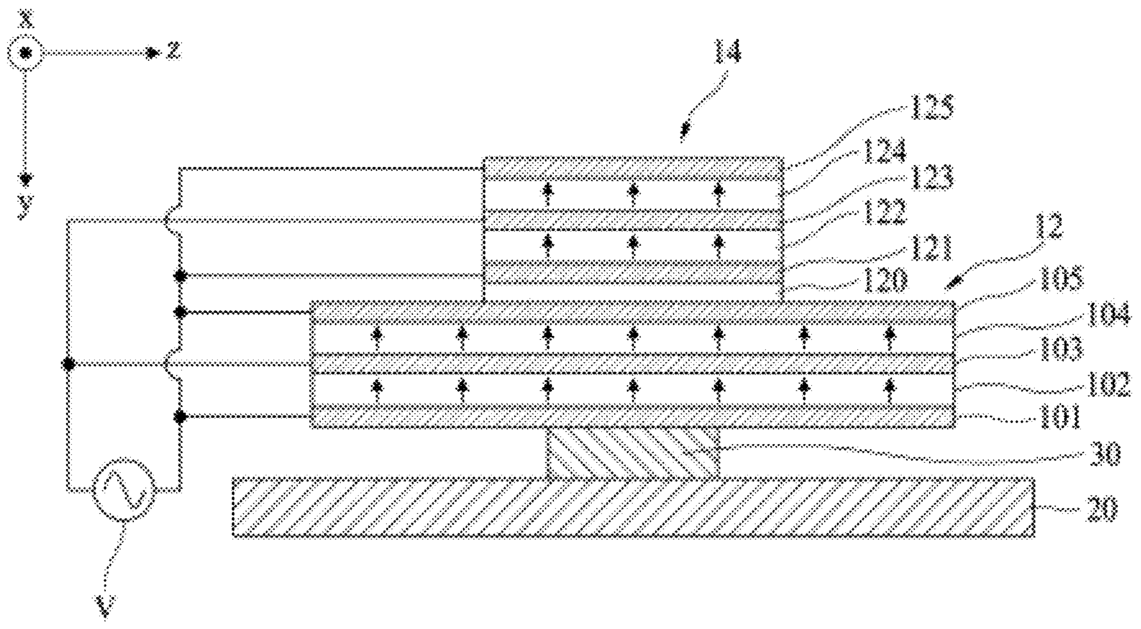
FIG. 23 is a cross-sectional view illustrating a structure of a piezoelectric device according to a tenth aspect of the present disclosure.

FIG. 23 is a cross-sectional view illustrating a structure of the piezoelectric device according to the tenth aspect of the present disclosure. FIG. 23 has a direction which differs from FIG. 22, and like FIG. 22, FIG. 23 illustrates a cross-sectional view taken along line C-C' of FIG. 21. Also, in FIG. 23, a connection relationship of the electrode of the piezoelectric device 10 is schematically illustrated for describing a sound signal input method of the piezoelectric device 10.

The piezoelectric device 10 illustrated in FIG. 23 may include a structure where two bimorphs are stacked. The piezoelectric device 10 may include the first vibration portion 12 and the second vibration portion 14. A structure of the first vibration portion 12 may be the same as the piezoelectric device 10 according to the first aspect of the present disclosure. In FIG. 23, an insulation layer 120 may be disposed between the first vibration portion 12 and the second vibration portion 14, but this may not be essential.

The second vibration portion 14 may include a plurality of electrodes 121, 123, and 125 and a plurality of piezoelectric layers 122 and 124. The electrode 121 disposed closest to the first vibration portion 12 may be coupled or connected to the insulation layer 120. The electrode 121 and the electrode 123 may be disposed to insert a piezoelectric layer 122 in a thickness direction thereof. For example, the piezoelectric layer 122 may be interposed between the electrode 121 and the electrode 123. The electrode 123 and the electrode 125 may be disposed to insert the piezoelectric layer 124 in a thickness direction thereof. For example, the piezoelectric layer 124 may be interposed between the electrode 123 and the electrode 125. Arrows illustrated in the piezoelectric layers 122 and 124 may represent polarization directions of the piezoelectric layers 122 and 124. For example, the polarization directions of the piezoelectric layers 122 and 124 may be the same.

One terminal of an AC power source V representing a voltage based on a sound signal may be coupled or connected to the electrodes 101, 105, 121, and 125, and the other terminal thereof may be coupled or connected to the electrodes 103 and 123. In other words, voltages having the same phase may be applied to the electrodes 101, 105, 121, and 125. A voltage having a phase (or a reverse phase) opposite to a phase of a voltage applied to the electrodes 101, 105, 121, and 125 may be applied to the electrodes 103 and 123. Accordingly, voltages having the same direction (or same phase) may be applied to the piezoelectric layers 102, 104, 122, and 124.

In any one of the first vibration portion 12 and the second vibration portion 14, when one side of the two piezoelectric layers contracts in a horizontal direction, the other side thereof may expand in the horizontal direction. Therefore, a bending vibration having the same form as the first aspect may be generated in at least one of the first vibration portion 12 and the second vibration portion 14. For example, any one of the first vibration portion 12 and the second vibration portion 14 may vibrate in a thickness direction thereof. Also, a polarization direction and a direction of a voltage may be as described above, and thus, the first vibration portion 12 and the second vibration portion 14 may vibrate in the same phase (or same direction) in response to a sound signal. Accordingly, a vibration generated by the first vibration portion 12 and a vibration generated by the second vibration portion 14 may be reinforced, and thus, vibration efficiency may be enhanced.

According to an aspect of the present disclosure, like the first aspect of the present disclosure, a sound pressure level of a sound generated by the first vibration member 20 may be enhanced, and thus, the sound apparatus 1 for enhancing sound quality may be provided. Also, the piezoelectric device 10 according to an aspect of the present disclosure may use two vibration portions, and thus, a sound pressure level may be more enhanced than that from a configuration according to the first aspect including only one vibration portion.

Moreover, in the first aspect of the present disclosure, a distribution of vibrations by one vibration portion may concentrate in a long-side direction of the piezoelectric device 10, for example, one-dimensionally. Therefore, a resonance of the first vibration member 20 may be easy to occur, and due to this, noise caused by the resonance may increase. On the other hand, in an aspect of the present disclosure, the piezoelectric device 10 may include the first vibration portion 12 and the second vibration portion 14 extending in different directions, and thus, a distribution of vibrations may be two-dimensionally and may be difficult to concentrate on a specific portion. Therefore, a resonance of the first vibration member 20 may be difficult to occur. Accordingly, in an aspect of the present disclosure, noise caused by the resonance of the first vibration member 20 may be reduced, and thus, the sound apparatus 1 with more enhanced sound quality may be provided.

Eleventh Aspect

In an aspect of the present disclosure, a modification example of a structure of the piezoelectric device 10 according to the first aspect of the present disclosure will be described. A basic configuration of a sound apparatus 1 may be the same as the first aspect of the present disclosure, and thus, their repetitive descriptions may be omitted.

Figure 24:
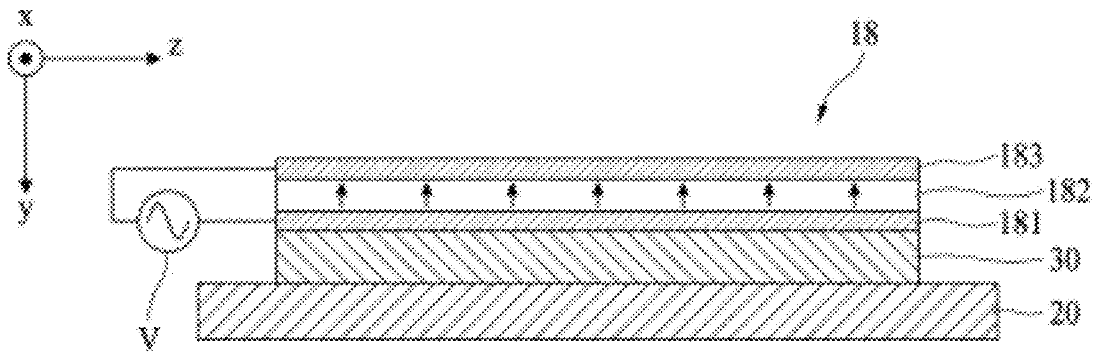
FIG. 24 is a cross-sectional view illustrating a configuration of a piezoelectric device according to an eleventh aspect of the present disclosure.

FIG. 24 is a cross-sectional view illustrating a configuration of a piezoelectric device according to an eleventh aspect of the present disclosure. As illustrated in FIG. 24, in an aspect of the present disclosure, the piezoelectric device 18 may be provided instead of the piezoelectric device 10. The piezoelectric device 18 illustrated in FIG. 24 may include a plurality of electrodes 181 and 183 and a piezoelectric layer 182. The electrode 181 disposed closest to the first vibration member 20 may be coupled or connected to an elastic member so that an end portion of the electrode 181 does not protrude from both end portions of the elastic member 30. In other words, a whole surface of one side of the electrode 181 may be coupled or connected to the elastic member 30. The electrode 181 and the electrode 183 may be disposed to insert a piezoelectric layer 182 in a thickness direction thereof. For example, the piezoelectric layer 182 may be interposed between the electrode 181 and the electrode 183. Arrows illustrated in the piezoelectric layer 182 may represent a polarization direction of the piezoelectric layer 182. Also, lines for applying a voltage to the electrode may be coupled or connected to the electrodes 181 and 183 through soldering, or the like.

One terminal of an AC power source V representing a voltage based on a sound signal may be coupled or connected to the electrode 181, and the other terminal thereof may be coupled or connected to the electrode 183.

The piezoelectric device 18 may vibrate in different vibration forms based on a device structure, a phase of an AC voltage applied thereto, and a material of a piezoelectric device. Also, a vibration frequency band of the piezoelectric device 18 may vary based on a vibration form (or a vibration shape). As voltages are applied to the electrodes 181 and 183, the piezoelectric device 18 may vibrate in a direction expanding in a horizontal direction or expanding in a direction of a front surface. Therefore, the piezoelectric device 18 may have a vibration form of a higher frequency than a bending vibration (or flexural vibration or winding vibration). Accordingly, in an aspect of the present disclosure, a sound apparatus 1 suitable for a sound having a higher frequency than the first aspect may be provided.

In an aspect of the present disclosure, unlike the first aspect of the present disclosure, a whole surface of a front surface of the piezoelectric device 18 may be coupled or connected to a rear surface 20*a* of a first vibration member 20 by the elastic member 30, and thus, an end portion of the piezoelectric device 18 may not be lifted (or detached). As described above, the elastic member 30 may be connected thereto so that the end portion of the piezoelectric device 18 is not lifted (or detached), and thus, when the piezoelectric device 18 vibrates in a vibration form of a higher frequency which differs from a bending vibration (or flexural vibration or winding vibration), a vibration of the piezoelectric device 18 may be efficiently transferred to the first vibration member 20. Accordingly, in an aspect of the present disclosure, a sound apparatus 1 where a sound pressure level of a high-pitched sound band is more enhanced than the first aspect may be provided. Also, it may not be essential that a whole surface of one side of the electrode 181 is connected to the elastic member 30, and only a portion thereof may be coupled or connected to the elastic member 30. A sound characteristic of the sound apparatus 1 may depend on a connected portion or a connected area, and thus, by modifying a design thereof, a sound characteristic may be appropriately adjusted.

Twelfth Aspect

In an aspect of the present disclosure, a modification example of a structure of the piezoelectric device 10 according to the tenth aspect of the present disclosure will be described. A basic configuration of a sound apparatus 1 and a structure of the piezoelectric device 10 may be the same as the tenth aspect of the present disclosure, and thus, its description is omitted.

Figure 25:
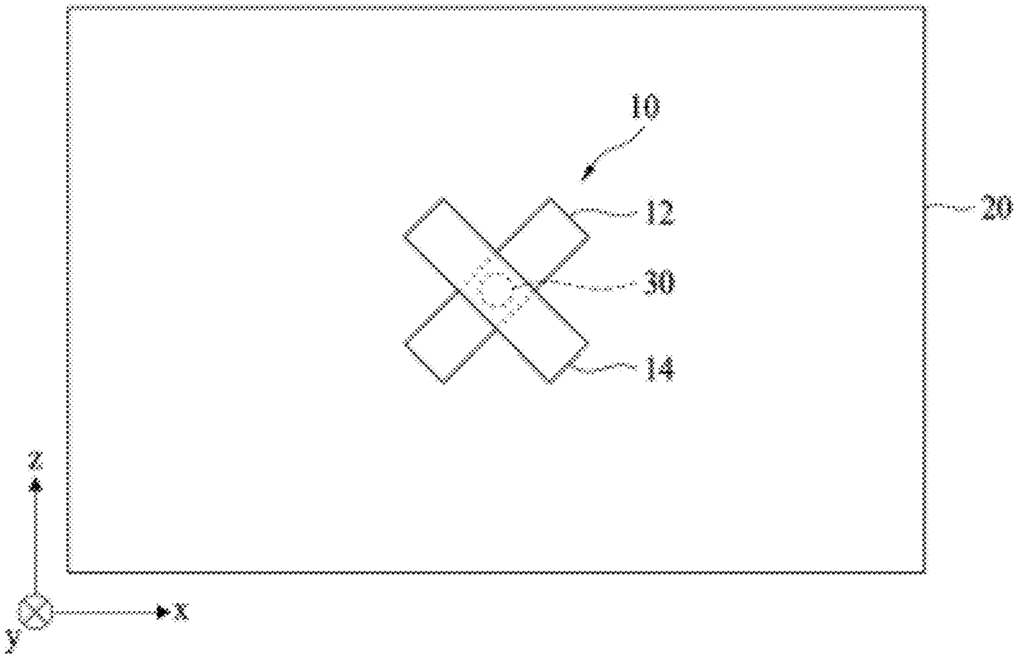
FIG. 25 is a plan view illustrating a configuration of a piezoelectric device according to a twelfth aspect of the present disclosure.

FIG. 25 is a plan view illustrating a configuration of a piezoelectric device according to a twelfth aspect of the present disclosure. As illustrated in FIG. 25, in an aspect of the present disclosure, the piezoelectric device 10 may be disposed so that a long-side direction of either of a first vibration portion 12 and a second vibration portion 14 is not perpendicular to any one lateral side of a first vibration member 20. For example, the first vibration portion 12 and the second vibration portion 14 may be disposed in an X-shape in a plan view, but aspects of the present disclosure are not limited thereto.

As described above in the eighth aspect of the present disclosure, a vibration generated by the first vibration portion 12 and the second vibration portion 14 and a vibration reflected from an end portion of the first vibration member 20 may be reinforced, and thus, may cause resonance. The resonance may be a cause of noise. On the other hand, in an aspect of the present disclosure, a long-side direction of the piezoelectric device 10 may not be perpendicular to any lateral side of the first vibration member 20, and thus, resonance caused by the factor may be difficult to occur, thereby decreasing noise.

Accordingly, according to an aspect of the present disclosure, a sound apparatus 1 having the same effect as the tenth aspect of the present disclosure may be provided, and noise caused by resonance occurring due to reflection by a lateral side of the first vibration member 20 may be reduced, and thus, the sound apparatus 1 with enhanced sound quality may be provided.

Moreover, in a configuration according to the tenth aspect of the present disclosure, a vibration may be reinforced, and thus, based thereon, a sound pressure level may be enhanced and a frequency characteristic may be adjustable. Accordingly, as in the tenth aspect of the present disclosure, the long-side direction of the piezoelectric device 10 may be perpendicular to the end portion of the first vibration member 20 based on a design condition such as a desired characteristic and a design limitation.

Thirteenth Aspect

In an aspect of the present disclosure, a modification example of a structure of the piezoelectric device 10 according to the tenth aspect of the present disclosure will be described. A basic configuration of a sound apparatus 1 may be the same as the tenth aspect of the present disclosure, and thus, its description is omitted.

Figure 26:
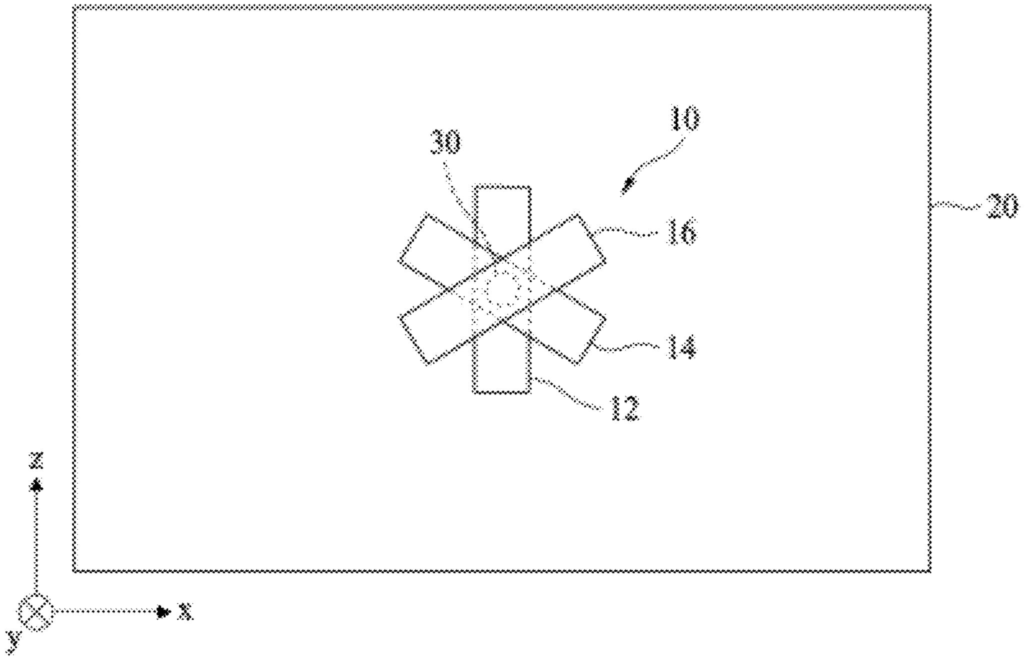
FIG. 26 is a plan view illustrating a configuration of a piezoelectric device according to a thirteenth aspect of the present disclosure.

FIG. 26 is a plan view illustrating a configuration of a piezoelectric device according to a thirteenth aspect of the present disclosure. As illustrated in FIG. 26, the piezoelectric device 10 according to an aspect of the present disclosure may include a first vibration portion 12, a second vibration portion 14, and a third vibration portion 16, which extend in different directions in a plan view. A cross-sectional structure of the piezoelectric device 10 may be implemented by adding a piezoelectric layer and an electrode, corresponding to the third vibration portion 16, to a structure illustrated in FIG. 23 to increase the number of layers, and thus, their repetitive descriptions may be omitted. For example, the first vibration portion 12, the second vibration portion 14, and the third vibration portion 16 may be arranged in a *-shape in a plan view, but aspects of the present disclosure are not limited thereto.

In an aspect of the present disclosure, like the first aspect of the present disclosure, a sound apparatus 1 for enhancing a sound pressure level of a sound generated by a first vibration member 20 may be provided. Also, because the piezoelectric device 10 according to an aspect of the present disclosure use three vibration portions, a sound pressure level may be more enhanced than that from a configuration according to the tenth aspect where two vibration portions are provided. As described above, the number of vibration portions is not limited to one or two, and the piezoelectric device 10 may include three or more vibration portions arranged to cross each other in different directions. As the number of vibration portions of the piezoelectric device 10 increases, a sound pressure level may be enhanced.

Moreover, in an aspect of the present disclosure, a distribution of vibrations may be more uniform in two-dimensionally than that from a configuration according to the tenth aspect. Therefore, a resonance of the first vibration member 20 may be more difficult to occur. Accordingly, according to an aspect of the present disclosure, noise caused by the resonance of the first vibration member 20 may be more reduced, and thus, the sound apparatus 1 with enhanced sound quality may be provided.

Fourteenth Aspect

In an aspect of the present disclosure, a modification example of a structure of the piezoelectric device 10 according to the first aspect of the present disclosure will be described. A basic configuration of a sound apparatus 1 may be the same as the first aspect of the present disclosure, and thus, its description is omitted.

Figure 27:
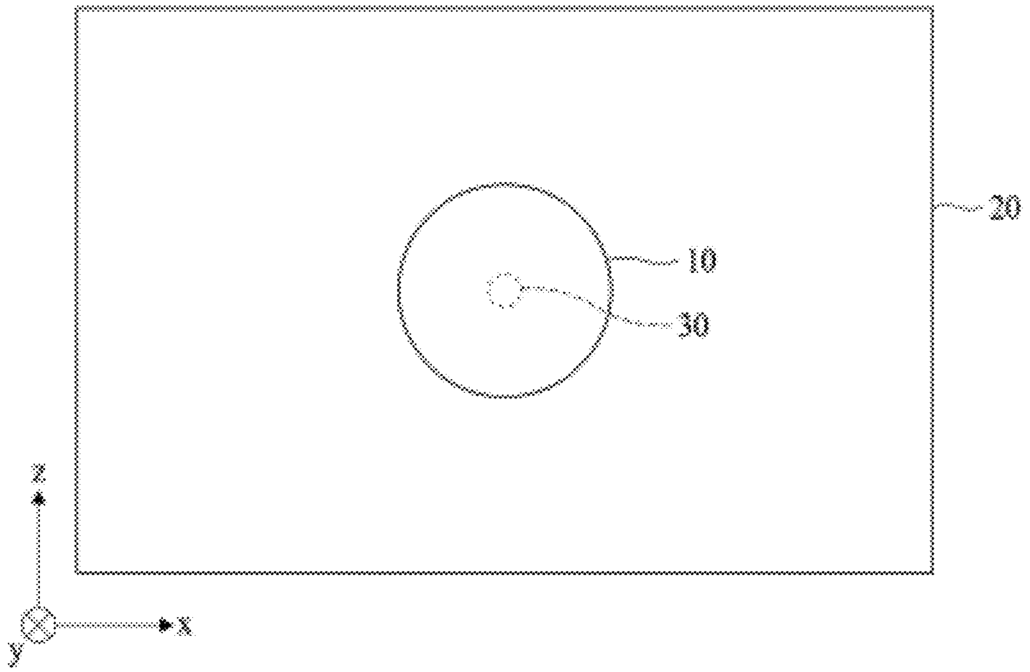
FIG. 27 is a plan view illustrating a configuration of a piezoelectric device according to a fourteenth aspect of the present disclosure.

FIG. 27 is a plan view illustrating a configuration of a piezoelectric device according to a fourteenth aspect of the present disclosure. The piezoelectric device 10 may include a flat plate shape. As illustrated in FIG. 27, the piezoelectric device 10 according to an aspect of the present disclosure may include a circular shape in a plan view. An elastic member 30 may be coupled or connected to a position including a center of a circular shape of the piezoelectric device 10. A cross-sectional structure of the piezoelectric device 10 may be the same as FIGS. 3 and 4, and thus, their repetitive descriptions may be omitted.

According to an aspect of the present disclosure, like the first aspect of the present disclosure, a sound apparatus 1 for enhancing a sound pressure level of a sound generated by a first vibration member 20 may be provided.

Moreover, in an aspect of the present disclosure, because the piezoelectric device 10 is circular, a distribution of vibrations may be uniform in two-dimensionally. Therefore, for the same reason as the tenth aspect of the present disclosure, a resonance of the first vibration member 20 may be difficult to occur. Accordingly, according to an aspect of the present disclosure, noise caused by the resonance of the first vibration member 20 may be reduced, and thus, the sound apparatus 1 with enhanced sound quality may be provided.

Fifteenth Aspect

In an aspect of the present disclosure, a modification example of a structure of the piezoelectric device 10 according to the first aspect of the present disclosure will be described. A basic configuration of a sound apparatus 1 may be the same as the first aspect of the present disclosure, and thus, their repetitive descriptions may be omitted.

Figure 28A:
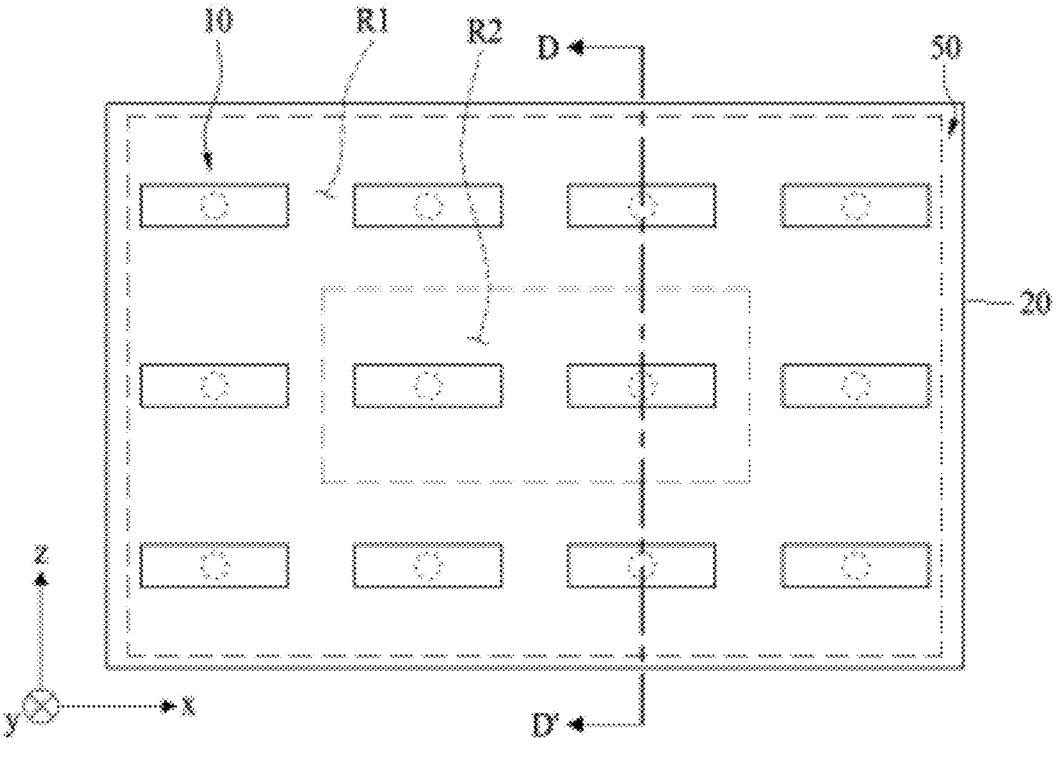
FIG. 28A is a plan view illustrating the arrangement of a piezoelectric device according to a fifteenth aspect of the present disclosure.
Figure 28B:
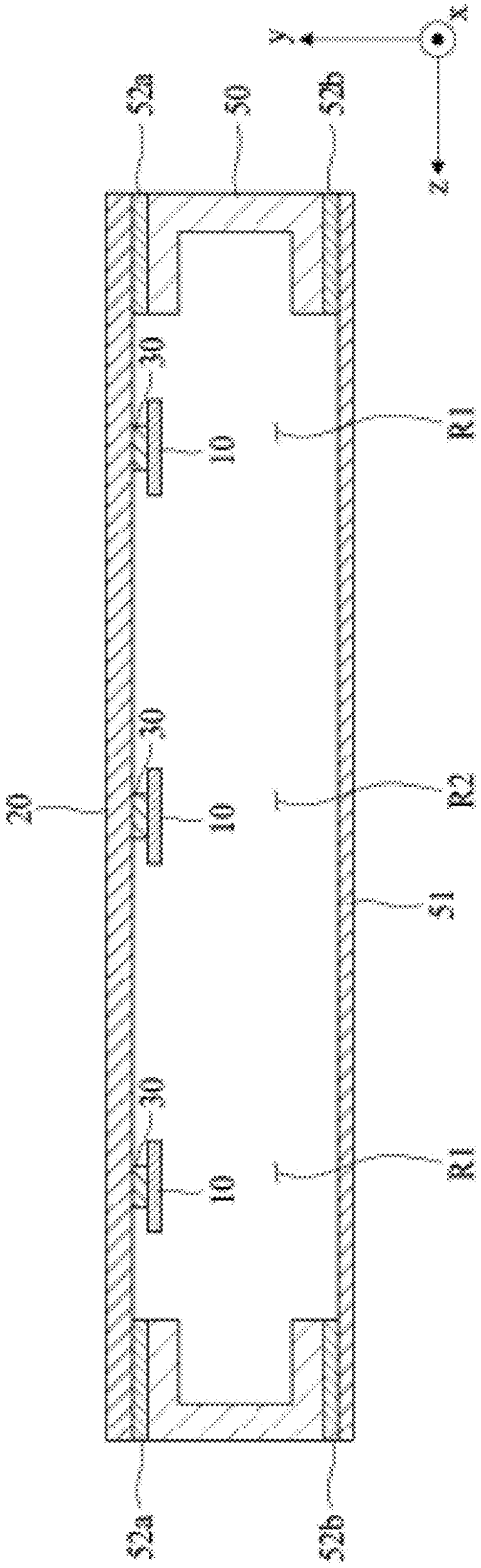
FIG. 28B is a cross-sectional view schematically illustrating the arrangement of a piezoelectric device according to a fifteenth aspect of the present disclosure.
Figure 28C:
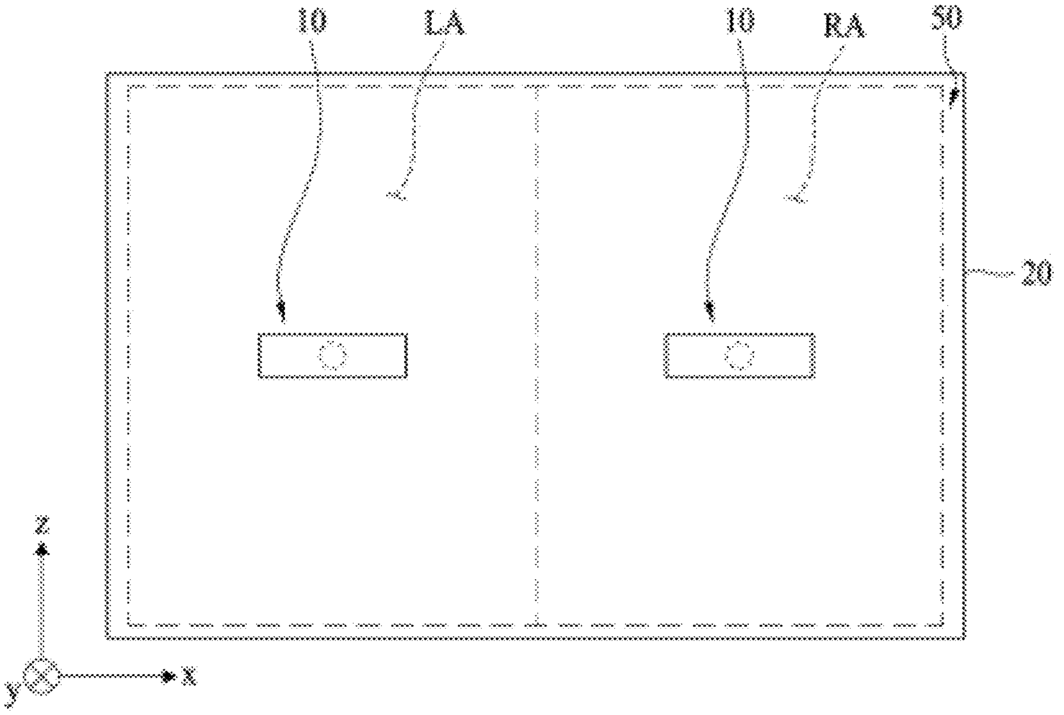
FIG. 28C is a plan view illustrating a first modification example of the arrangement of a piezoelectric device according to a fifteenth aspect of the present disclosure.
Figure 28D:
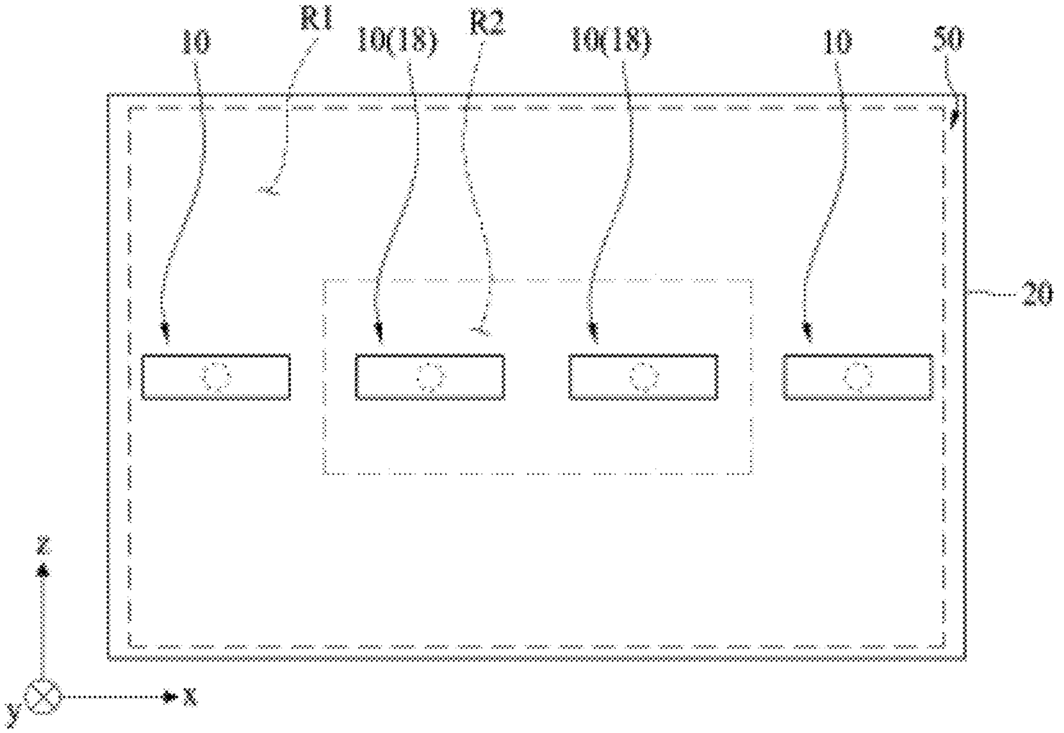
FIG. 28D is a plan view illustrating a second modification example of the arrangement of a piezoelectric device according to a fifteenth aspect of the present disclosure.
Figure 28E:
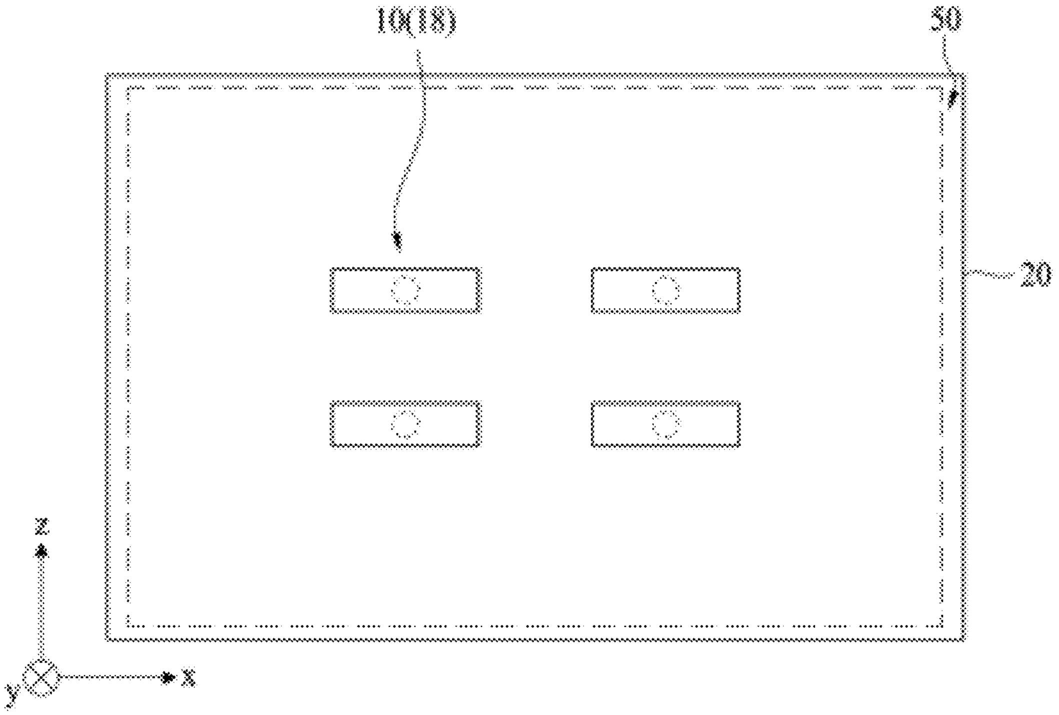
FIG. 28E is a plan view illustrating a third modification example of the arrangement of a piezoelectric device according to a fifteenth aspect of the present disclosure.

FIG. 28A is a plan view illustrating the arrangement of a piezoelectric device according to a fifteenth aspect of the present disclosure. FIG. 28B illustrates a cross-sectional surface taken along line D-D' of FIG. 28A. FIG. 28C is a plan view illustrating a first modification example of the arrangement of the piezoelectric device according to the fifteenth aspect of the present disclosure. FIG. 28D is a plan view illustrating a second modification example of the arrangement of the piezoelectric device according to the fifteenth aspect of the present disclosure. FIG. 28E is a plan view illustrating a third modification example of the arrangement of the piezoelectric device according to the fifteenth aspect of the present disclosure. As illustrated in FIGS. 28A to 28E, in an aspect of the present disclosure, a plurality of piezoelectric devices 10 may be disposed in a first vibration member 20. The plurality of piezoelectric devices 10 may be arranged in a matrix form or a matrix type in an x direction or/and a z direction. The piezoelectric device 10 illustrated in FIGS. 28A to 28D may be the same as the first aspect of the present disclosure, or may be the same as any one of the eighth to fourteenth aspects. The plurality of piezoelectric devices 10 and 18 may be disposed in the first vibration member 20, and thus, comparing with a case where one piezoelectric device is provided, a sound pressure level of a sound generated by the first vibration member 20 may be enhanced. For example, at least two or more piezoelectric devices 10 and 18 may be arrayed at one first vibration member 20 and may be simultaneously or individually driven, and thus, a sound may be improved. In FIG. 28B, three piezoelectric devices 10 may be disposed at one first vibration member 20, but three or more piezoelectric devices 10 and 18 may be arrayed and disposed at one first vibration member 20 and may be simultaneously or individually driven, thereby improving a sound.

As illustrated in FIG. 28A, a sound apparatus 1 according to an aspect of the present disclosure may include a plurality of piezoelectric devices 10 and 18 which are disposed at or connected to a rear surface of the first vibration member 20 to have a matrix form or a matrix type in the x direction and the z direction. For example, a plurality of piezoelectric devices 10 and 18 may be simultaneously or individually driven, thereby improving a sound.

As illustrated in FIG. 28C, a sound apparatus 1 according to another aspect of the present disclosure may include two piezoelectric devices 10 and 18 which are disposed at or connected to the rear surface of the first vibration member 20. For example, the two piezoelectric devices 10 and 18 may be disposed at or connected to a left rear region LA and a right rear region RA of the first vibration member 20 in parallel in the x direction. For example, the two piezoelectric devices 10 and 18 may be simultaneously or individually driven, thereby improving a sound.

As illustrated in FIG. 28D, a sound apparatus 1 according to another aspect of the present disclosure may include four piezoelectric devices 10 and 18 which are disposed at or connected to the rear surface of the first vibration member 20. For example, the four piezoelectric devices 10 and 18 may be disposed at or connected to the rear surface of the first vibration member 20 in parallel in the x direction to have a certain interval therebetween. For example, the four piezoelectric devices 10 and 18 may be simultaneously or individually driven, thereby improving a sound. For example, the four piezoelectric devices 10 and 18 may be vertically and individually or horizontally and individually driven, thereby improving a sound.

As illustrated in FIG. 28E, a sound apparatus 1 according to another aspect of the present disclosure may include four piezoelectric devices 10 and 18 which are disposed at or connected to the rear surface of the first vibration member 20. For example, the four piezoelectric devices 10 and 18 may be disposed at or connected to the rear surface of the first vibration member 20 in a matrix form or a matrix type to have a certain interval therebetween in parallel in the x direction. For example, the four piezoelectric devices 10 and 18 may be disposed close to a center portion of the rear surface of the first vibration member 20, but aspects of the present disclosure are not limited thereto. For example, the four piezoelectric devices 10 and 18 may be simultaneously or individually driven, thereby improving a sound. For example, the four piezoelectric devices 10 and 18 may be vertically and individually or horizontally and individually driven, thereby improving a sound.

As illustrated in FIGS. 28A and 28D, The first vibration member 20 may include a region R1 and a region R2. A frequency characteristic of a piezoelectric device (or a first piezoelectric device) 10 in the region R1 may differ from a frequency characteristic of a piezoelectric device (or a second piezoelectric device) 10 in the region R2. For example, it may be set that the frequency characteristic of the piezoelectric device 10 in the region R1 differs from the frequency characteristic of the piezoelectric device 10 in the region R2, and thus, a deviation of a frequency characteristic of a sound generated by the first vibration member 20 may be reduced. For example, the region R1 may be a first region or a periphery region, or may be a periphery region of the first vibration member 20. The region R2 may be a second region or a center region, or may be a center region of the first vibration member 20.

The piezoelectric device 10 may have a natural frequency based on a shape, or the like, and thus, may have a biased frequency characteristic where a sound pressure level of a specific frequency increases. When characteristics of all of the piezoelectric devices 10 of the first vibration member 20 are the same, deviations of frequency characteristics of the plurality of piezoelectric devices 10 may overlap, and due to this, all frequency characteristics of the first vibration member 20 may have a deviation. In an aspect of the present disclosure, as the frequency characteristic of the piezoelectric device 10 in the region R1 differs from the frequency characteristic of the piezoelectric device 10 in the region R2, the frequency characteristics of the piezoelectric devices 10 may be averaged, and thus, a deviation of a frequency characteristic caused by the factor may be reduced.

A deviation of the frequency characteristic of the piezoelectric device 10 may be caused by a natural frequency of the piezoelectric device 10. Therefore, it may be set that the natural frequency of the piezoelectric device 10 in the region R1 differs from the natural frequency of the piezoelectric device 10 in the region R2. For example, it may be set that the natural frequency of the piezoelectric device 10 in the region R2 is lower than the natural frequency of the piezoelectric device 10 in the region R1, and thus, the region R1 may act as a high sound generating region and the region R2 may act as a low sound generating region. Accordingly, a sound apparatus 1 for harmoniously generating a high-pitched sound band and a low-pitched sound band may be provided.

The natural frequency of the piezoelectric device 10 may depend on a shape or a material of the piezoelectric device 10. Therefore, it may be set that a shape or a sound speed of the piezoelectric device 10 in the region R1 differs from a shape or a sound speed of the piezoelectric device 10 in the region R2, and thus, the natural frequencies of the piezoelectric devices 10 may differ. Examples of the physical properties of a material affecting a sound speed among materials may be an elastic modulus and a density. Therefore, any one or more among a sound speed, an elastic modulus, and a density may include other materials. Also, when only a shape of the piezoelectric device 10 in the region R1 differs from a shape of the piezoelectric device 10 in the region R2, there may have the advantage that the materials may be used in common.

According to another aspect of the present disclosure, a connection structure (or a coupling structure) between the first vibration member 20 and the frame 50 illustrated in FIG. 28A may be changed to a connection structure (or a coupling structure) between the first vibration member 20 and the frame 50 illustrated in FIG. 10B. Also, a connection structure (or a coupling structure) between the frame 50 and the back cover 51 illustrated in FIG. 28A may be changed to a connection structure (or a coupling structure) between the frame 50 and the back cover 51 illustrated in FIG. 10B.

As described above, according to an aspect of the present disclosure, a deviation of a frequency characteristic of a sound generated by the first vibration member 20 may be reduced, thereby providing a sound apparatus 1 for enhancing sound quality.

Sixteenth Aspect

In an aspect of the present disclosure, a modification example of a configuration of the sound apparatus 1 according to the fifteenth aspect of the present disclosure will be described. A structure and the like of a piezoelectric device 10 may be the same as the first aspect or one of the eighth to fourteenth aspects of the present disclosure, and thus, their repetitive descriptions may be omitted. A structure and the like of a first vibration member 20, an elastic member 30, a frame a back cover 51, and a plurality of adhesive members 52*a* and 52*b* may be the same as one of the second to sixth aspects of the present disclosure, and thus, their repetitive descriptions may be omitted.

Figure 29:
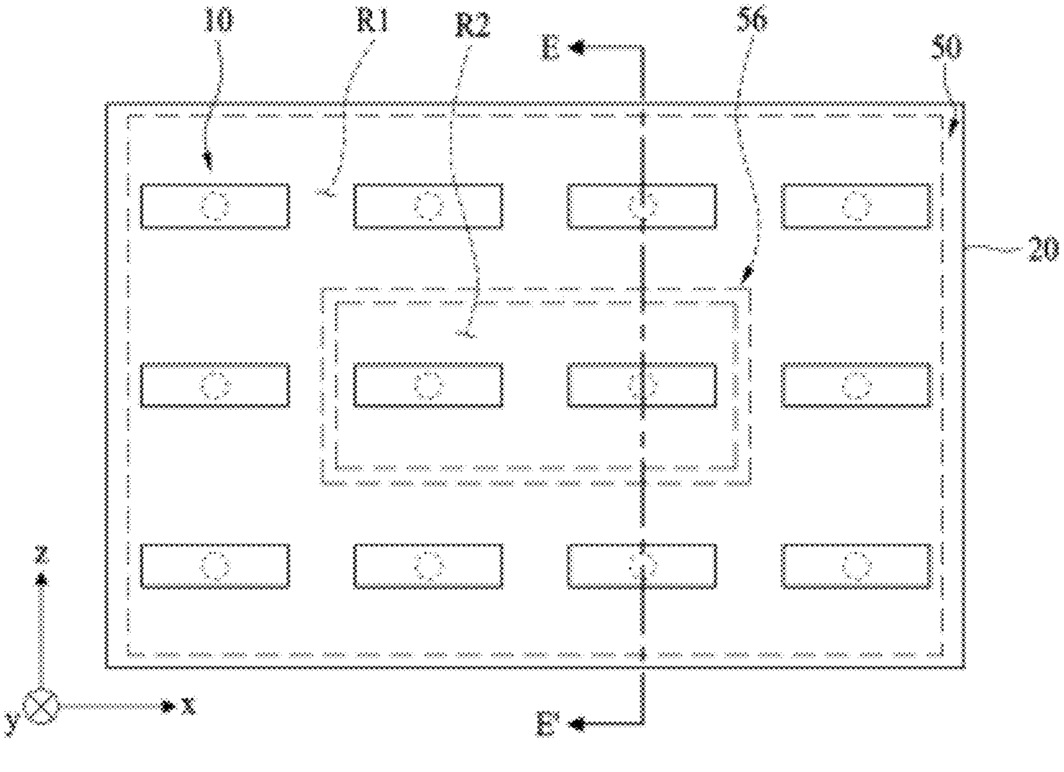
FIG. 29 is a plan view illustrating the arrangement of a piezoelectric device according to a sixteenth aspect of the present disclosure.
Figure 30:
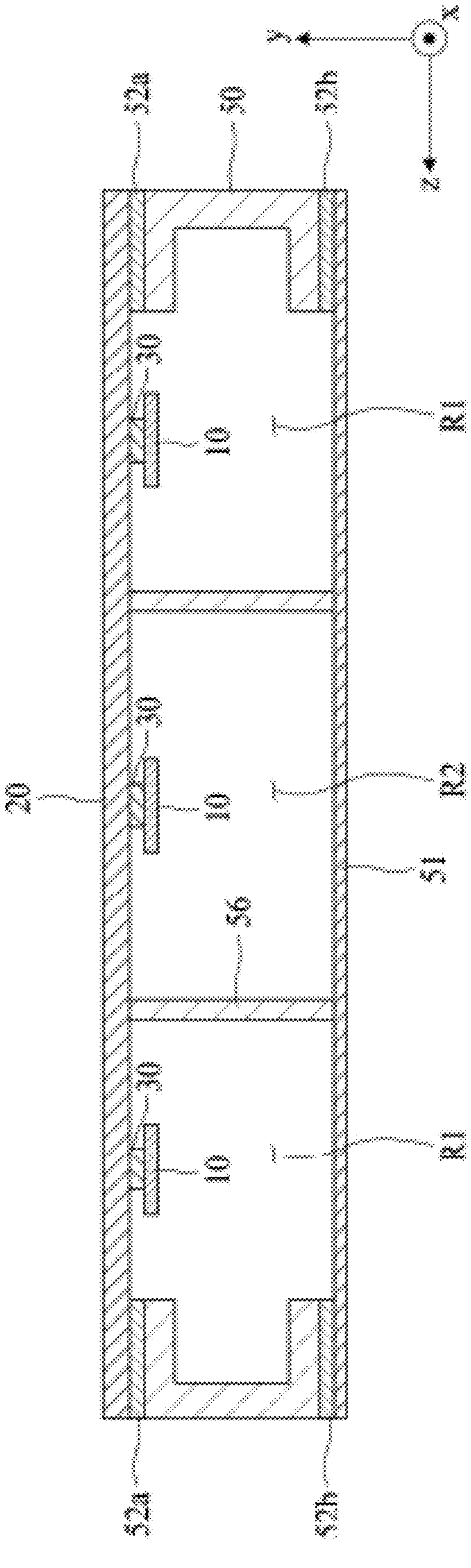
FIG. 30 is a cross-sectional view illustrating a configuration of a sound apparatus according to a sixteenth aspect of the present disclosure.

FIG. 29 is a plan view illustrating the arrangement of a piezoelectric device according to a sixteenth aspect of the present disclosure. FIG. 30 is a cross-sectional view illustrating a configuration of a sound apparatus according to the sixteenth aspect of the present disclosure. FIG. 30 illustrates a cross-sectional surface taken along line E-E' of FIG. 29. As illustrated in FIG. 30, the sound apparatus 1 may include a piezoelectric device 10, a first vibration member 20, an elastic member 30, a frame 50, a back cover 51, a plurality of adhesive members 52*a* and 52*b*, and an inner frame 56. The inner frame 56 may be a frame which divides an inner portion of a housing of the sound apparatus 1 into a plurality of regions. The inner frame 56 may be disposed to surround some piezoelectric devices 20. A material of the inner frame 56 may include, for example, a material such as metal or resin. However, a material of the inner frame 56 is not limited to a specific material. Also, a method of fixing the first vibration member 20 to the frame 50 is not limited to an attachment process according to an aspect of the present disclosure, and various methods such as a compression process using the compression member 53 as in the fourth aspect of the present disclosure may be applied.

As illustrated in FIG. 30, the inner frame 56 may be disposed between the first vibration member 20 and the back cover 51 in a cross-sectional view. For example, the inner frame 56 may be a supporting member, but aspects of the present disclosure are not limited thereto. Also, the inner frame 56 may be coupled or connected to both sides of the first vibration member 20 and the back cover 51 in a cross-sectional view. The sound apparatus 1 may include a space which is defined by the inner frame 56, the back cover 51, and the first vibration member 20. Accordingly, the inner frame 56 may divide an inner space of the housing of the sound apparatus 1. For example, the inner frame 56 may divide a space, defined by the back cover 51 and the first vibration member 20, into a region R1 and a region R2.

According to another aspect of the present disclosure, a connection structure (or a coupling structure) between the first vibration member 20 and the frame 50 illustrated in FIG. 30 may be changed to a connection structure (or a coupling structure) between the first vibration member 20 and the frame 50 illustrated in FIG. 10B, but aspects of the present disclosure are not limited thereto. Also, a connection structure (or a coupling structure) between the frame 50 and the back cover 51 illustrated in FIG. 30 may be changed to a connection structure (or a coupling structure) between the frame 50 and the back cover 51 illustrated in FIG. 10B, but aspects of the present disclosure are not limited thereto.

In an aspect of the present disclosure, a plurality of piezoelectric devices 10 may be respectively disposed in a plurality of different spaces, thereby providing a sound apparatus 1 where regions generate sounds of different channels or sounds having different frequency bands by applying AC voltages based on different sound signals to respective spaces.

Moreover, according to an aspect of the present disclosure, sizes of spaces divided by the inner frame 56 may be appropriately adjusted, and thus, the spaces may act as a resonance space, thereby enhancing sound quality. In the resonance space, a frequency for enhancing a sound pressure level may vary based on a size of a space. Accordingly, a plurality of resonance spaces having different sizes may be disposed, thereby providing a sound apparatus 1 where a sound characteristic is enhanced in a wider pitched sound band than a case where an inner space is not divided by the inner frame.

Seventeenth Aspect

In an aspect of the present disclosure, a modification example of a configuration of the sound apparatus 1 according to the fifteenth aspect of the present disclosure will be described. A structure and the like of a piezoelectric device 10 may be the same as the first aspect or one of the eighth to fourteenth aspects of the present disclosure, and thus, their repetitive descriptions may be omitted. A structure and the like of a first vibration member 20, an elastic member 30, a frame 50, a back cover 51, and a plurality of adhesive members 52*a* and 52*b* may be the same as one of the second to sixth aspects of the present disclosure, and thus, their repetitive descriptions may be omitted.

Figure 31:
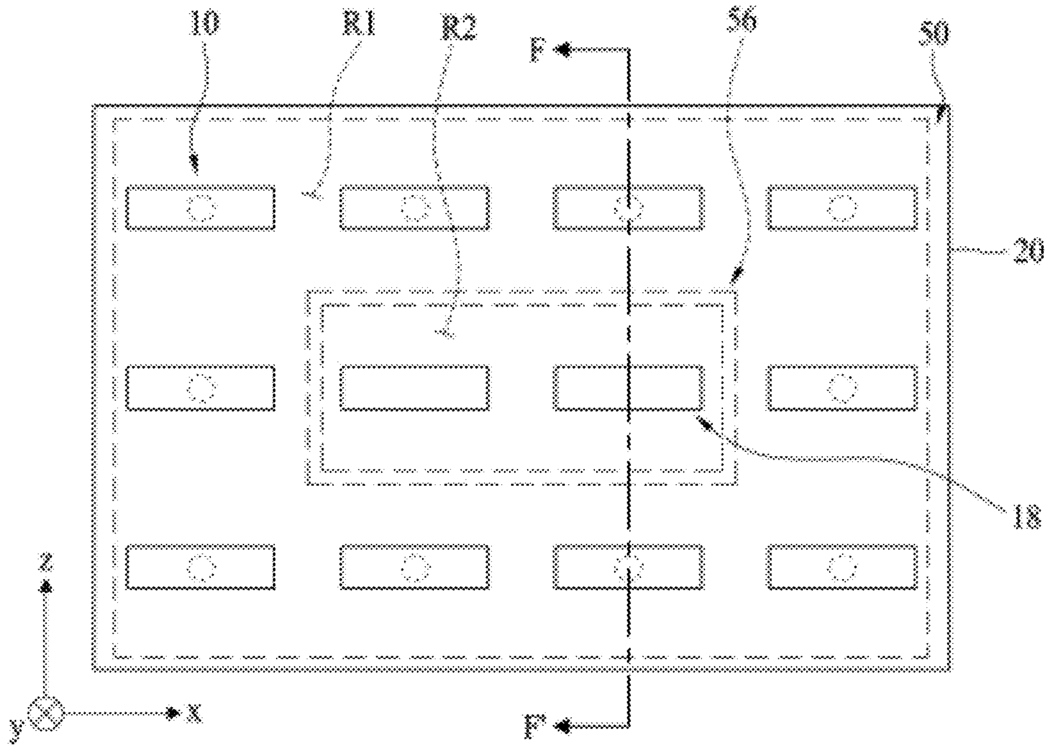
FIG. 31 is a plan view illustrating the arrangement of a piezoelectric device according to a seventeenth aspect of the present disclosure.
Figure 32:
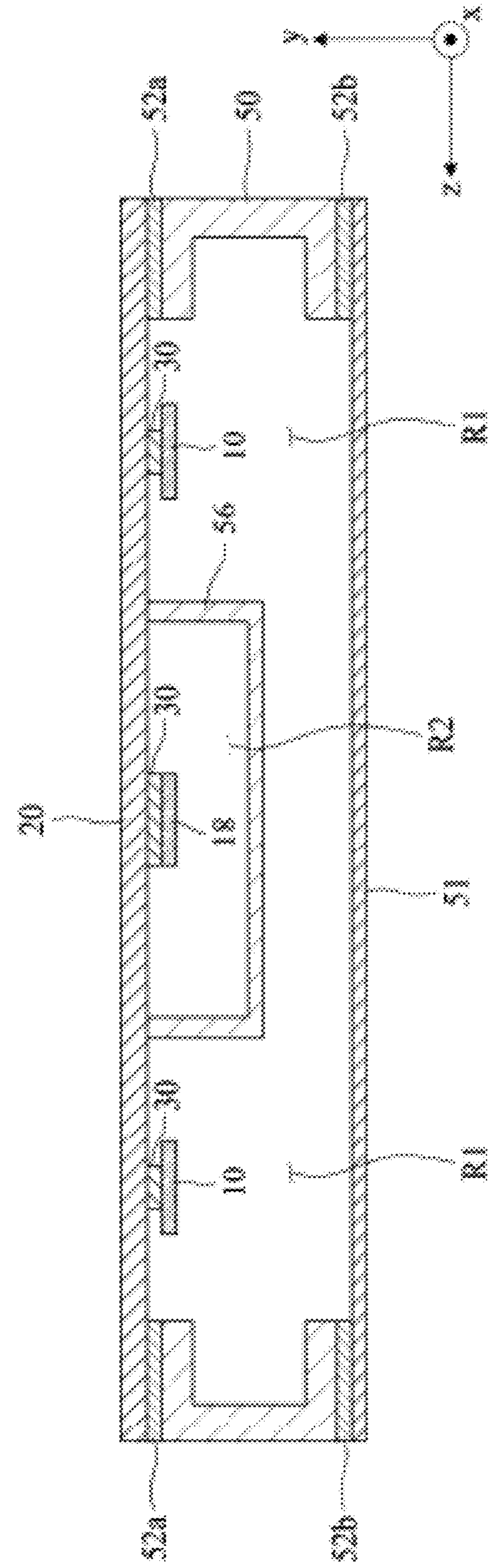
FIG. 32 is a cross-sectional view illustrating a configuration of a sound apparatus according to a seventeenth aspect of the present disclosure.

FIG. 31 is a plan view illustrating the arrangement of a piezoelectric device according to a seventeenth aspect of the present disclosure. FIG. 32 is a cross-sectional view illustrating a configuration of a sound apparatus according to the seventeenth aspect of the present disclosure. FIG. 32 illustrates a cross-sectional surface taken along line F-F' of FIG. 31. The arrangement of the piezoelectric device 10 and the piezoelectric device 18 will be described below with reference to FIGS. 31 and 32.

As illustrated in FIG. 31, in an aspect of the present disclosure, a plurality of piezoelectric devices 10 according to the first aspect of the present disclosure may be disposed in a region R1, and a plurality of piezoelectric devices 18 according to the eleventh aspect of the present disclosure may be disposed in a region R2. The plurality of piezoelectric devices 10 and the plurality of piezoelectric devices 18 may be arranged in a matrix form or a matrix type in an x direction and a z direction.

As illustrated in FIG. 32, the sound apparatus 1 may include a piezoelectric device 10, a piezoelectric device 18, a first vibration member 20, an elastic member 30, a frame 50, a back cover 51, a plurality of adhesive members 52*a* and 52*b*, and an inner frame 56.

The inner frame 56 may be disposed between the first vibration member 20 and the back cover 51 in a cross-sectional view. Also, in a cross-sectional view, the inner frame 56 may be coupled or connected to the first vibration member 20 and may not be coupled or connected to the back cover 51. The sound apparatus 1 may include a space which is defined by the inner frame 56 and the first vibration member 20. For example, the inner frame 56 may divide a space, defined by the back cover 51 and the first vibration member 20, into a region R1 and a region R2. For example, the region R1 and the region R2 may be a vibration space or a vibration cavity space, but aspects of the present disclosure are not limited thereto. The inner frame 56 and the piezoelectric device 18 may be configured as one body or a single body. Also, it may not be essential that the inner frame 56 is not connected to the back cover 51, and as in a configuration according to the sixteenth aspect of the present disclosure, a portion of the inner frame 56 may be coupled or connected to the back cover 51. A size of a resonance space may be appropriately adjusted, thereby enhancing a sound pressure level of a specific frequency. Accordingly, based on a desired design, the arrangement of the inner frame 56 according to the sixteenth aspect of the present disclosure may be better than that from a configuration of the inner frame 56 according to an aspect of the present disclosure. Also, a method of fixing the first vibration member 20 to the frame 50 is not limited to an attachment process according to an aspect of the present disclosure, and various methods such as a compression process using the compression member 53 as in the fourth aspect of the present disclosure may be applied.

As described above, in an aspect of the present disclosure, one or more piezoelectric devices suitable for different frequencies may be disposed in a region R1 and a region R2, and thus, the region R1 may act as a low sound generating region and the region R2 may act as a high sound generating region. For example, the region R1 may be a low sound band generating region, a low sound band vibration space, and a low sound band vibration cavity space, but aspects of the present disclosure are not limited thereto. For example, the region R2 may be a high sound band generating region, a high sound band vibration space, and a high sound band vibration cavity space, but aspects of the present disclosure are not limited thereto. Accordingly, the same effect as the sixteenth aspect of the present disclosure may be obtained, and a sound apparatus 1 for generating a wider pitched sound band may be provided. Also, when a resonance space of the region R1 is not needed, the inner frame 56 may not be disposed.

Moreover, as an example of a piezoelectric device 10 applicable to an aspect of the present disclosure, the piezoelectric device (or the first piezoelectric device) 10 according to the first aspect of the present disclosure and the piezoelectric device (or the second piezoelectric device) 18 according to the eleventh aspect of the present disclosure have been described, but aspects of the present disclosure are not limited thereto. The piezoelectric device 10 or the piezoelectric device 18 based on the structure or arrangement of the first aspect or one of the eighth to fourteenth aspects of the present disclosure may be applied, and a piezoelectric device based on a structure or arrangement differing from the structure or the arrangement described above in the first aspect or the eighth to fourteenth aspects of the present disclosure may be applied.

Eighteenth Aspect

In an aspect of the present disclosure, a modification example of a configuration of the sound apparatus 1 according to the fifteenth aspect of the present disclosure will be described. A structure and the like of a piezoelectric device 10 may be the same as the first aspect or one of the eighth to fourteenth aspects of the present disclosure, and thus, their repetitive descriptions may be omitted. Also, a structure and the like of an elastic member 30, a frame 50, a back cover 51, and a plurality of adhesive members 52*a* and 52*b* may be the same as one of the second to sixth aspects of the present disclosure, and thus, their repetitive descriptions may be omitted.

Figure 33:
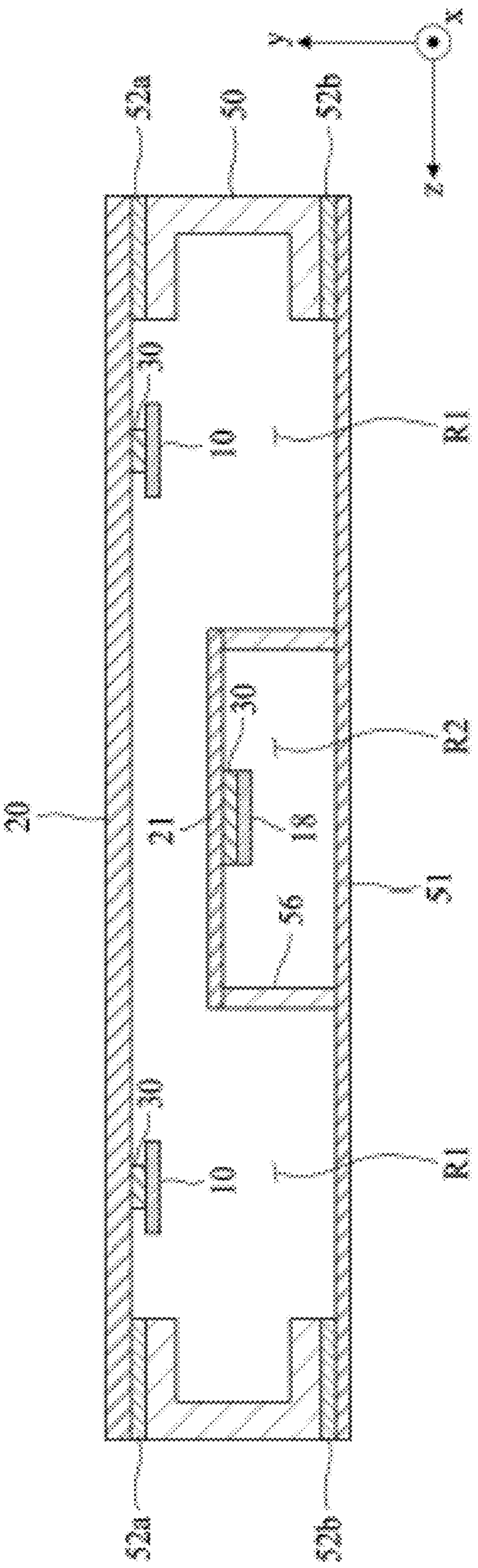
FIG. 33 is a cross-sectional view illustrating a configuration of a sound apparatus according to an eighteenth aspect of the present disclosure.

FIG. 33 is a cross-sectional view illustrating a configuration of a sound apparatus according to an eighteenth aspect of the present disclosure. Also, FIG. 33 is a cross-sectional view taken along line F-F' of FIG. 31 in the same direction as FIG. 32.

As illustrated in FIG. 33, the sound apparatus 1 may include a piezoelectric device 10, a piezoelectric device 18, a first vibration member 20, a second vibration member 21, an elastic member 30, a frame 50, a back cover 51, a plurality of adhesive members 52*a* and 52*b*, and an inner frame 56. The sound apparatus 1 may include a plurality of vibration members.

The first vibration member 20 may be a member which vibrates to generate a sound based on a sound signal input to one or more piezoelectric devices 10 disposed in the region R1. Also, the second vibration member 21 may be a member which vibrates to generate a sound based on a sound signal input to one or more piezoelectric devices 10 disposed in the region R2. A material of the second vibration member 21, like the first vibration member 20, is not limited to a specific material and may include glass, hard paper, metal, or plastic having a material characteristic suitable for transferring a vibration transferred from the piezoelectric device 10.

As illustrated in FIG. 33, the second vibration member 21 may be disposed between the first vibration member 20 and the back cover 51 in a cross-sectional view. The inner frame 56 may be disposed between the second vibration member 21 and the back cover 51. Also, the inner frame 56 may be coupled or connected to both sides of the second vibration member 21 and the back cover 51 in a cross-sectional view. The sound apparatus 1 may include a space which is defined by the inner frame 56, the back cover 51, and the second vibration member 21. For example, the inner frame 56 and the second vibration member 21 may divide a space, defined by the back cover 51 and the first vibration member 20, into a region R1 and a region R2. The inner frame 56 and the piezoelectric device 18 may be configured as one body or a single body. Also, a method of fixing the first vibration member 20 to the frame 50 and a method of fixing the second vibration member 21 to the inner frame 56 are not limited to an attachment process according to an aspect of the present disclosure, and various methods such as a compression process using the compression member 53 as in the fourth aspect of the present disclosure may be applied.

According to an aspect of the present disclosure, a material of the first vibration member 20 and the second vibration member 21 may be individually selected based on a frequency of a sound generated thereby and a characteristic of a piezoelectric device connected thereto, and thus, sound quality may be more enhanced than that from a configuration according to the seventeenth aspect of the present disclosure. Also, when a resonance space is not needed, it may not be essential that the inner frame 56 is disposed, and in this case, the second vibration member 21 may be coupled or connected to the frame 50.

According to another aspect of the present disclosure, a connection structure (or a coupling structure) between the first vibration member 20 and the frame 50 illustrated in each of FIGS. 32 and 33 may be changed to a connection structure (or a coupling structure) between the first vibration member 20 and the frame 50 illustrated in FIG. 10B, but aspects of the present disclosure is not limited thereto. Also, a connection structure (or a coupling structure) between the frame 50 and the back cover 51 illustrated in each of FIGS. 32 and 33 may be changed to a connection structure (or a coupling structure) between the frame 50 and the back cover

51 illustrated in FIG. 10B, but aspects of the present disclosure is not limited thereto.

Nineteenth Aspect

In an aspect of the present disclosure, a modification example of a configuration of the sound apparatus 1 according to the fifteenth aspect of the present disclosure will be described. A structure and the like of a piezoelectric device 10 may be the same as the first aspect or one of the eighth to fourteenth aspects of the present disclosure, and thus, their repetitive descriptions may be omitted. Also, a structure and the like of an elastic member 30, a back cover 51, and a plurality of adhesive members 52*a* and 52*b* may be the same as one of the second to sixth aspects of the present disclosure, and thus, their repetitive descriptions may be omitted.

Figure 34:
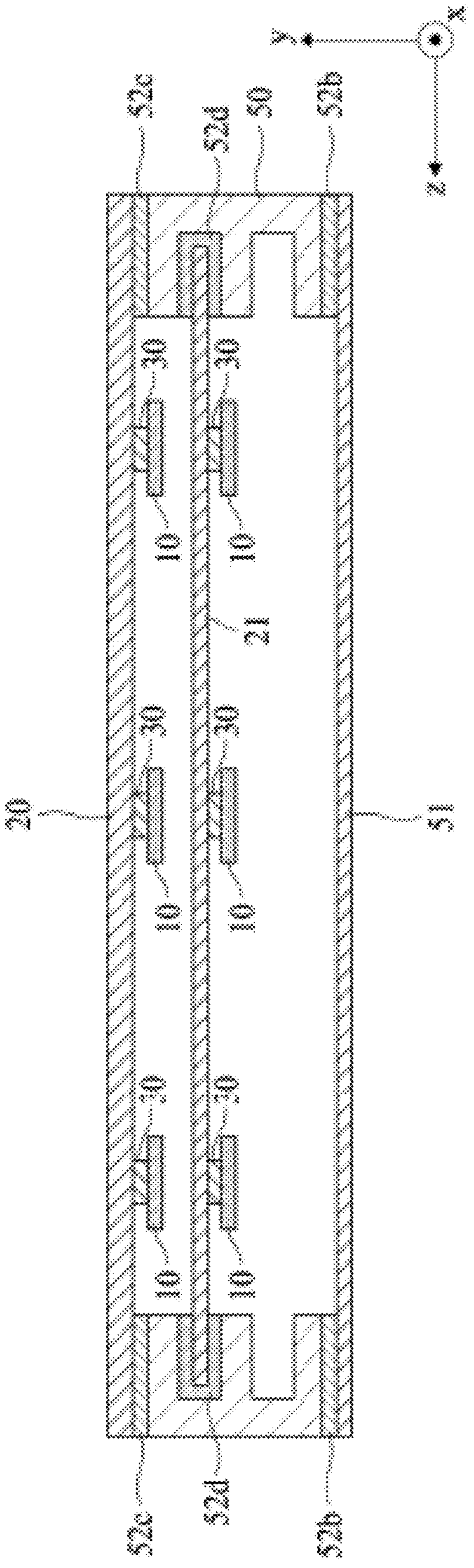
FIG. 34 is a cross-sectional view illustrating a configuration of a sound apparatus according to a nineteenth aspect of the present disclosure.

FIG. 34 is a cross-sectional view illustrating a configuration of a sound apparatus according to a nineteenth aspect of the present disclosure. Also, FIG. 34 is a cross-sectional view taken along line D-D' of FIG. 28A in the same direction as FIG. 28B.

As illustrated in FIG. 34, the sound apparatus 1 may include a piezoelectric device 10, a first vibration member 20, a second vibration member 21, an elastic member 30, a frame 50, a back cover 51, and a plurality of adhesive members 52*b*, 52*c*, and 52*d*. A structure of the frame 50 according to an aspect of the present disclosure may be the same as FIG. 15. In FIG. 34, the first vibration member 20 and the second vibration member 21 may be disposed instead of the front cover 54 and the first vibration member 20 in FIG. 15. The first vibration member 20 may be coupled or connected to the frame 50 by the adhesive member 52*c*. The second vibration member 21 may be coupled or connected to the frame 50 by the adhesive member 52*d*. In another aspect of the present disclosure, the adhesive member 52*c* may be disposed as in FIG. 15. For example, the adhesive member 52*c* may be disposed as in FIGS. 41A to 41C. For example, the first vibration member 20 may be a vibration member of a high-pitched sound band. For example, the second vibration member 21 may be a vibration member of a low-pitched sound band. The sound apparatus 1 may include a space (or a first space), which is defined by the first and second vibration members 20 and 21 and the frame 50, and a space (or a second space) which is defined by the second vibration member 21 and the frame 50. For example, the first vibration member 20 may generate a sound of a high-pitched sound band. For example, the second vibration member 21 may generate a sound of a low-pitched sound band. Also, a method of fixing the first and second vibration members 20 and 21 to the frame 50 is not limited to an attachment process according to an aspect of the present disclosure, and various methods such as a compression process using the compression member 53 as in the fourth aspect of the present disclosure may be applied.

In an aspect of the present disclosure, a sound apparatus 1 having the same effect as a configuration according to the eighteenth aspect of the present disclosure may be provided. Also, the kinds of a plurality of piezoelectric devices disposed in each of two spaces may be individually selected, but it may not be essential that piezoelectric devices having different sound characteristics are respectively disposed in spaces and the same kinds of piezoelectric devices may be respectively disposed in spaces. For example, a plurality of piezoelectric devices 10 may be coupled or connected to a rear surface of the first vibration member 20 by the elastic member 30, and a plurality of piezoelectric devices 10 may be coupled or connected to a rear surface of the second vibration member 21 by the elastic member 30. One or more among the plurality of piezoelectric devices 10 connected to each of the first vibration member 20 and the second vibration member 21 may have the same sound characteristic or different sound characteristics. For example, the first vibration member 20 and the plurality of piezoelectric devices 10 may be configured to implement a sound of a high-pitched sound band. The second vibration member 21 and the plurality of piezoelectric devices 10 may be configured to implement a sound of a low-pitched sound band. For example, the first vibration member 20 may include a material suitable for implementing a sound of the high-pitched sound band. For example, the second vibration member 21 may include a material suitable for implementing a sound of the low-pitched sound band.

Twentieth Aspect

In an aspect of the present disclosure, a modification example of a configuration of a sound apparatus 1 according to a twentieth aspect of the present disclosure will be described. Structures other than a structure and the like of a plurality of piezoelectric devices 10 connected to a first vibration member 20 may be the same as the eleventh aspect of the present disclosure, and thus, their repetitive descriptions may be omitted. Also, a structure and the like of a first vibration member 20, an elastic member 30, a frame 50, a back cover 51, and a plurality of adhesive members 52*b* to 52*d* may be the same as the second to sixth aspects of the present disclosure, and thus, their repetitive descriptions may be omitted.

Figure 35:
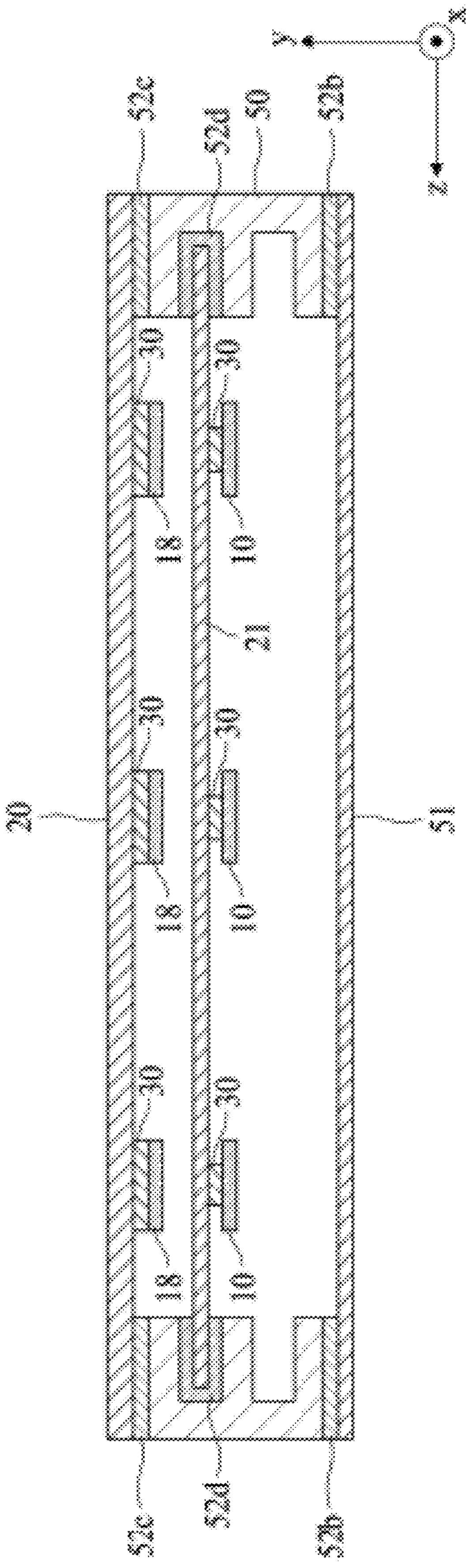
FIG. 35 is a cross-sectional view illustrating a configuration of a sound apparatus according to a twentieth aspect of the present disclosure.

FIG. 35 is a cross-sectional view illustrating a configuration of a sound apparatus according to the twentieth aspect of the present disclosure. FIG. 35 is a cross-sectional view taken along line D-D' of FIG. 28A in the same direction as FIG. 28B.

In an aspect of the present disclosure, each of a plurality of piezoelectric devices 10 connected to a first vibration member 20 may be the piezoelectric device 18 according to the eleventh aspect of the present disclosure, but aspects of the present disclosure are not limited thereto. Accordingly, in an aspect of the present disclosure, a sound apparatus 1 having the same effect as a configuration according to the nineteenth aspect of the present disclosure may be provided.

Twenty-First Aspect

In an aspect of the present disclosure, another modification example of a configuration of a sound apparatus 1 according to a twenty-first aspect of the present disclosure will be described. A structure and the like of a piezoelectric device 10 may be the same as the first aspect or one of the eighth to fourteenth aspects of the present disclosure, and thus, their repetitive descriptions may be omitted. Also, a structure and the like of a first vibration member 20, an elastic member 30, a frame 50, a back cover 51, and a plurality of adhesive members 52*b*, 52*c*, and 52*d* may be the same as the second to sixth aspects of the present disclosure, and thus, their repetitive descriptions may be omitted. In another aspect of the present disclosure, the adhesive member 52*c* may be disposed as in FIG. 15.

Figure 36:
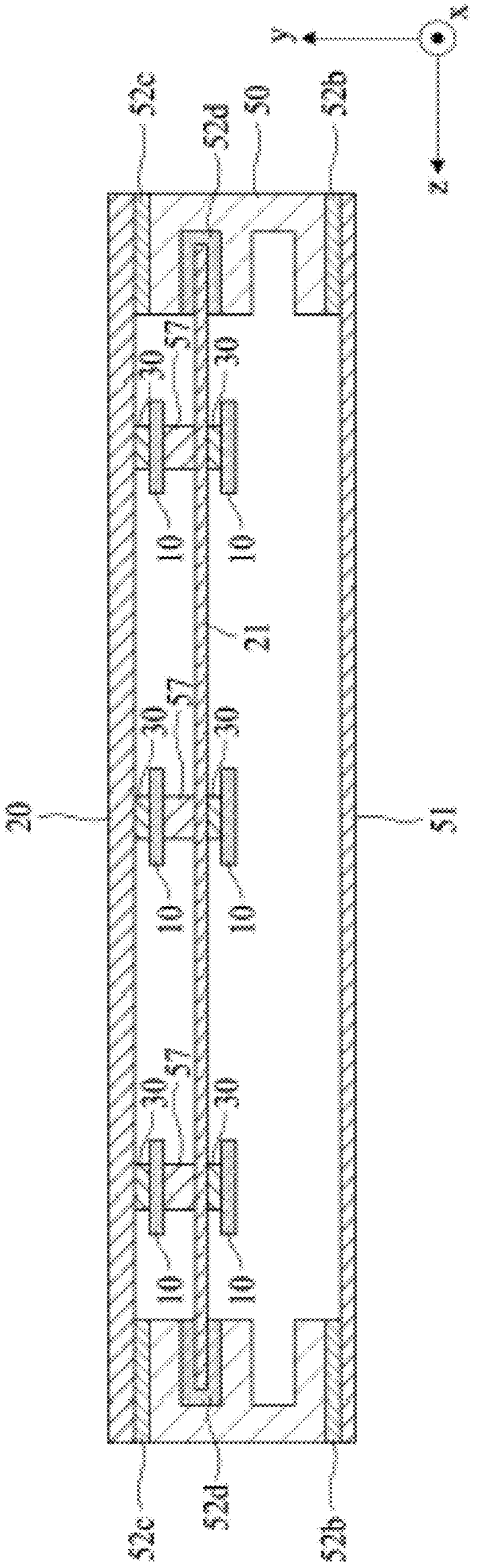
FIG. 36 is a cross-sectional view illustrating a configuration of a sound apparatus according to a twenty-first aspect of the present disclosure.

FIG. 36 is a cross-sectional view illustrating a configuration of the sound apparatus according to the twenty-first aspect of the present disclosure. FIG. 36 is a cross-sectional view taken along line D-D' of FIG. 28A in the same direction as FIG. 28B.

As illustrated in FIG. 36, the sound apparatus 1 may include a piezoelectric device 10, a first vibration member 20, a second vibration member 21, an elastic member 30, a frame 50, a back cover 51, a plurality of adhesive members 52*b*, 52*c*, and 52*d*, and a connection member 57. In another aspect of the present disclosure, the adhesive member 52*c* may be disposed as in FIG. 15. For example, the adhesive member 52*c* may be disposed as in FIGS. 41A, 41B, and 41C. The connection member 57 may connect the second vibration member 21 to the piezoelectric device 10 connected to the first vibration member 20. Therefore, a vibration of the piezoelectric device 10 connected to the second vibration member 21 may be transferred to the piezoelectric device 10 connected to the first vibration member 20. A material of the connection member 57 is capable of transferring a vibration, but is not limited to a specific material. For example, the connection member 57 may be referred to as a pad, a pad member, an anti-resonance member, an anti-noise pad, an anti-noise member, a mass member, a mass, or a weight, but aspects of the present disclosure are not limited thereto. For example, the connection member 57 may include a metal material or a plastic material, but aspects of the present disclosure are not limited thereto.

There may be a case where all of the first vibration member 20 and the second vibration member 21 resonate. Such resonance may cause noise. On the other hand, in an aspect of the present disclosure, a vibration of a piezoelectric device 10 connected to the second vibration member 21 may be transferred to a piezoelectric device 10, connected to the first vibration member 20, by the connection member 57, and thus, resonance may be difficult to occur, whereby noise may be reduced.

Accordingly, according to an aspect of the present disclosure, a sound apparatus 1 having the same effect as the nineteenth aspect of the present disclosure may be provided, and noise caused by resonance occurring due to vibrations of the first vibration member 20 and the second vibration member 21 may be reduced, thereby providing a sound apparatus with enhanced sound quality.

According to an aspect of the present disclosure, a connection structure (or a coupling structure) between the first vibration member 20 and the frame 50 illustrated in each of FIGS. 34, 35, and 36 may be changed to a connection structure (or a coupling structure) between the first vibration member 20 and the frame 50 illustrated in FIG. 10B, but aspects of the present disclosure is not limited thereto. Also, a connection structure (or a coupling structure) between the frame 50 and the back cover 51 illustrated in each of FIGS. 34, 35, and 36 may be changed to a connection structure (or a coupling structure) between the frame 50 and the back cover 51 illustrated in FIG. 10B, but aspects of the present disclosure is not limited thereto.

Modification Example of Second Aspect

In an aspect of the present disclosure, a modification example of a configuration of the sound apparatus according to the second aspect of the present disclosure illustrated in FIGS. 10A, and 11 will be described. Structures other than a back cover 51 may be the same as the second aspect of the present disclosure, and thus, their repetitive descriptions may be omitted.

Figure 37A:
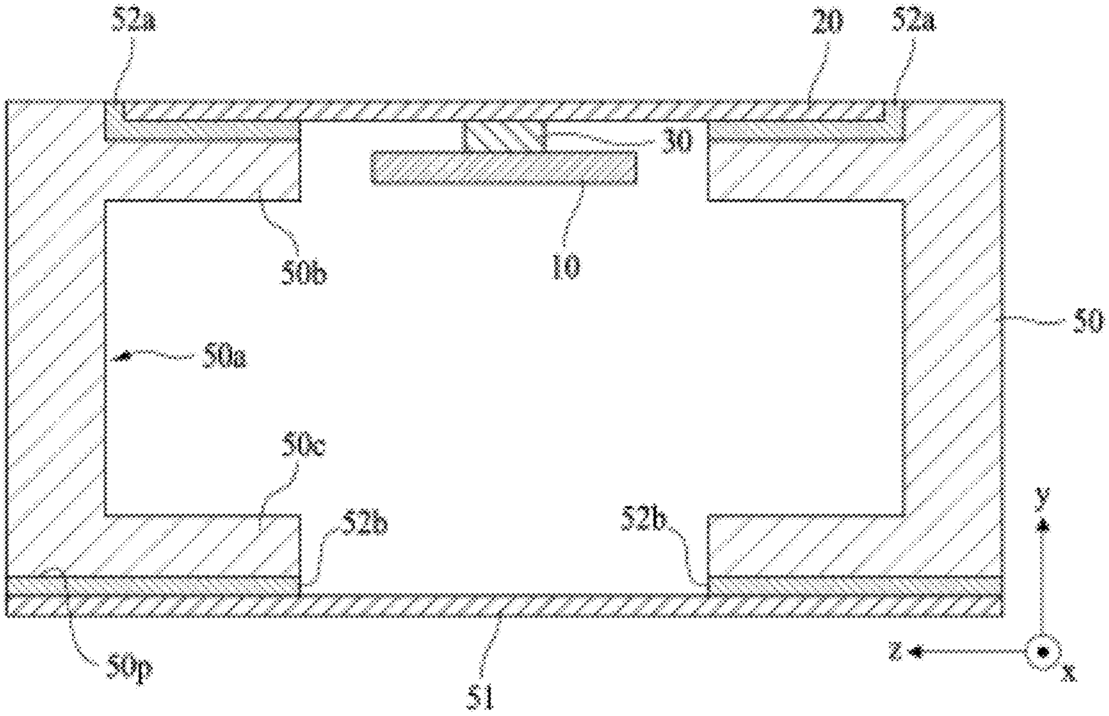
FIG. 37A is a cross-sectional view illustrating a first modification example of a structure of a sound apparatus according to a second aspect of the present disclosure.
Figure 37B:
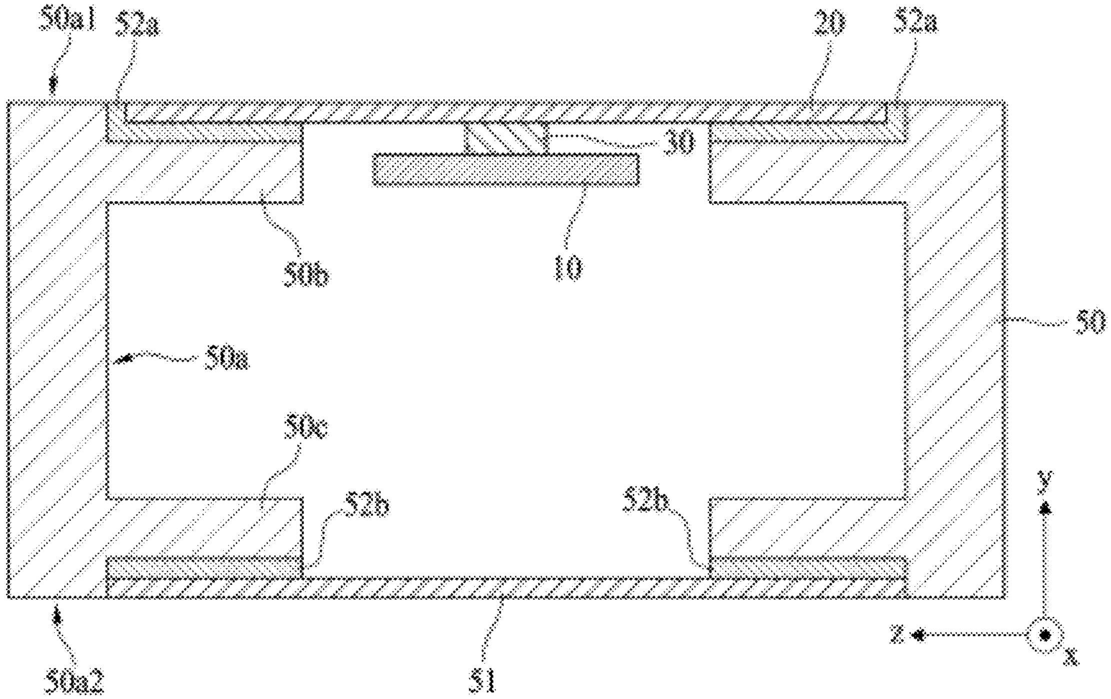
FIG. 37B is a cross-sectional view illustrating a second modification example of a sound apparatus according to a second aspect of the present disclosure.

FIG. 37A is a cross-sectional view illustrating a first modification example of a structure of the sound apparatus according to the second aspect of the present disclosure. FIG. 37B is a cross-sectional view illustrating a second modification example of the sound apparatus according to the second aspect of the present disclosure. FIGS. 37A and 37B are cross-sectional views taken along line B-B' of FIG. 10A in the same direction as FIG. 10B.

As illustrated in FIG. 37A, structures other than the back cover 51 may be the same as the second aspect of the present disclosure, and thus, their repetitive descriptions may be omitted. For example, the first vibration member 20 may be a vibration panel of an advertising object or a vibration panel of a signage. For example, the advertising object may be a picture frame, a poster, a standing signboard, and a content of a signage, but aspects of the present disclosure are not limited thereto.

The back cover 51 may be configured to cover a rear surface 50*p* of a frame 50. For example, the first vibration member 20 may be accommodated or inserted into the frame 50. For example, the back cover 51 may be configured to cover all of the rear surface 50*p* of a frame 50. The back cover 51 may have the same size as that of the rear surface 50*p* of the frame 50. For example, the back cover 51 may be connected or coupled to the rear surface 50*p* of the frame 50 and a rear surface of a protrusion portion 50*c* by an adhesive member 52*b*. The adhesive member 52*b* may have a size corresponding to the rear surface 50*p* of the frame 50 and the rear surface of the protrusion portion 50*c*.

In an aspect of the present disclosure, a sound apparatus 1 having the same effect as the second aspect of the present disclosure may be provided. Also, according to an aspect of the present disclosure, the back cover 51 may be attached on the rear surface 50*p* of the frame 50 and the rear surface of the protrusion portion 50*c* at the rear surface of the frame 50, and thus, a process of attaching or connecting the back cover 51 on or to the frame 50 may be easily performed. Also, according to an aspect of the present disclosure, the first vibration member 20 and the front cover 54 may be configured as one body or a single body, and thus, a thin or slim sound apparatus 1 may be provided.

As illustrated in FIG. 37B, structures and the like other than the protrusion portion 50*b* and the back cover 51 may be the same as the second aspect of the present disclosure, and thus, their repetitive descriptions may be omitted. For example, the first vibration member 20 may be a vibration panel of an advertising object or a vibration panel of a signage. For example, the advertising object may be a picture frame, a poster, a standing signboard, and a content of a signage, but aspects of the present disclosure are not limited thereto. For example, the first vibration member 20 may be accommodated or inserted into the frame 50.

The frame 50 may be configured to accommodate the back cover 51. The frame 50 may include a side portion (or an upper side portion) 50*a*1 which extends in a y direction in a cross-sectional view, a plurality of protrusion portions 50*b* and 50*c* which protrude in a z direction perpendicular to the y direction in which the side portion 50*a*1 extends, and a side portion (or a lower side portion) 50*a*2 which extends in the y direction in a cross-sectional view. The side portion 50*a*2 may be configured to surround the back cover 51. The protrusion portion 50*c* may be spaced apart from a rear surface of the side portion 50*a*2 of the frame 50. The back cover 51 may be connected or coupled to the protrusion portion 50*c* by the adhesive member 52*b*, and thus, side surfaces of the back cover 51 may be surrounded by the side portion 50*a*2 of the frame 50.

In an aspect of the present disclosure, a sound apparatus 1 having the same effect as the second aspect of the present disclosure may be provided. Also, according to an aspect of the present disclosure, the back cover 51 may be attached on the protrusion portion 50*c* at the rear surface of the frame 50, and thus, a process of attaching or connecting the back cover 51 on or to the frame 50 may be easily performed. Also, according to an aspect of the present disclosure, the first vibration member 20 and the front cover 54 may be configured as one body or a single body, and thus, a thin or slim sound apparatus 1 may be provided.

Modification Example of Third Aspect

In an aspect of the present disclosure, a modification example of a configuration of the sound apparatus 1 according to the third aspect of the present disclosure illustrated in FIGS. 12 and 13 will be described.

Figure 38A:
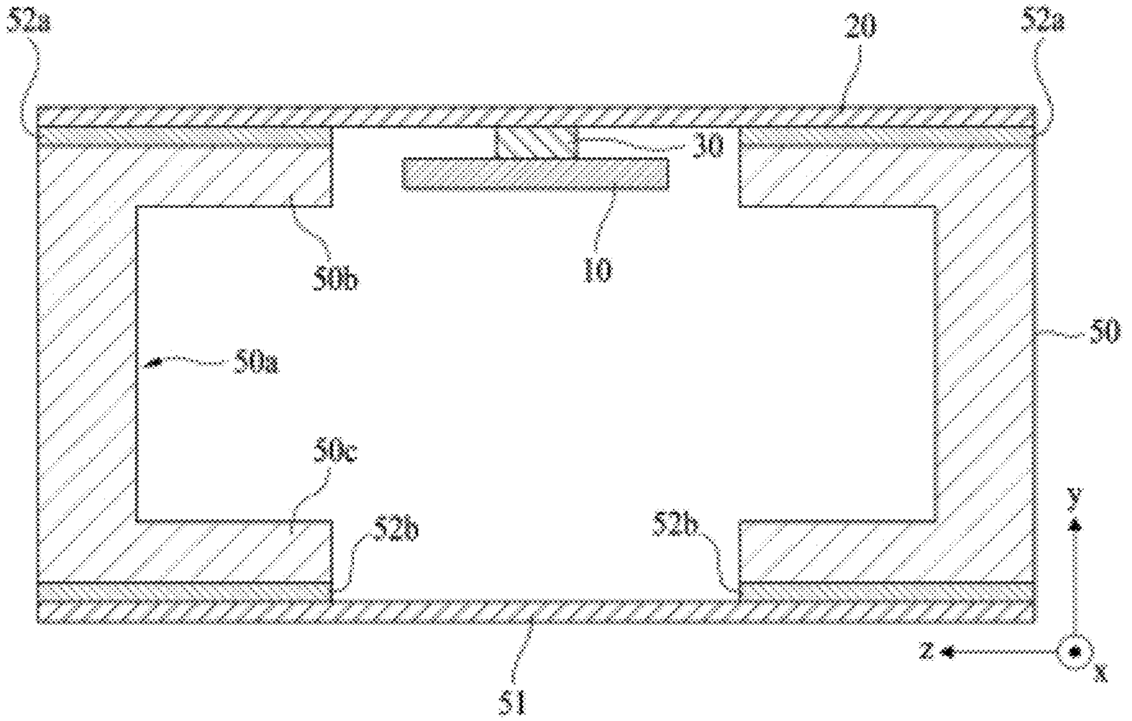
FIG. 38A is a cross-sectional view illustrating a first modification example of a structure of a sound apparatus according to a third aspect of the present disclosure.
Figure 38B:
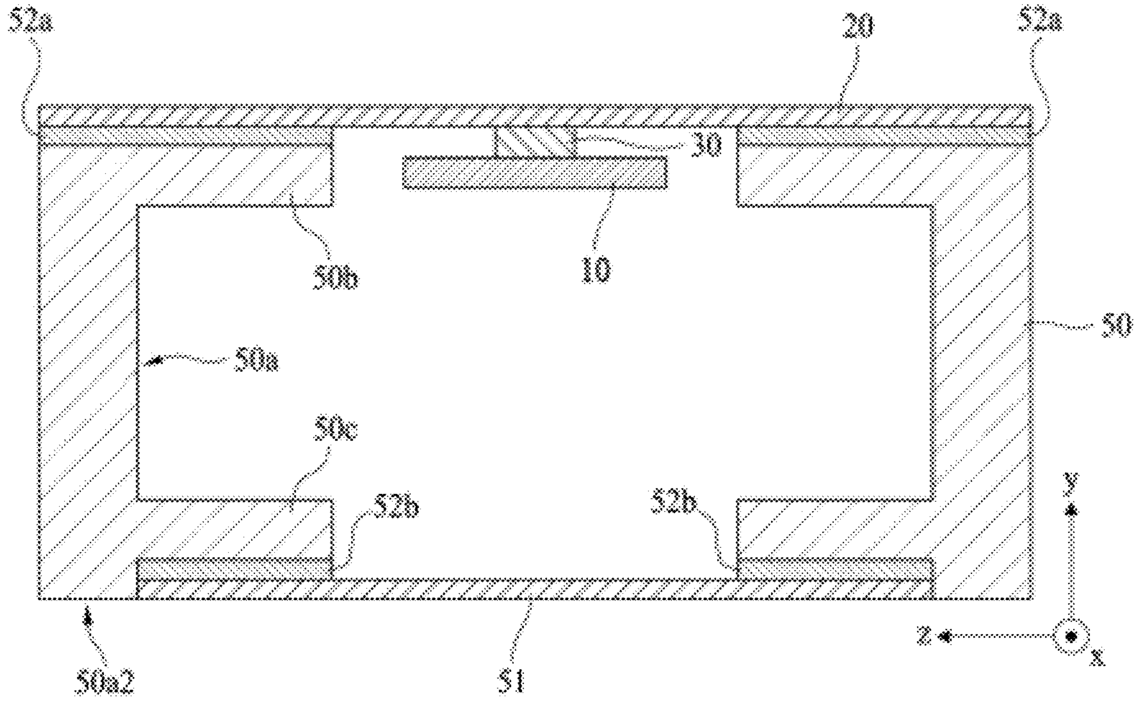
FIG. 38B is a cross-sectional view illustrating a second modification example of the sound apparatus according to the second aspect of the present disclosure.

FIG. 38A is a cross-sectional view illustrating a first modification example of a structure of the sound apparatus according to the third aspect of the present disclosure. FIG. 38B is a cross-sectional view illustrating a second modification example of the sound apparatus according to the second aspect of the present disclosure. FIGS. 38A and 38B are cross-sectional views taken along line B-B' of FIG. 10A in the same direction as FIG. 10B.

As illustrated in FIG. 38A, the back cover 51 may be configured to cover all of a rear surface of a frame 50. The back cover 51 and the frame 50 may be the same as the fifteenth aspect of FIG. 28B, and thus, their repetitive descriptions may be omitted. For example, the first vibration member 20 may be a vibration panel of an advertising object or a vibration panel of a signage. For example, the advertising object may be a picture frame, a poster, a standing signboard, and a content of a signage, but aspects of the present disclosure are not limited thereto. For example, the first vibration member 20 may be attached on or adhered to an upper end of the frame 50.

In an aspect of the present disclosure, a sound apparatus 1 having the same effect as the third aspect of the present disclosure may be provided. Also, according to an aspect of the present disclosure, the back cover 51 may be attached on the protrusion portion 50*c* at the rear surface of the frame 50, and thus, a process of attaching or connecting the back cover 51 on or to the frame 50 may be easily performed. Also, according to an aspect of the present disclosure, the first vibration member 20 and the front cover 54 may be configured as one body or a single body, and thus, a thin or slim sound apparatus 1 may be provided.

As illustrated in FIG. 38B, structures and the like other than the side portion 50*a* of the frame 50 and the back cover 51 may be the same as the fifteenth aspect of FIG. 28B, and thus, their repetitive descriptions may be omitted. For example, the first vibration member 20 may be a vibration panel of an advertising object or a vibration panel of a signage. For example, the advertising object may be a picture frame, a poster, a standing signboard, and a content of a signage, but aspects of the present disclosure are not limited thereto. For example, the first vibration member 20 may be attached on or adhered to the upper end of the frame 50.

The frame 50 may be configured to accommodate the back cover 51 or to surround side surfaces of the back cover 51. The frame 50 may include a side portion 50*a* which extends in a y direction in a cross-sectional view, a plurality of protrusion portions 50*b* and 50*c* which protrude in a z direction perpendicular to the y direction in which the side portion 50*a* extends, and a side portion (or a lower side portion) 50*a*2 which extends in the y direction in a cross-sectional view. The side portion 50*a*2 may be configured to surround the back cover 51. The protrusion portion 50*c* may be spaced apart from a rear surface of the side portion 50*a*2 of the frame 50. The back cover 51 may be connected or coupled to the protrusion portion 50*c* by the adhesive member 52*b*, and thus, side surfaces of the back cover 51 may be surrounded by the side portion 50*a*2 of the frame 50.

In an aspect of the present disclosure, a sound apparatus 1 having the same effect as the third aspect of the present disclosure may be provided. Also, according to an aspect of the present disclosure, the back cover 51 may be attached on the protrusion portion 50*c* at the rear surface of the frame 50, and thus, a process of attaching or connecting the back cover 51 on or to the frame 50 may be easily performed. Also, according to an aspect of the present disclosure, the first vibration member 20 and the front cover 54 may be configured as one body or a single body, and thus, a thin or slim sound apparatus 1 may be provided.

Modification Example of Fourth Aspect

In an aspect of the present disclosure, a modification example of a configuration of the sound apparatus 1 according to the fourth aspect of the present disclosure illustrated in FIG. 14 will be described. Structures other than the back cover 51 may be the same as the fourth aspect of the present disclosure, and thus, their repetitive descriptions may be omitted.

Figure 39A:
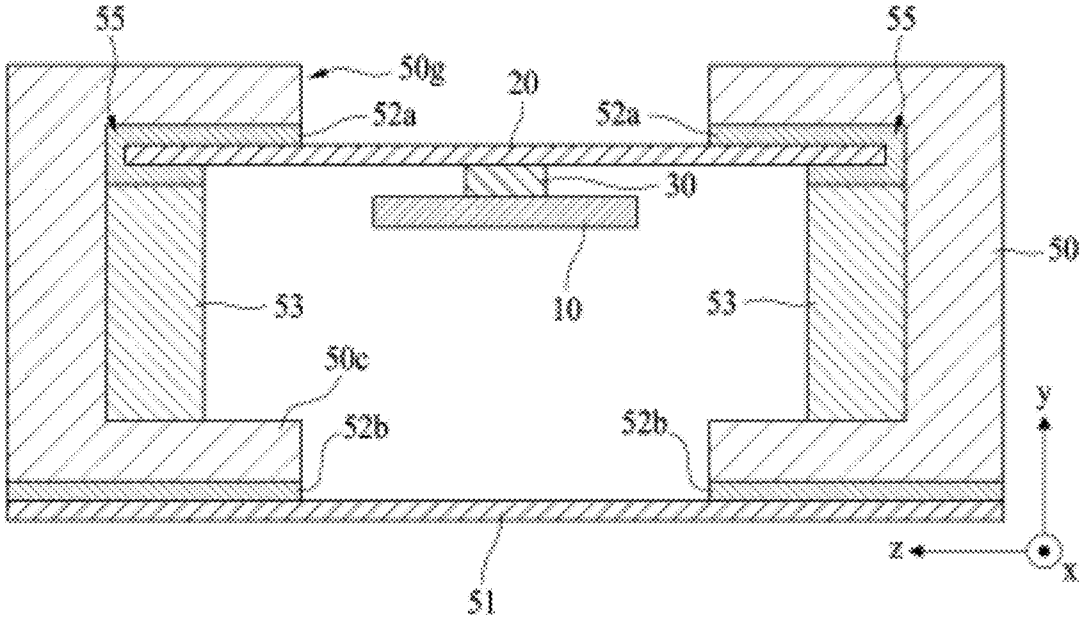
FIG. 39A is a cross-sectional view illustrating a first modification example of the sound apparatus according to the fourth aspect of the present disclosure.
Figure 39B:
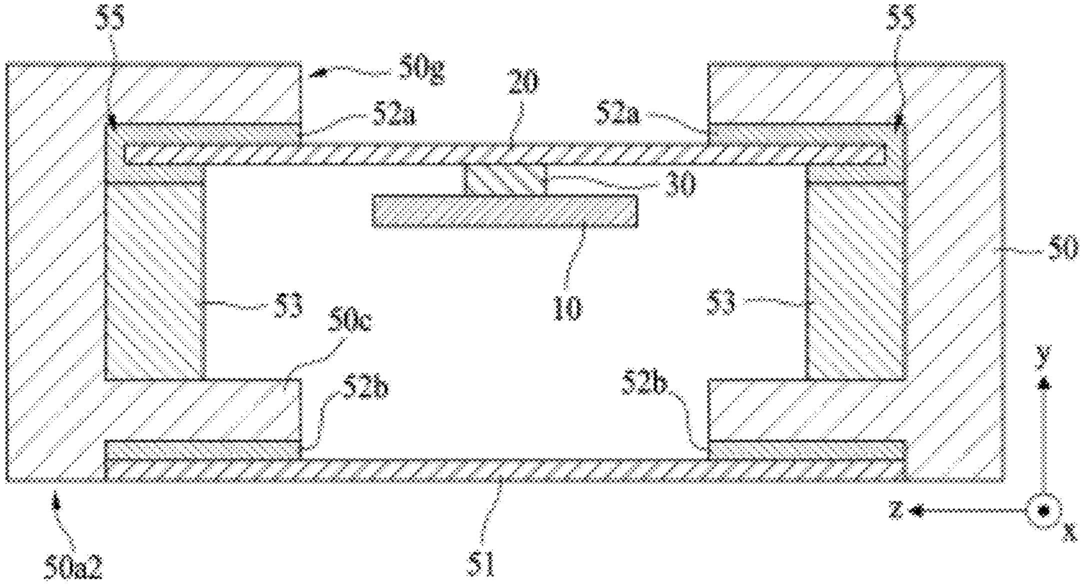
FIG. 39B is a cross-sectional view illustrating a second modification example of a sound apparatus according to a fourth aspect of the present disclosure.
Figure 39C:
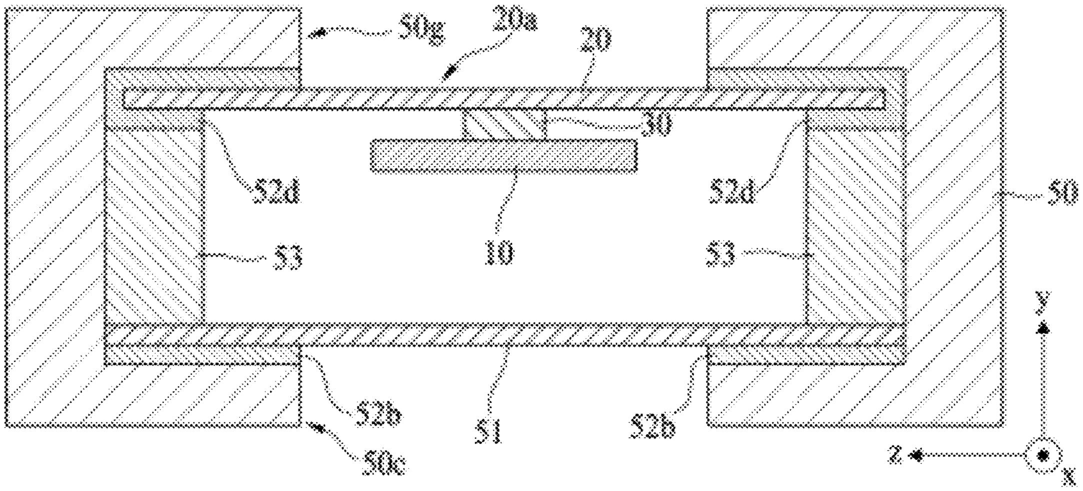
FIG. 39C is a cross-sectional view illustrating a third modification example of a sound apparatus according to a fourth aspect of the present disclosure.
Figure 39D:
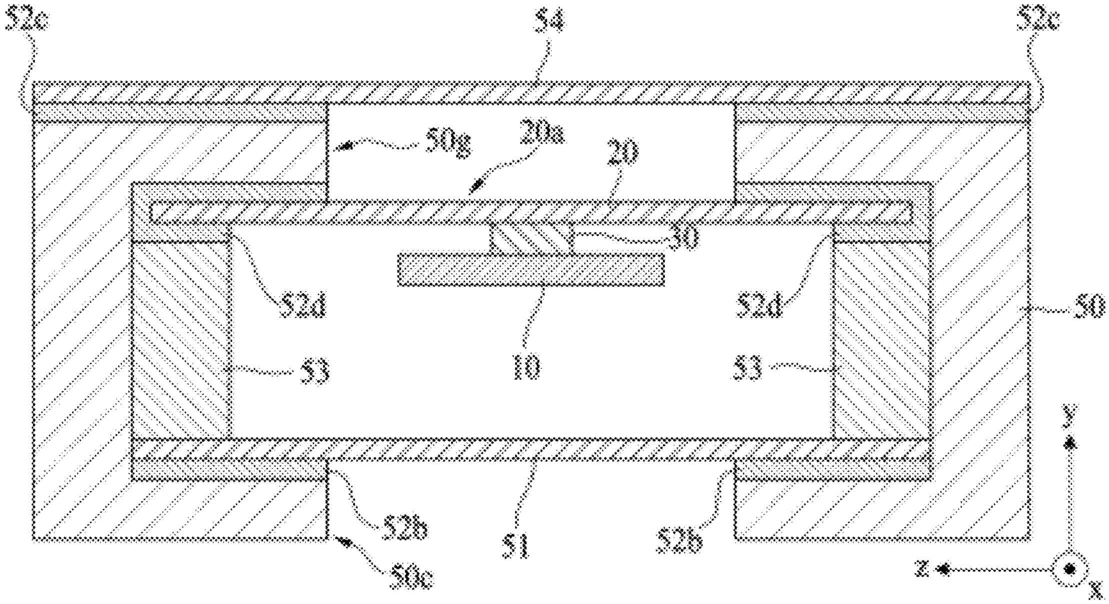
FIG. 39D is a cross-sectional view illustrating a fourth modification example of a sound apparatus according to a fourth aspect of the present disclosure.

FIG. 39A is a cross-sectional view illustrating a first modification example of the sound apparatus according to the fourth aspect of the present disclosure. FIG. 39B is a cross-sectional view illustrating a second modification example of the sound apparatus according to the fourth aspect of the present disclosure. FIG. 39C is a cross-sectional view illustrating a third modification example of the sound apparatus according to the fourth aspect of the present disclosure. FIG. 39D is a cross-sectional view illustrating a fourth modification example of the sound apparatus according to the fourth aspect of the present disclosure. FIGS. 39A to 39D are cross-sectional views taken along line B-B' of FIG. 10A in the same direction as FIG. 10B.

As illustrated in FIG. 39A, the back cover 51 may be configured to cover all of a rear surface of a frame 50. The back cover 51 and the frame 50 may be the same as the fifteenth aspect of FIG. 28B, and thus, their repetitive descriptions may be omitted.

A compression member 53 may be accommodated or inserted into the frame 50. For example, the compression member 53 may be compressed to fill a gap (or a distance or an interval or a spaced space) between a first vibration member 20 and a protrusion portion 50*c*. For example, an adhesive member 52*a* may be provided between the frame 50 and the first vibration member 20 and between the first vibration member 20 and the compression member 53. For example, the adhesive member 52*a* may be configured to fill a gap (or a distance or an interval or a spaced space) between the frame 50 and the first vibration member 20 and a gap (or a distance or an interval or a spaced space) between the first vibration member 20 and the compression member 53.

In an aspect of the present disclosure, in a cross-sectional view, the adhesive member 52*a* disposed between a side portion of the frame 50 and a side surface (or a sidewall) of first vibration member 20 may be replaced with a vibration absorption member 55 as in the sixth aspect of the present disclosure of FIG. 17. Also, in an aspect of the present disclosure, a sound apparatus 1 having the same effect as the fourth aspect of the present disclosure may be provided. Also, according to an aspect of the present disclosure, the back cover 51 may be attached on the protrusion portion 50*c* at the rear surface of the frame 50, and thus, a process of attaching or connecting the back cover 51 on or to the frame 50 may be easily performed. Also, according to an aspect of the present disclosure, the first vibration member 20 and the front cover 54 may be configured as one body or a single body, and thus, a thin or slim sound apparatus 1 may be provided.

As illustrated in FIG. 39B, structures and the like other than the side portion 50*a* of the frame 50 and the back cover 51 may be the same as a modification example of FIG. 39A, and thus, their repetitive descriptions may be omitted. The frame 50 may be configured to accommodate the back cover 51 or to surround side surfaces of the back cover 51. The back cover 51 and the frame 50 may be the same as a modification example of FIG. 38B, and thus, their repetitive descriptions may be omitted. A compression member 53 may be accommodated or inserted into the frame 50. For example, a compression member 53 may be compressed to fill a gap (or a distance or an interval or a spaced space) between a first vibration member 20 and a protrusion portion 50*c*.

In an aspect of the present disclosure, a sound apparatus 1 having the same effect as the fourth aspect of the present disclosure may be provided. Also, according to an aspect of the present disclosure, the back cover 51 may be attached on the protrusion portion 50*c* at the rear surface of the frame 50, and thus, a process of attaching or connecting the back cover 51 on or to the frame 50 may be easily performed. Also, according to an aspect of the present disclosure, the first vibration member 20 and the front cover 54 may be configured as one body or a single body, and thus, a thin or slim sound apparatus 1 may be provided.

As illustrated in FIG. 39C, structures and the like other than the back cover 51 may be the same as the modification example of FIG. 39A, and thus, their repetitive descriptions may be omitted. The back cover 51, as illustrated in FIG. 14, may be disposed between the compression member 53 and the protrusion portion 50*c* of the frame 50. The back cover 51 may be attached or connected to the protrusion portion 50*c* by the adhesive member 52*b*. The compression member 53 may compress the first vibration member 20 to an inner portion of a housing of the sound apparatus 1. In a cross-sectional view, the compression member 53 may be disposed between the first vibration member 20 and the back cover 51. For example, in a cross-sectional view, the compression member 53 may be compressed to fill a gap (or a distance or an interval or a spaced space) between the first vibration member 20 and the back cover 51. In an aspect of the present disclosure, a sound apparatus 1 having the same effect as the fourth aspect of the present disclosure may be provided.

In another aspect of the present disclosure, the back cover 51 illustrated in FIG. 39C may be configured to cover all of the rear surface of the frame 50. The back cover 51 and the frame 50 may be the same as the aspect of FIG. 39A, and thus, their repetitive descriptions may be omitted. The compression member 53 may be accommodated or inserted into the frame 50. For example, the compression member 53 may be compressed to fill a gap between the first vibration member 20 and the protrusion portion 50*c*. Also, the frame 50 illustrated in FIG. 39C may be configured to accommodate the back cover 51 or to surround side surfaces of the back cover 51. The back cover 51 and the frame 50 may be the same as the aspect of FIG. 39B, and thus, their repetitive descriptions may be omitted. In this case, the compression member 53 may be compressed to fill a gap (or a distance or an interval or a spaced space) between the first vibration member 20 and the protrusion portion 50*c*.

As illustrated in FIG. 39D, except for that the sound apparatus 1 further include a front cover 54, the sound apparatus 1 of FIG. 39D may be the same as the modification example of FIG. 39C, and thus, descriptions of elements other than the front cover 54 are the same as or similar to the descriptions of FIG. 39C and thus are omitted. The front cover 54 may be the same as the front cover 54 illustrated in FIG. 15, and thus, their repetitive descriptions may be omitted. An adhesive member 52*c* may attach the front cover 54 on a top surface of the frame 50.

In an aspect of the present disclosure, a sound apparatus 1 having the same effect as the fourth aspect of the present disclosure may be provided. Also, according to an aspect of the present disclosure, an external object may not contact content of a signage which is attached on a sound source surface 20*a* of the first vibration member 20 by the front cover 54, and thus, damage of the first vibration member 20 or the content may be prevented. For example, a space may be provided between the front cover 54 and the first vibration member 20. A vibration panel of an advertising object or a vibration panel of a signage may be accommodated or inserted into the space. For example, the advertising object may be a picture frame, a poster, a standing signboard, and a content of a signage, but aspects of the present disclosure are not limited thereto.

First Modification Example of Fifth Aspect

In an aspect of the present disclosure, a first modification example of a configuration of the sound apparatus 1 according to the fifth aspect of the present disclosure illustrated in FIGS. 15 and 16 will be described. Structures and the like other than a front cover 54 and an adhesive member 52*c* may be the same as the fifth aspect of the present disclosure, and thus, their repetitive descriptions may be omitted.

Figure 40:
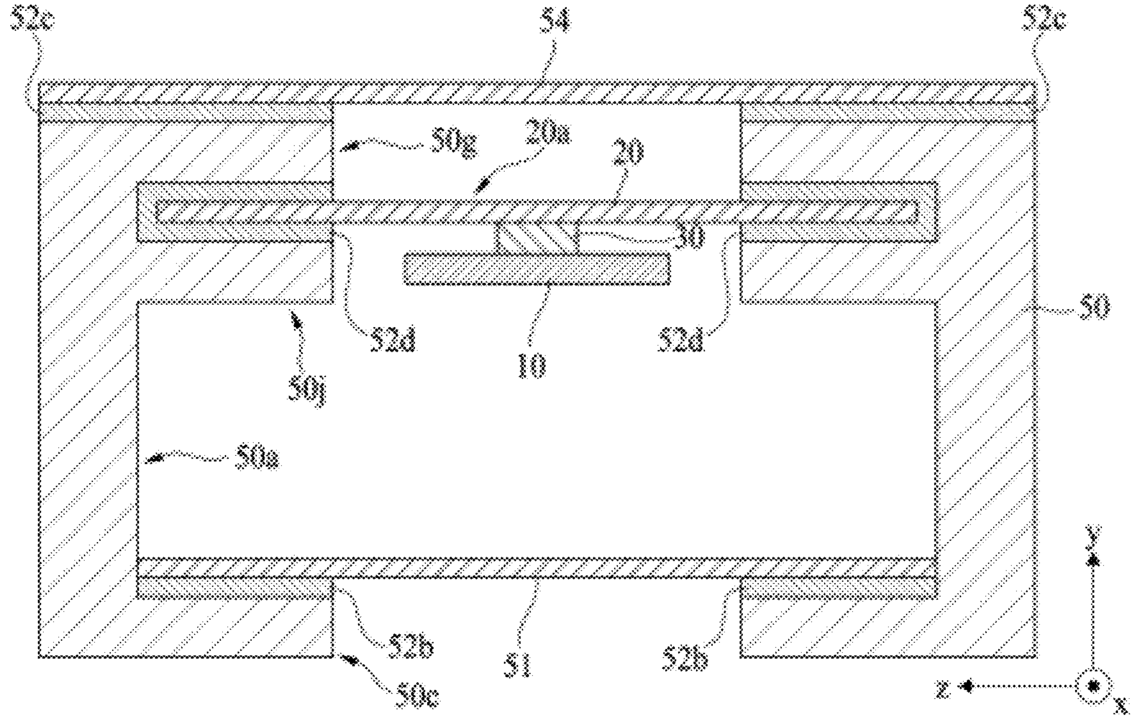
FIG. 40 is a cross-sectional view illustrating a first modification example of a sound apparatus according to a fifth aspect of the present disclosure.

FIG. 40 is a cross-sectional view illustrating a first modification example of the sound apparatus according to the fifth aspect of the present disclosure. Also, FIG. 40 is a cross-sectional view taken along line B-B' of FIG. 10A in the same direction as FIG. 10B.

As illustrated in FIG. 40, a frame 50 may include a protrusion portion 50*g* illustrated in FIGS. 12 and 13 instead of the protrusion portion 50*i* according to the fifth aspect of the present disclosure. The protrusion portion 50*g* may protrude so that a top surface or an upper surface of the frame 50 protrudes in a z direction perpendicular to a y direction in which a side portion 50*a* extends, in a cross-sectional view. As illustrated in FIGS. 15 and 16, an adhesive member 52*c* may attach a front cover 54 on the top surface of the frame 50. For example, the first vibration member 20 may be adhered to or attached on an upper end of the frame 50. For example, the frame 50 may include a cross-sectional surface having an E-shape. Also, in an aspect of the present disclosure, a sound apparatus 1 having the same effect as the fifth aspect of the present disclosure may be provided.

In another aspect of the present disclosure, as illustrated in FIG. 37A, the back cover 51 may be configured to cover a whole rear surface or a portion of a rear surface of the frame 50. The back cover 51 and the frame 50 may be the same as the nineteenth aspect of FIG. 34, and thus, their repetitive descriptions may be omitted. For example, a space may be provided between the front cover 54 and the first vibration member 20. A vibration panel of an advertising object or a vibration panel of a signage may be accommodated or inserted into the space. For example, the advertising object may be a picture frame, a poster, a standing signboard, and a content of a signage, but aspects of the present disclosure are not limited thereto.

According to an aspect of the present disclosure, the back cover 51 may be attached on the protrusion portion 50*c* at the rear surface of the frame 50, and thus, a process of attaching or connecting the back cover 51 on or to the frame 50 may be easily performed. In another aspect of the present disclosure, as illustrated in FIG. 37B, the frame 50 may be configured to accommodate the back cover 51 or to surround side surfaces of the back cover 51. According to an aspect of the present disclosure, the back cover 51 may be attached on the protrusion portion 50*c* at the rear surface of the frame 50, and thus, a process of attaching or connecting the back cover 51 on or to the frame 50 may be easily performed.

Second to Fourth Modification Examples of Fifth Aspect

In an aspect of the present disclosure, second to fourth modification examples of a configuration of the sound apparatus 1 according to the fifth aspect of the present disclosure illustrated in FIGS. 15 and 16 will be described. A structure and the like of a piezoelectric device 10 may be the same as the first aspect or one of the eighth to fourteenth aspects of the present disclosure, and thus, their repetitive descriptions may be omitted. Also, a structure and the like of an elastic member 30, a back cover 51, and a plurality of adhesive members 52*a* and 52*b* may be the same as the second to sixth aspects of the present disclosure, and thus, their repetitive descriptions may be omitted.

Figure 41A:
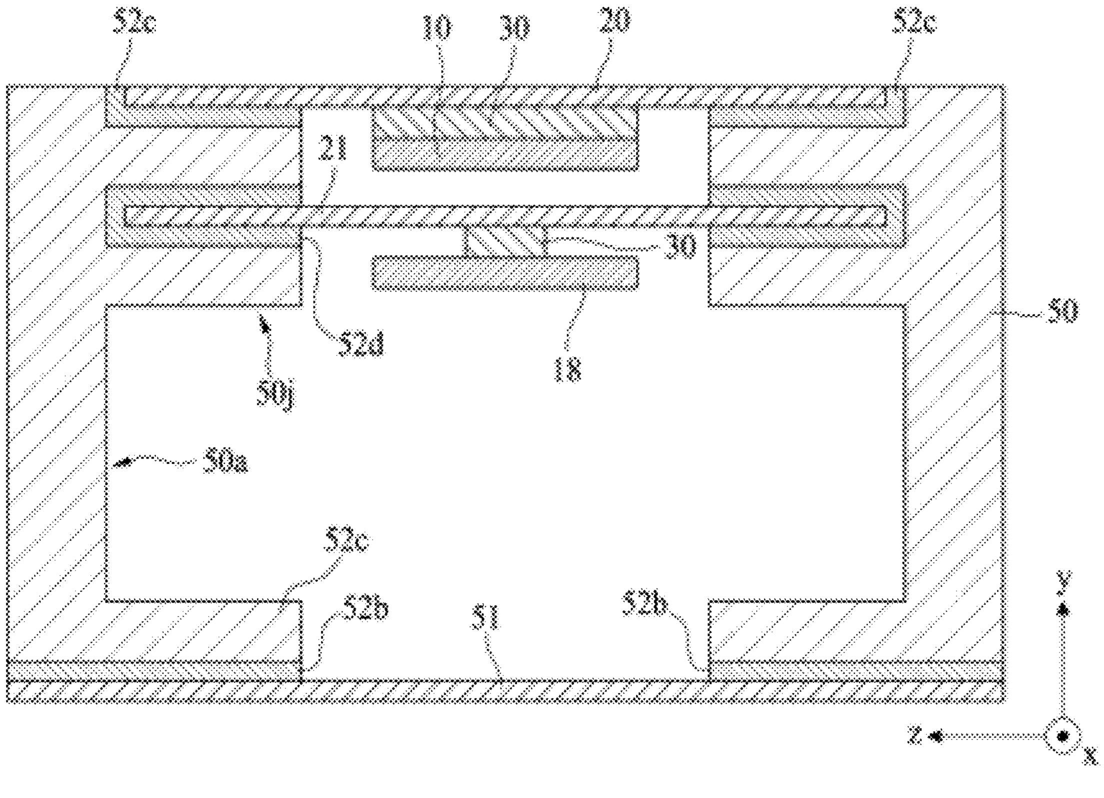
FIG. 41A is a cross-sectional view illustrating a second modification example of a sound apparatus according to a fifth aspect of the present disclosure.
Figure 41B:
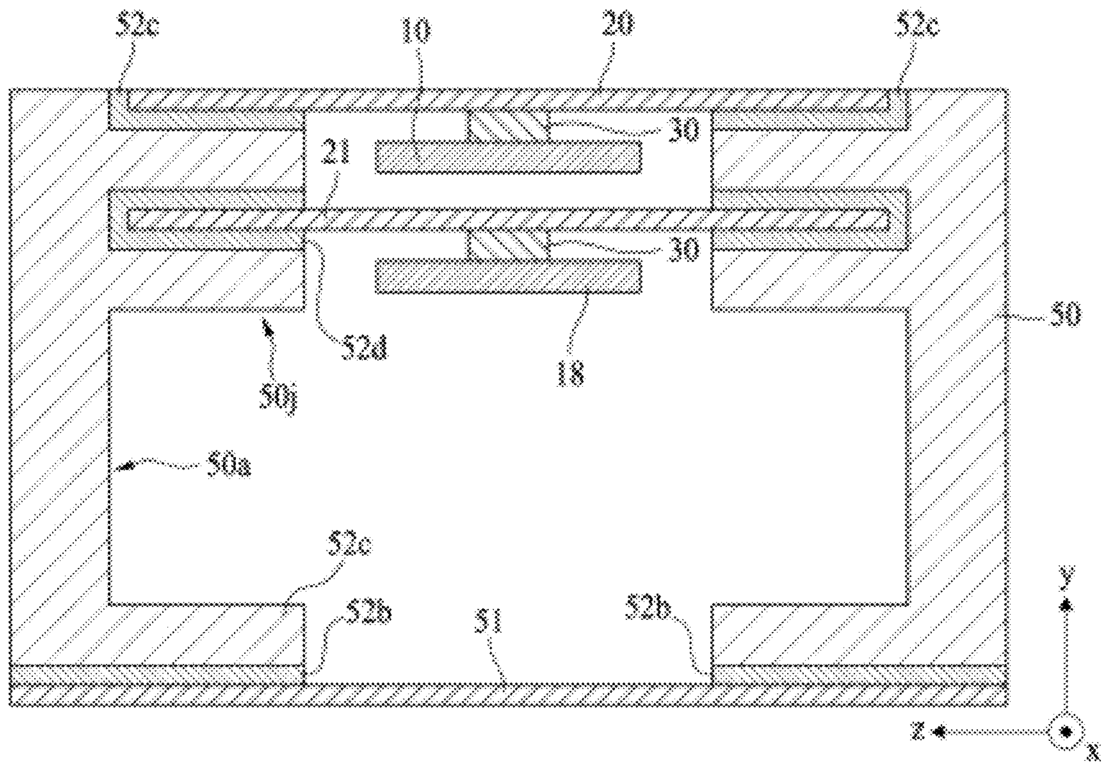
FIG. 41B is a cross-sectional view illustrating a third modification example of a sound apparatus according to a fifth aspect of the present disclosure.
Figure 41C:
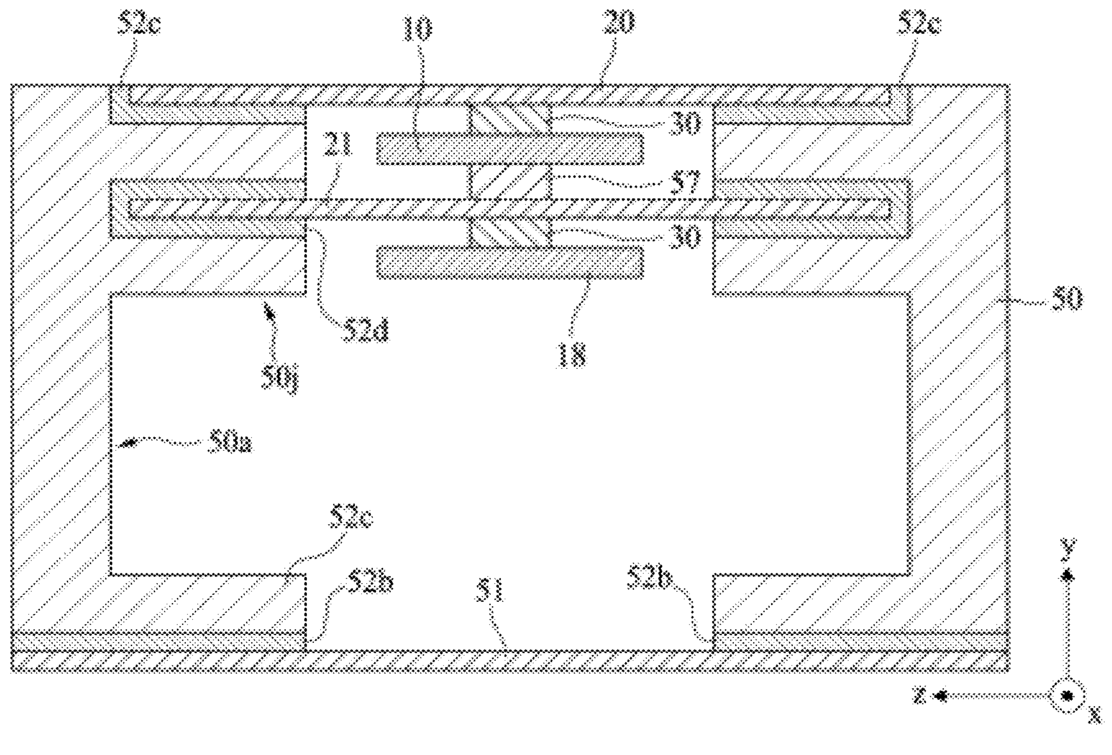
FIG. 41C is a cross-sectional view illustrating a fourth modification example of a sound apparatus according to a fifth aspect of the present disclosure.

FIG. 41A is a cross-sectional view illustrating a second modification example of the sound apparatus according to the fifth aspect of the present disclosure. FIG. 41B is a cross-sectional view illustrating a third modification example of the sound apparatus according to the fifth aspect of the present disclosure. FIG. 41C is a cross-sectional view illustrating a fourth modification example of the sound apparatus according to the fifth aspect of the present disclosure. Also, FIGS. 41A, 41B, and 41C are cross-sectional views taken along line B-B' of FIG. 10A in the same direction as FIG. 10B.

As illustrated in FIG. 41A, a sound apparatus 1 according to a second modification example of the fifth aspect of the present disclosure may include a piezoelectric device 10, a piezoelectric device 18, a first vibration member 20, a second vibration member 21, an elastic member 30, a frame 50, and a plurality of adhesive members 52*b*, 52*c*, and 52*d*. A structure of the frame 50 according to an aspect of the present disclosure may be the same as the fifth aspect of FIG. 15.

In FIG. 41A, the first vibration member 20 and the second vibration member 21 may be disposed instead of the front cover 54 and the first vibration member 20 in FIG. 15. The first vibration member 20 may be coupled or connected to the frame 50 by the adhesive member 52*c*. The second vibration member 21 may be coupled or connected to the frame 50 by the adhesive member 52*d*. The sound apparatus 1 may include a space, which is defined by the first and second vibration members 20 and 21 and the frame 50, and a space which is defined by the second vibration member 21 and the frame 50. Also, a method of fixing the first and second vibration members 20 and 21 to the frame 50 is not limited to an attachment process according to an aspect of the present disclosure, and various methods such as a compression process using the compression member 53 as in the fourth aspect of the present disclosure may be applied.

The piezoelectric device (or a first piezoelectric device) 10 may be coupled or connected to the first vibration member 20 by the elastic member 30. The piezoelectric device (or a second piezoelectric device) 18 may be coupled or connected to the second vibration member 21 by the elastic member 30. The second vibration member 21 may include a material which is the same as or different from the first vibration member 20. Also, the kinds of a plurality of piezoelectric devices disposed in each of two spaces may be individually selected, but it may not be essential that piezoelectric devices having different sound characteristics are respectively disposed in spaces and the same kinds of piezoelectric devices may be respectively disposed in spaces. For example, the first vibration member 20 and the piezoelectric device 10 may be configured to implement a sound of a high-pitched sound band. The second vibration member 21 and the piezoelectric device 18 may be configured to implement a sound of a low-pitched sound band. For example, the first vibration member 20 may include a material suitable for implementing a sound of the high-pitched sound band. For example, the second vibration member 21 may include a material suitable for implementing a sound of the low-pitched sound band.

The piezoelectric device 10 applicable to an aspect of the present disclosure may be the piezoelectric device 18 according to the eleventh aspect of FIG. 24, but aspects of the present disclosure are not limited thereto. For example, the piezoelectric device 18 applicable to an aspect of the present disclosure may be the piezoelectric device 10 according to the tenth aspect of FIGS. 21 to 23 or the twelfth aspect of FIG. 25, but aspects of the present disclosure are not limited thereto. Accordingly, in an aspect of the present disclosure, a sound apparatus 1 having the same effect as a configuration according to the nineteenth aspect of the present disclosure may be provided.

As illustrated in FIG. 41B, in the sound apparatus 1 according to a third modification example of the fifth aspect of the present disclosure, the piezoelectric device 10 applicable to an aspect of the present disclosure may be the piezoelectric device 10 according to the tenth aspect or the twelfth aspect of the present disclosure, but aspects of the present disclosure are not limited thereto. For example, the piezoelectric device 10 applicable to an aspect of the present disclosure may use the piezoelectric device 10 or the piezoelectric device 18 based on the structure or arrangement of the first aspect or one of the eighth to fourteenth aspects of the present disclosure, and a piezoelectric device based on a structure or arrangement differing from the structure or the arrangement described above in the first aspect or the eighth to fourteenth aspects of the present disclosure may be used. The piezoelectric device 18 applicable to an aspect of the present disclosure may be the same as or different from the piezoelectric device 10 applicable to an aspect of the present disclosure. Accordingly, in an aspect of the present disclosure, a sound apparatus 1 having the same effect as a configuration according to the nineteenth aspect of the present disclosure may be provided.

As illustrated in FIG. 41C, the sound apparatus 1 according to a fourth modification example of the fifth aspect of the present disclosure may further include a connection member 57. The connection member 57 may connect the second vibration member 21 to the piezoelectric device 10 connected to the first vibration member 20. Therefore, a vibration of the piezoelectric device 10 connected to the second vibration member 21 may be transferred to the piezoelectric device 10 connected to the first vibration member 20. A material of the connection member 57 is capable of transferring a vibration, but is not limited to a specific material. For example, the connection member 57 may be referred to as a pad, a pad member, an anti-resonance member, an anti-noise pad, an anti-noise member, a mass member, a mass, or a weight, but aspects of the present disclosure are not limited thereto. For example, the connection member 57 may include a metal material or a plastic material, but aspects of the present disclosure are not limited thereto.

The piezoelectric device 10 applicable to an aspect of the present disclosure may use the piezoelectric device 10 or the piezoelectric device 18 based on the structure or arrangement of the first aspect or one of the eighth to fourteenth aspects of the present disclosure, and may use a piezoelectric device based on a structure or arrangement differing from the structure or the arrangement described above in the first aspect or the eighth to fourteenth aspects of the present disclosure. The piezoelectric device 18 applicable to an aspect of the present disclosure may be the same as or different from the piezoelectric device 10 applicable to an aspect of the present disclosure.

Accordingly, according to an aspect of the present disclosure, a sound apparatus 1 having the same effect as the tenth aspect of the present disclosure may be provided, and noise caused by resonance occurring due to resonance caused by vibrations of the first vibration member 20 and the second vibration member 21 may be reduced, and thus, a sound apparatus with enhanced sound quality may be provided.

As illustrated in FIGS. 41A, 41B, and 41C, the back cover 51 may be configured to cover all of the rear surface of the frame 50. The back cover 51 may be the same as the nineteenth aspect of FIG. 34, and thus, their repetitive descriptions may be omitted. According to an aspect of the present disclosure, the back cover 51 may be attached on the protrusion portion 50*c* at the rear surface of the frame 50, and thus, a process of attaching or connecting the back cover 51 on or to the frame 50 may be easily performed. In another aspect of the present disclosure, as illustrated in FIG. 37B, the frame 50 may be configured to accommodate the back cover 51 or to surround side surfaces of the back cover 51. According to an aspect of the present disclosure, the back cover 51 may be attached on the protrusion portion 50*c* at the rear surface of the frame 50, and thus, a process of attaching or connecting the back cover 51 on or to the frame 50 may be easily performed.

Modification Example of Seventeenth Aspect

In an aspect of the present disclosure, a modification example of a configuration of the sound apparatus 1 according to the seventeenth aspect of the present disclosure illustrated in FIGS. 31 and 32 will be described. A structure and the like of the piezoelectric device 10 may be the same as the first aspect or one of the eighth to fourteenth aspects of the present disclosure, and thus, their repetitive descriptions may be omitted. A structure and the like of an elastic member 30, a back cover 51, and a plurality of adhesive members 52*a* and 52*b* may be the same as one of the second to sixth aspects of the present disclosure, and thus, their repetitive descriptions may be omitted.

Figure 42:
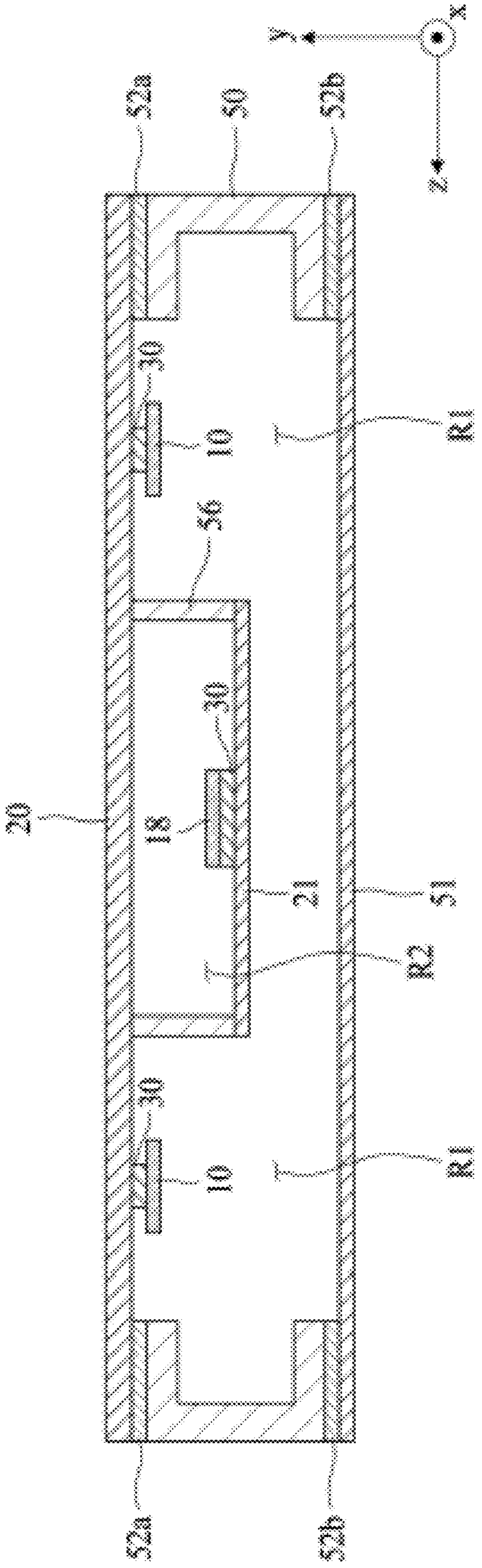
FIG. 42 is a cross-sectional view illustrating a modification example of a configuration of a sound apparatus according to a seventeenth aspect of the present disclosure.

FIG. 42 is a cross-sectional view illustrating a configuration of a sound apparatus according to a seventeenth aspect of the present disclosure. FIG. 42 is a cross-sectional view taken along line F-F' of FIG. 31 in the same direction as FIG. 32.

As illustrated in FIG. 42, the sound apparatus 1 may include a piezoelectric device 10, a piezoelectric device 18, a first vibration member 20, a second vibration member 21, an elastic member 30, a frame 50, a back cover 51, a plurality of adhesive members 52*a* and 52*b*, and an inner frame 56. The sound apparatus 1 may include a plurality of vibration members. The first vibration member 20 may be a member which vibrates to generate a sound based on a sound signal input to one or more piezoelectric devices 10 disposed in the region R1. Also, the second vibration member 21 may be a member which vibrates to generate a sound based on a sound signal input to one or more piezoelectric devices 10 disposed in the region R2. A material of the second vibration member 21, like the first vibration member 20, is not limited to a specific material and may include glass, hard paper, metal, or plastic having a material characteristic suitable for transferring a vibration transferred from the piezoelectric device 10.

As illustrated in FIG. 42, the second vibration member 21 may be disposed between the first vibration member 20 and the back cover 51 in a cross-sectional view. The inner frame 56 may be disposed between the first vibration member 20 and the second vibration member 21. Also, the inner frame 56 may be coupled or connected to both sides of the first vibration member 20 and the second vibration member 21 in a cross-sectional view. The sound apparatus 1 may include a space which is defined by the inner frame 56, the back cover 51, and the second vibration member 21. For example, the inner frame 56 and the second vibration member 21 may divide a space, defined by the back cover 51 and the first vibration member 20, into a region R1 and a region R2. The inner frame 56 and the piezoelectric device 18 may be configured as one body or a single body. Also, a method of fixing the first vibration member 20 to the frame 50 and a method of fixing the second vibration member 21 to the inner frame 56 are not limited to an attachment process according to an aspect of the present disclosure, and various methods such as a compression process using the compression member 53 as in the fourth aspect of the present disclosure may be applied.

According to an aspect of the present disclosure, a material of the first vibration member 20 and the second vibration member 21 may be individually selected based on a frequency of a sound generated thereby and a characteristic of a piezoelectric device connected thereto, and thus, sound quality may be more enhanced than that from a configuration according to the seventeenth aspect of the present disclosure illustrated in FIG. 32. Also, when a resonance space is not needed, it may not be essential that the inner frame 56 is disposed, and in this case, the second vibration member 21 may be connected to the frame 50.

Modification Example of Eighteenth Aspect

In an aspect of the present disclosure, a modification example of a configuration of the sound apparatus 1 according to the eighteenth aspect of the present disclosure illustrated in FIGS. 31 and 33 will be described. A structure and the like of the piezoelectric device 10 may be the same as the first aspect or one of the eighth to fourteenth aspects of the present disclosure, and thus, their repetitive descriptions may be omitted. Also, a structure and the like of an elastic member 30, a back cover 51, and a plurality of adhesive members 52*a* and 52*b* may be the same as one of the second to sixth aspects of the present disclosure, and thus, their repetitive descriptions may be omitted.

Figure 43:
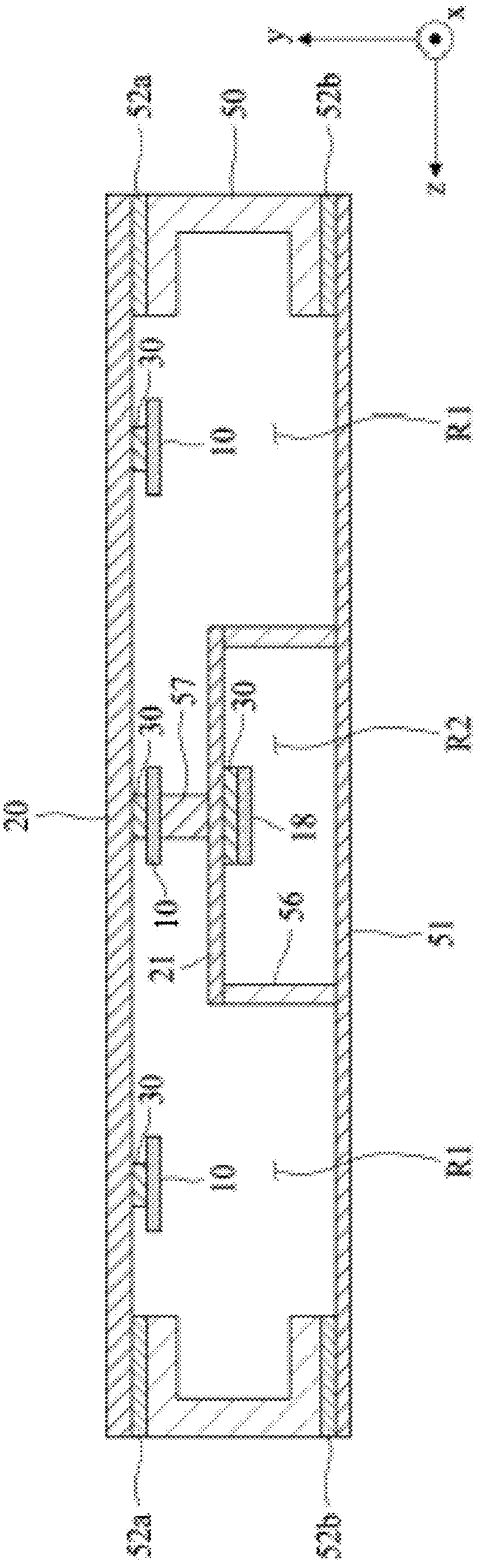
FIG. 43 is a cross-sectional view illustrating a modification example of a configuration of a sound apparatus according to an eighteenth aspect of the present disclosure.

FIG. 43 is a cross-sectional view illustrating a configuration of the sound apparatus according to a modification example of the eighteenth aspect of the present disclosure.

FIG. 43 is a cross-sectional view taken along line F-F' of FIG. 31 in the same direction as FIG. 32.

As illustrated in FIG. 43, the sound apparatus 1 may include a piezoelectric device 10, a first vibration member 20, a second vibration member 21, an elastic member 30, a frame 50, a back cover 51, a plurality of adhesive members 52*a* and 52*b*, and a connection member 57. The connection member 57 may connect the second vibration member 21 to the piezoelectric device 10 connected to the first vibration member 20. Therefore, a vibration of the piezoelectric device 10 connected to the second vibration member 21 may be transferred to the piezoelectric device 10 connected to the first vibration member 20. A material of the connection member 57 is capable of transferring a vibration, but is not limited to a specific material. For example, the connection member 57 may be referred to as a pad, a pad member, an anti-resonance member, an anti-noise pad, an anti-noise member, a mass member, a mass, or a weight, but aspects of the present disclosure are not limited thereto. For example, the connection member 57 may include a metal material or a plastic material, but aspects of the present disclosure are not limited thereto.

There may be a case where all of the first vibration member 20 and the second vibration member 21 resonate. Such resonance may cause noise. On the other hand, in an aspect of the present disclosure, a vibration of a piezoelectric device 18 connected to the second vibration member 21 may be transferred to a piezoelectric device 10, connected to the first vibration member 20, by the connection member 57, and thus, resonance may be difficult to occur, whereby noise may be reduced.

Accordingly, according to an aspect of the present disclosure, a sound apparatus 1 having the same effect as the eighteenth aspect of the present disclosure may be provided, and noise caused by resonance occurring due to vibrations of the first vibration member 20 and the second vibration member 21 may be reduced, thereby providing a sound apparatus with enhanced sound quality.

According to another aspect of the present disclosure, a connection structure (or a coupling structure) between the first vibration member 20 and the frame 50 illustrated in each of FIGS. 42 and 43 may be changed to a connection structure (or a coupling structure) between the first vibration member 20 and the frame 50 illustrated in FIG. 10B, but aspects of the present disclosure is not limited thereto. Also, a connection structure (or a coupling structure) between the frame 50 and the back cover 51 illustrated in each of FIGS. 42 and 43 may be changed to a connection structure (or a coupling structure) between the frame 50 and the back cover 51 illustrated in FIG. 10B, but aspects of the present disclosure is not limited thereto.

[Application Example of Sound Apparatus]

In the present aspect, examples of various application devices to which a sound apparatus according to an aspect of the present disclosure is applied will be described.

Figure 44:
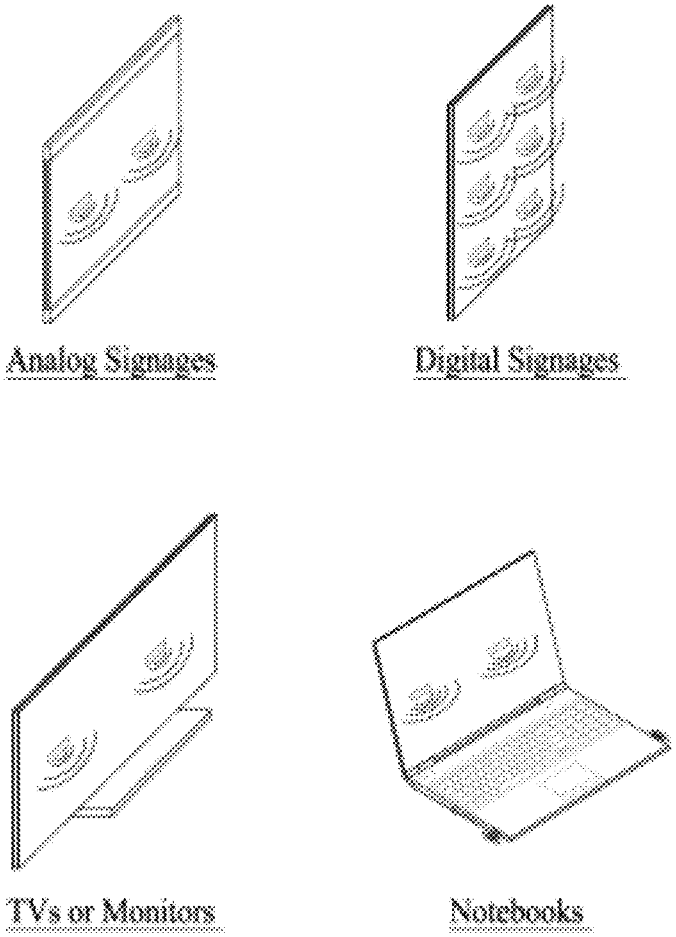
FIG. 44 illustrates aspects of an apparatus to which a sound apparatus according to an aspect of the present disclosure is applied.

FIG. 44 illustrates examples of various application devices to which a sound apparatus according to an aspect of the present disclosure is applied.

As illustrated in FIG. 44, a sound apparatus according to an aspect of the present disclosure may be applied to various application devices. For example, the sound apparatus may be applied to various application devices such as an analog signage, a digital signage, a monitor (or a television (TV), and a notebook computer.

In addition to the various application devices illustrated in FIG. 44, the sound apparatus according to the aspects of the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic books, portable multimedia players (PMPs), personal digital assistants (PDAs), MP3 players, mobile medical apparatuses, desktop personal computers (PCs), laptop PCs, netbook computers, workstations, navigation apparatuses, automotive navigation apparatuses, automotive display apparatuses, automotive apparatuses, theater apparatuses, theater display apparatuses, wall paper display apparatuses, game machines, cameras, camcorders, home appliances, etc. Also, the sound apparatus according to the present disclosure may be applied to organic light emitting lighting apparatuses or inorganic light emitting lighting apparatuses. When the sound apparatus of the present disclosure is applied to lighting apparatuses, the sound apparatus may act as lighting and a speaker. Also, when the sound apparatus of the present disclosure is applied to a mobile device, the sound apparatus may act as one or more of a speaker, a receiver, and a haptic, but aspects of the present disclosure are not limited thereto.

Figure 45:
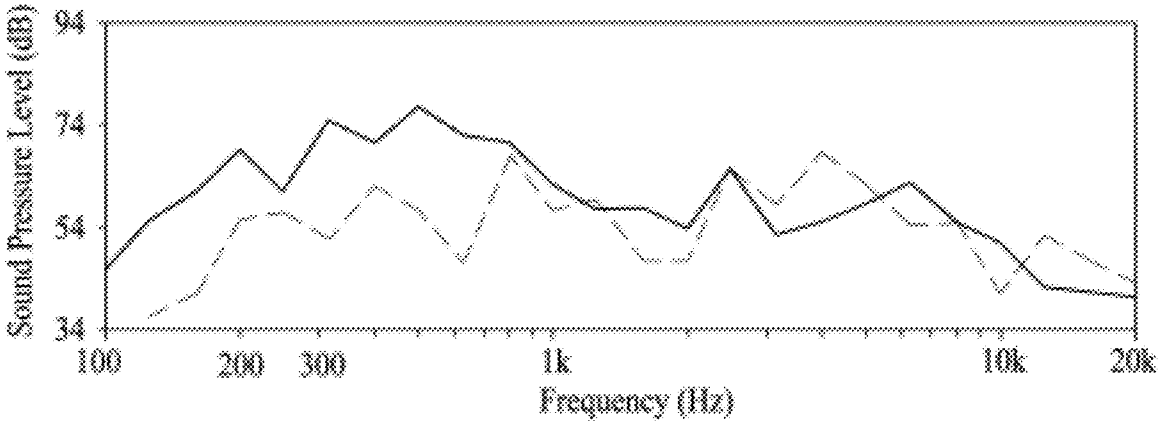
FIG. 45 is a graph showing a sound output characteristic of the sound apparatus illustrated in FIG. 28C and a sound output characteristic of the sound apparatus illustrated in FIG. 28D.

FIG. 45 is a graph showing a sound output characteristic of the sound apparatus illustrated in FIG. 28C and a sound output characteristic of the sound apparatus illustrated in FIG. 28D. In FIG. 45, a thick solid line represents a sound pressure level with respect to a frequency of the sound apparatus illustrated in FIG. 28C, and a dotted line represents a sound pressure level with respect to a frequency of the sound apparatus illustrated in FIG. 28D. In FIG. 45, the abscissa axis represents a frequency (Hz), and the ordinate axis represents a sound pressure level SPL (dB).

With reference to FIG. 45, a sound apparatus according to an aspect of the present disclosure may output a sound having a frequency band of 100 Hz to 20 kHz according to a vibration of a vibration member based on a vibration of a piezoelectric device. For example, comparing with a sound apparatus including two piezoelectric devices, a sound apparatus including four piezoelectric devices may implement a sound having a sound pressure level which is relatively high in a middle-low-pitched sound band. For example, a sound apparatus including four piezoelectric devices may implement a sound having a sound pressure level of 50 dB or more in a frequency band of about 150 Hz to about 1 kHz. For example, the middle-low-pitched sound band may be 3 kHz or less, but aspects of the present disclosure are not limited thereto and may be 5 kHz or less.

Figure 46:
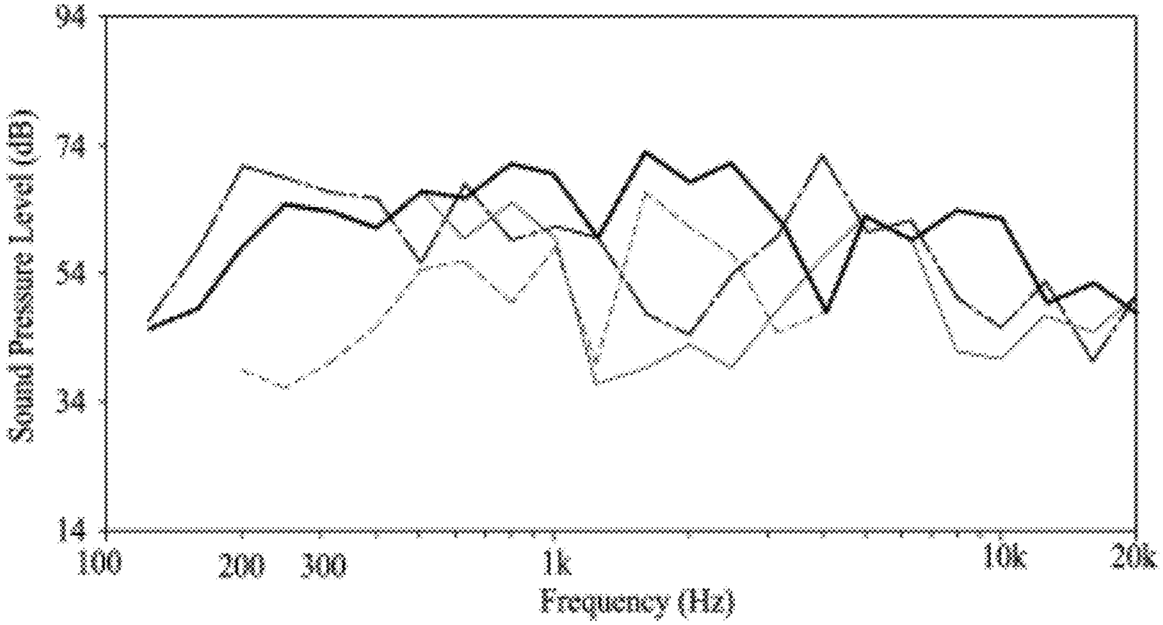
FIG. 46 is a graph showing a sound output characteristic based on a structure of a piezoelectric device in the sound apparatus illustrated in FIG. 28D.

FIG. 46 is a graph showing a sound output characteristic based on a structure of a piezoelectric device in the sound apparatus illustrated in FIG. 28D. In FIG. 46, a dotted line represents a first experiment example where the vibration member illustrated in FIG. 28D includes a plastic material and a piezoelectric device is configured as the piezoelectric device according to the eleventh aspect of FIG. 24. A thin solid line represents a second experiment example where the vibration member illustrated in FIG. 28D includes a plastic material and a piezoelectric device is configured as the piezoelectric device according to the tenth aspect of FIGS. 21 and 22, a one-dot-dashed line represents a third experiment example where the vibration member illustrated in FIG. 28D includes a glass material and a piezoelectric device is configured as the piezoelectric device according to the tenth aspect of FIGS. 21 and 22. A thick solid line represents a fourth experiment example where the vibration member illustrated in FIG. 28D includes a glass material, a piezoelectric device disposed at a center portion of the vibration member is configured as the piezoelectric device according to the eleventh aspect of FIG. 24, and a piezoelectric device disposed at a periphery portion of the vibration member is configured as the piezoelectric device according to the tenth aspect of FIGS. 21 and 22. In FIG. 46, the abscissa axis represents a frequency (Hz), and the ordinate axis represents a sound pressure level SPL (dB).

With reference to FIG. 46, a sound apparatus according to an aspect of the present disclosure may output a sound having a sound pressure level of 34 dB or more in a frequency band of about 100 Hz to about 20 kHz according to a vibration of a vibration member based on a vibration of a piezoelectric device. Also, comparing with a sound apparatus of the first experiment example where a whole portion of a piezoelectric device is connected to a vibration member by an elastic member, each of the sound apparatuses of the second to fourth experiment examples, where a portion (or a center portion) of a piezoelectric device is connected to a vibration member by an elastic member, may implement a sound pressure level which is relatively high in a frequency band of 1 kHz or less. Also, in the sound apparatus of the fourth experiment example, it may be seen that flatness is reduced in a pitched sound band of 2 kHz or less compared to the sound apparatuses of the other experiment examples.

Therefore, according to the present disclosure, an attachment structure between a vibration member and each of a plurality of piezoelectric devices may have an attachment structure according to the second aspect of FIG. 10B or an attachment structure according to the eleventh aspect of FIG. 24, based on a sound characteristic which is to be implemented by a sound apparatus. For example, a portion (or a center) of one or more among a plurality of piezoelectric devices may be attached on or connected to a vibration member as in the attachment structure according to the second aspect of FIG. 10B, and a whole portion of other piezoelectric devices among a plurality of piezoelectric devices may be attached on or connected to a vibration member as in the attachment structure according to the eleventh aspect of FIG. 24.

Other Examples

The above-described aspects are merely illustrative of several aspects to which the present disclosure may be applied, and the technical scope of the present disclosures should not be construed as being limited according to the above-described aspects. In addition, the present disclosure may be implemented in various aspects through appropriate modifications and variations without departing from the technical idea or scope of the disclosures. For example, it should be understood that an aspect in which some elements of one aspect are added to another aspect or an aspect in which some elements and substitutions of another aspect may be applied are also an aspect to which the present disclosure may be applied. Thus, it is intended that the present disclosure covers the modifications and variations of this disclosure provided they come within the scope of the appended claims and their equivalents.

A sound apparatus according to an aspect of the present disclosure will be described below.

According to some aspects of the present disclosure, a sound apparatus may include a piezoelectric device configured to vibrate based on a sound signal input thereto, a vibration member, and an elastic member configured to connect at least a portion of the piezoelectric device to the vibration member.

According to some aspects of the present disclosure, the piezoelectric device may include a flat plate shape, and the elastic member may be connected to a front surface of the piezoelectric device.

According to some aspects of the present disclosure, the piezoelectric device may include a rectangular shape having a long-side direction and a short-side direction in a plan view, and the elastic member may be connected to a position including a center of the piezoelectric device in the long-side direction.

According to some aspects of the present disclosure, an end portion of the piezoelectric device in the long-side direction may be not connected to the elastic member.

According to some aspects of the present disclosure, the long-side direction of the piezoelectric device may be perpendicular to at least a portion of a lateral side of the vibration member.

According to some aspects of the present disclosure, the long-side direction of the piezoelectric device may be not perpendicular to at least a portion of a lateral side of the vibration member.

According to some aspects of the present disclosure, the piezoelectric device may include a circular shape in a plan view, and the elastic member may be connected to a position including a center of the circular shape of the piezoelectric device.

According to some aspects of the present disclosure, the piezoelectric device may vibrate in a thickness direction thereof.

According to some aspects of the present disclosure, the piezoelectric device may vibrate in a direction expanding in a horizontal direction.

According to some aspects of the present disclosure, the piezoelectric device may include a piezoelectric layer, a first electrode, and a second electrode, and the first electrode and the second electrode may be disposed with the piezoelectric layer therebetween in a thickness direction thereof.

According to some aspects of the present disclosure, the piezoelectric device may include a first piezoelectric layer, a second piezoelectric layer, a first electrode, a second electrode, and a third electrode. The first electrode and the second electrode may disposed with the first piezoelectric layer therebetween in a thickness direction thereof. And, the second electrode and the third electrode may be disposed with the second piezoelectric layer therebetween in a thickness direction thereof.

According to some aspects of the present disclosure, a polarization direction of the first piezoelectric layer may be the same as a polarization direction of the second piezoelectric layer.

According to some aspects of the present disclosure, the sound signal having a same phase may be applied to the first electrode and the second electrode.

According to some aspects of the present disclosure, the piezoelectric device may include a first piezoelectric layer, a second piezoelectric layer, a first electrode, a second electrode, a third electrode, and a fourth electrode. The first electrode and the second electrode may be disposed with the first piezoelectric layer therebetween in a thickness direction thereof. And, the third electrode and the fourth electrode may be disposed with the second piezoelectric layer therebetween in a thickness direction thereof.

According to some aspects of the present disclosure, polarization directions of the first piezoelectric layer and the second piezoelectric layer may be opposite to each other.

According to some aspects of the present disclosure, the sound signal having a same phase may be applied to the first electrode and the third electrode.

According to some aspects of the present disclosure, the sound signal having a same phase may be applied to the second electrode and the fourth electrode.

According to some aspects of the present disclosure, a sound apparatus may include a piezoelectric device configured to vibrate based on a sound signal input thereto and including a first vibration portion and a second vibration portion extending in different directions in a plan view, a vibration member, and an elastic member configured to connect at least a portion of the piezoelectric device to the vibration member. The first vibration portion may be stacked on the second vibration portion.

According to some aspects of the present disclosure, the first vibration portion may include a first front surface and a second front surface opposite to the first front surface, at least a portion of the first front surface may be connected to the elastic member, and at least a portion of the second front surface may be connected to a portion of the second vibration portion.

According to some aspects of the present disclosure, each of the first vibration portion and the second vibration portion comprises a rectangular shape having a long-side direction and a short-side direction in a plan view, and the long-side direction of the first vibration portion differs from the long-side direction of the second vibration portion.

According to some aspects of the present disclosure, the long-side direction of the first vibration portion may be perpendicular to the long-side direction of the second vibration portion.

According to some aspects of the present disclosure, the elastic member may be connected to a position including a center of the first vibration portion in the long-side direction thereof.

According to some aspects of the present disclosure, a position including a center of the first vibration portion in the long-side direction thereof may be connected to a position including a center of the second vibration portion in the long-side direction thereof.

According to some aspects of the present disclosure, an end portion of each of the first vibration portion and the second vibration portion in the long-side direction thereof may be not connected to the elastic member.

According to some aspects of the present disclosure, the long-side direction of each of the first vibration portion and the second vibration portion may be perpendicular to a lateral side of the vibration member.

According to some aspects of the present disclosure, the long-side direction of each of the first vibration portion and the second vibration portion may be not perpendicular to at least one or more of a lateral side of the vibration member.

According to some aspects of the present disclosure, the first vibration portion and the second vibration portion may vibrate in the same direction in response to the sound signal.

According to some aspects of the present disclosure, each of the first vibration portion and the second vibration portion may vibrate in a thickness direction thereof.

According to some aspects of the present disclosure, the sound apparatus may further include a frame connected to at least a portion of the vibration member. The frame may configure at least a portion of a housing which includes the piezoelectric device provided therein.

According to some aspects of the present disclosure, the frame may be connected to at least a periphery portion of the vibration member.

According to some aspects of the present disclosure, the sound apparatus may further include a fixing member fixing the vibration member to the frame.

According to some aspects of the present disclosure, the sound apparatus may further include a vibration absorption member connected to the frame and the vibration member.

According to some aspects of the present disclosure, the piezoelectric device may be provided in plurality, and a frequency characteristic of a first piezoelectric device and a second piezoelectric device among the plurality of piezoelectric devices may be different from each other.

According to some aspects of the present disclosure, a natural frequency of the first piezoelectric device may differ from a natural frequency of the second piezoelectric device.

According to some aspects of the present disclosure, a shape of the first piezoelectric device may differ from a shape of the second piezoelectric device.

According to some aspects of the present disclosure, one or more of a sound speed, an elastic modulus, and a density of a material of the first piezoelectric device may differ from one or more of a sound speed, an elastic modulus, and a density of a material of the second piezoelectric device.

According to some aspects of the present disclosure, the housing may include a plurality of spaces.

According to some aspects of the present disclosure, the piezoelectric device may be provided in plurality, and a first piezoelectric device and a second piezoelectric device of the plurality of piezoelectric devices may be disposed in different spaces of the plurality of spaces.

According to some aspects of the present disclosure, the vibration member may be provided in plurality, and one or more of the plurality of vibration members may have different material characteristics.

According to some aspects of the present disclosure, the piezoelectric device may be provided in plurality, and a first piezoelectric device and a second piezoelectric device of the plurality of piezoelectric devices may be connected to different vibration members of the plurality of vibration members.

According to some aspects of the present disclosure, the sound apparatus may further include a connection member disposed to connect the plurality of vibration members through at least one of the first piezoelectric device and the second piezoelectric device.

According to some aspects of the present disclosure, a signage content may be disposed on a surface, which is opposite to a side surface connected to the piezoelectric device, of the vibration member.

According to some aspects of the present disclosure, the sound apparatus may further include a protection member connected to the frame, a signage content may be disposed between the protection member and a surface, which is opposite to a side surface connected to the piezoelectric device, of the vibration member.

According to some aspects of the present disclosure, the signage content may be attached on a medium attached on the vibration member.

According to some aspects of the present disclosure, the signage content may be directly attached at the vibration member.

According to some aspects of the present disclosure, the vibration member may be a display panel of a display apparatus, and the signage content may be displayed as an image on the display panel.

According to some aspects of the present disclosure, a sound apparatus include a plurality of piezoelectric devices vibrating in response to a sound signal input thereto, and a vibration member, each of the plurality of piezoelectric devices may be connected to the vibration member, and a frequency characteristic of a first piezoelectric device and a second piezoelectric device among the plurality of piezoelectric devices may be different from each other.

According to some aspects of the present disclosure, a natural frequency of the first piezoelectric device and a natural frequency of the second piezoelectric device may be different from each other.

According to some aspects of the present disclosure, a shape of the first piezoelectric device and a shape of the second piezoelectric device may be different from each other.

According to some aspects of the present disclosure, the vibration member may include a first region and a second region and the first piezoelectric device may be provided in the first region of the vibration member and the second piezoelectric device may be provided in the second region of the vibration member.

According to some aspects of the present disclosure, one or more of a sound speed, an elastic modulus, and a density of a material of the first piezoelectric device may differ from one or more of a sound speed, an elastic modulus, and a density of a material of the second piezoelectric device.

According to some aspects of the present disclosure, the vibration member may be a display panel of a display apparatus, the display panel may include an image display surface displaying an image and a rear surface opposite to the image display surface, and a vibration of the piezoelectric device may be transferred to the rear surface of the display panel.

According to some aspects of the present disclosure, the display panel may include an organic light emitting diode.

What is claimed is:

1. A sound apparatus, comprising:

a plurality of piezoelectric devices configured to vibrate in response to a sound signal input thereto;

a plurality of vibration members; and a frame connected to at least a portion of each of the plurality of vibration members, wherein each of the plurality of piezoelectric devices is connected to a corresponding vibration member among the plurality of vibration members, wherein frequency characteristics of a first piezoelectric device and a second piezoelectric device among the plurality of piezoelectric devices are different from each other, wherein at least one of the plurality of piezoelectric devices includes a first piezoelectric layer, a second piezoelectric layer, a first electrode, a second electrode, a third electrode and a fourth electrode, wherein the first electrode and the second electrode are disposed with the first piezoelectric layer therebetween in a thickness direction thereof, wherein the third electrode and the fourth electrode are disposed with the second piezoelectric layer therebetween in a thickness direction thereof, wherein the sound signal having a same phase is applied to the first electrode and the third electrode, wherein the frame configures at least a portion of a housing which includes the plurality of the piezoelectric devices provided therein, wherein one or more of the plurality of vibration members have different material characteristics, and wherein the first piezoelectric device and the second piezoelectric device are connected to different vibration members of the plurality of vibration members.

2. The sound apparatus of claim 1, wherein a natural frequency of the first piezoelectric device and a natural frequency of the second piezoelectric device are different from each other.

3. The sound apparatus of claim 1, wherein a shape of the first piezoelectric device and a shape of the second piezoelectric device are different from each other.

4. The sound apparatus of claim 1, wherein one or more of a sound speed, an elastic modulus and a density of a material of the first piezoelectric device differ from one or more of a sound speed, an elastic modulus, and a density of a material of the second piezoelectric device.

5. The sound apparatus of claim 1, wherein at least one of the plurality of vibration members includes a display panel of a display apparatus, wherein the display panel comprises an image display surface displaying an image and a rear surface opposite to the image display surface, and a vibration of a piezoelectric device connected to the display panel among the plurality of piezoelectric devices is transferred to the rear surface of the display panel.

6. The sound apparatus of claim 5, wherein the display panel includes an organic light emitting diode.

7. The sound apparatus of claim 1, further comprising an elastic member configured to connect at least a portion of the each of the plurality of the piezoelectric devices to the corresponding vibration member.

8. The sound apparatus of claim 7, wherein the each of the plurality of the piezoelectric devices has a flat plate shape, and wherein the elastic member is connected to a front surface of the each of the plurality of the piezoelectric devices.

9. The sound apparatus of claim 8, wherein the each of the plurality of the piezoelectric devices has a rectangular shape having a long-side direction and a short-side direction in a plan view, and wherein the elastic member is connected to a position including a center of the each of the plurality of the piezoelectric devices of the long-side direction.

10. The sound apparatus of claim 9, wherein an end portion of the long-side direction is not connected to the elastic member.

11. The sound apparatus of claim 9, wherein the long-side direction is perpendicular to at least a portion of a lateral side of the corresponding vibration member.

12. The sound apparatus of claim 9, wherein the long-side direction is not perpendicular to at least a portion of a lateral side of the corresponding vibration member.

13. The sound apparatus of claim 7, wherein the each of the plurality of the piezoelectric devices has a circular shape in a plan view, and wherein the elastic member is connected to a position including a center of the circular shape of the each of the plurality of the piezoelectric devices.

14. The sound apparatus of claim 1, wherein the each of the plurality of the piezoelectric devices is configured to vibrate in a thickness direction thereof.

15. The sound apparatus of claim 1, wherein the each of the plurality of the piezoelectric devices is configured to vibrate in a direction expanding in a horizontal direction.

16. The sound apparatus of claim 1, wherein at least one other of the plurality of the piezoelectric devices includes a piezoelectric layer, a first electrode and a second electrode, and wherein the first electrode and the second electrode are disposed with the piezoelectric layer therebetween in a thickness direction thereof.

17. The sound apparatus of claim 1, wherein at least one other of the plurality of the piezoelectric devices includes a first piezoelectric layer, a second piezoelectric layer, a first electrode, a second electrode and a third electrode, wherein the first electrode and the second electrode are disposed with the first piezoelectric layer therebetween in a thickness direction thereof, and wherein the second electrode and the third electrode are disposed with the second piezoelectric layer therebetween in a thickness direction thereof.

18. The sound apparatus of claim 17, wherein a polarization direction of the first piezoelectric layer is the same as a polarization direction of the second piezoelectric layer.

19. The sound apparatus of claim 18, wherein the sound signal having a same phase is applied to the first electrode and the second electrode.

20. The sound apparatus of claim 1, wherein polarization directions of the first piezoelectric layer and the second piezoelectric layer are opposite to each other.

21. The sound apparatus of claim 20, wherein the sound signal having a same phase is applied to the second electrode and the fourth electrode.

22. The sound apparatus of claim 1, wherein the frame is connected to at least a periphery portion of the plurality of the vibration members.

23. The sound apparatus of claim 1, further comprising a fixing member configured to fix the plurality of vibration members to the frame.

24. The sound apparatus of claim 1, further comprising a vibration absorption member connected to the frame and the plurality of vibration members.

25. The sound apparatus of claim 1, wherein the housing includes a plurality of spaces.

26. The sound apparatus of claim 25, wherein the first piezoelectric device and the second piezoelectric device are disposed in different spaces of the plurality of spaces.

27. The sound apparatus of claim 1, further comprising a connection member disposed to connect the plurality of vibration members through at least one of the first piezoelectric device and the second piezoelectric device.

* * * * *